(12) United States Patent
Mizukami et al.

(10) Patent No.: US 7,368,783 B2
(45) Date of Patent: May 6, 2008

(54) SEMICONDUCTOR DEVICE

(75) Inventors: Makoto Mizukami, Komae (JP); Takashi Shinohe, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 309 days.

(21) Appl. No.: 11/230,492

(22) Filed: Sep. 21, 2005

(65) Prior Publication Data

US 2006/0011973 A1 Jan. 19, 2006

Related U.S. Application Data

(63) Continuation of application No. 11/038,043, filed on Jan. 21, 2005, now Pat. No. 6,969,887.

(30) Foreign Application Priority Data

Jan. 23, 2004 (JP) ............................. 2004-015944
Jan. 5, 2005 (JP) ............................. 2005-000796

(51) Int. Cl.
*H01L 29/94* (2006.01)

(52) U.S. Cl. ...................... 257/330; 257/331; 257/334; 257/E29.257; 257/E29.26

(58) Field of Classification Search ........ 257/327–331, 257/334, E29.257, E29.26, E29.262
See application file for complete search history.

(56) References Cited

U.S. PATENT DOCUMENTS 6,309,929 B1  10/2001  Hsu et al.

6,316,807 B1 *  11/2001  Fujishima et al. .......... 257/333
7,132,712 B2 *  11/2006  Kocon et al. ............... 257/328
2001/0008291 A1  7/2001  Aoki et al.

FOREIGN PATENT DOCUMENTS

| JP | 2002-83963 | 3/2002 |
| JP | 2003-69042 | 3/2003 |
| JP | 2003-224277 | 8/2003 |

* cited by examiner

*Primary Examiner*—Matthew E. Warren
(74) *Attorney, Agent, or Firm*—Oblon, Spivak, McClelland, Maier & Neustadt, P.C.

(57) ABSTRACT

A semiconductor device includes a semiconductor substrate of a first conductivity type, a lightly-doped semiconductor layer of the first conductivity type formed on the first major surface of the substrate, a first semiconductor region of the first conductivity type formed on an island-shaped region on the lightly-doped semiconductor layer, a first electrode surrounding the first semiconductor region and buried at a deeper position than the first semiconductor region, a second semiconductor region formed on the second major surface of the substrate, a buried field relaxation layer formed in the lightly-doped semiconductor layer between a bottom surface of the first electrode and the second semiconductor region, including a first field relaxation layer of the first conductivity type and second field relaxation layers of the second conductivity type formed at two ends of the first field relaxation layer, second and third electrodes formed on the first and second semiconductor regions, respectively.

20 Claims, 38 Drawing Sheets

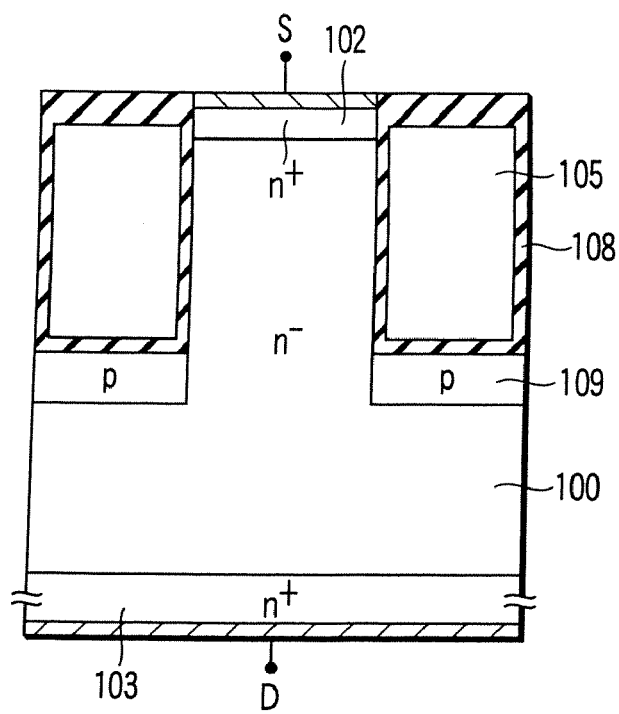
-- BACKGROUND ART --　　FIG. 3
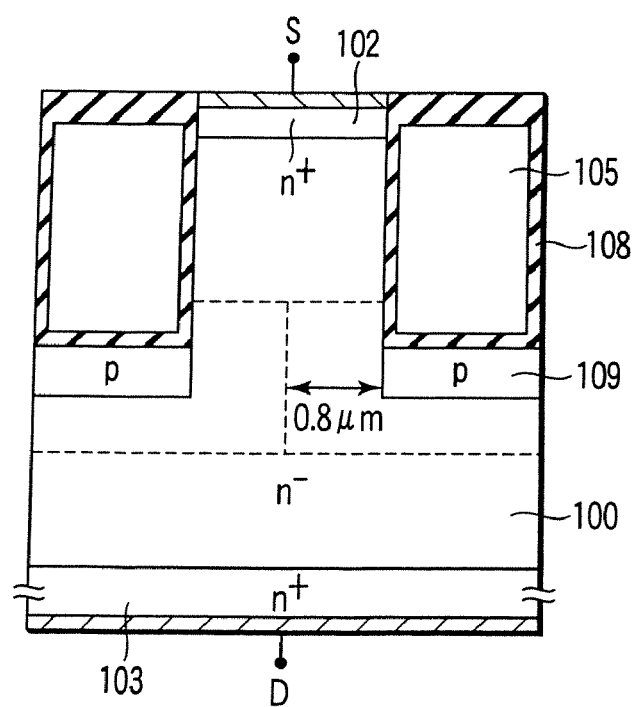
-- BACKGROUND ART --　　FIG. 4

| $X_j\downarrow$ dhalf→ | 0.40 | 0.45 | 0.50 | 0.55 | 0.60 |
|---|---|---|---|---|---|
| 2.5 | 8.26 | 2.08 | 1.33 | 1.17 | 1.10 |
| 3.0 | 8.08 | 2.22 | 1.29 | 1.16 | 1.10 |
| 3.5 | 7.58 | 1.71 | 1.33 | 1.56 | 1.11 |
| 4.0 | 7.92 | 2.38 | 1.32 | 1.15 | 1.10 |
| 4.5 | 6.60 | 2.17 | 1.32 | 1.15 | 1.08 |
| 5.0 | 7.89 | 2.14 | 1.32 | 1.15 | 1.08 |
FIG. 13
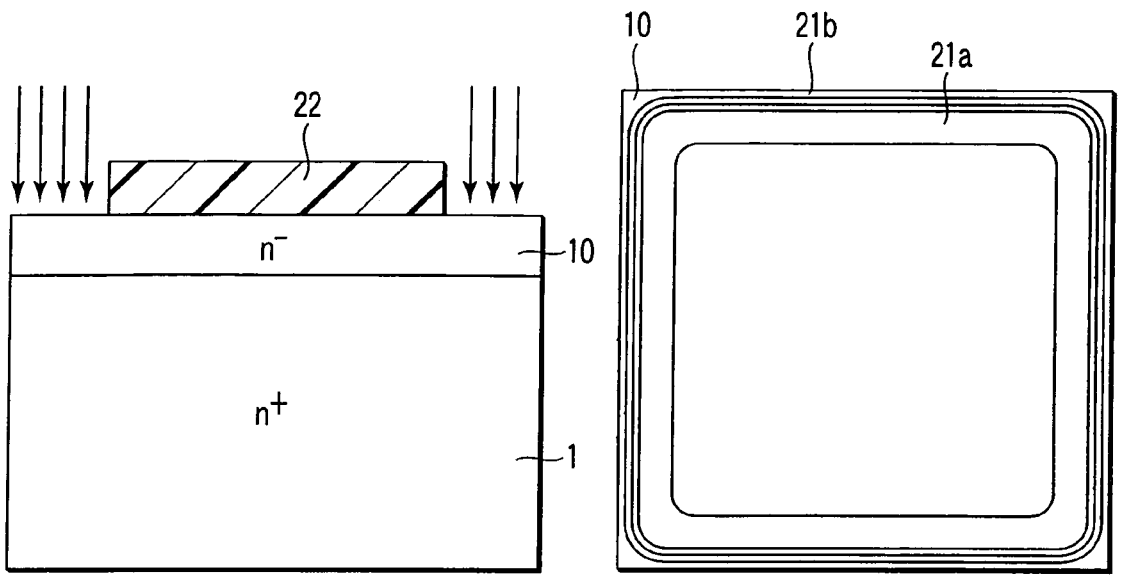
FIG. 14A   FIG. 14B
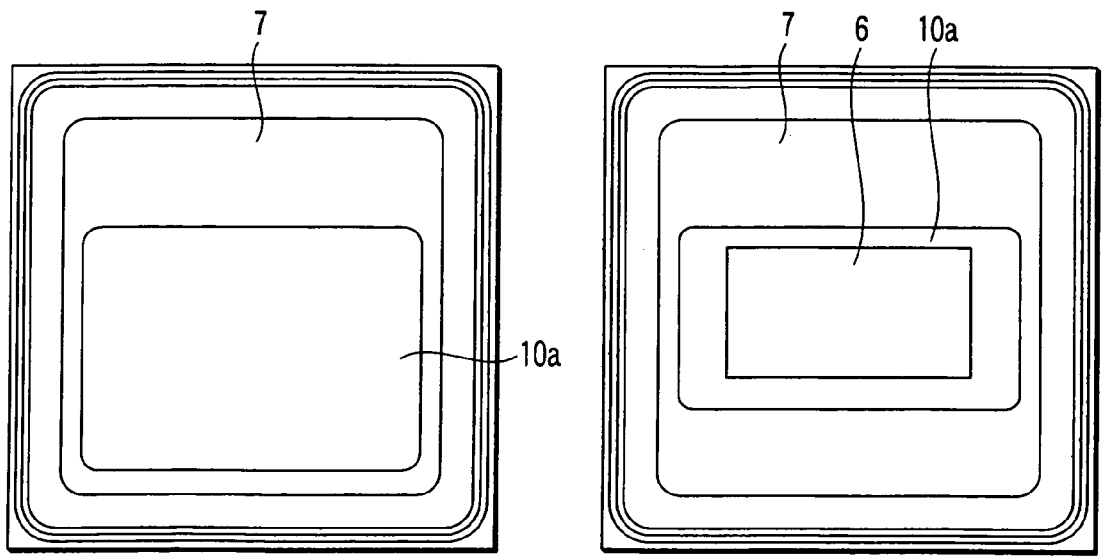
FIG. 15   FIG. 16

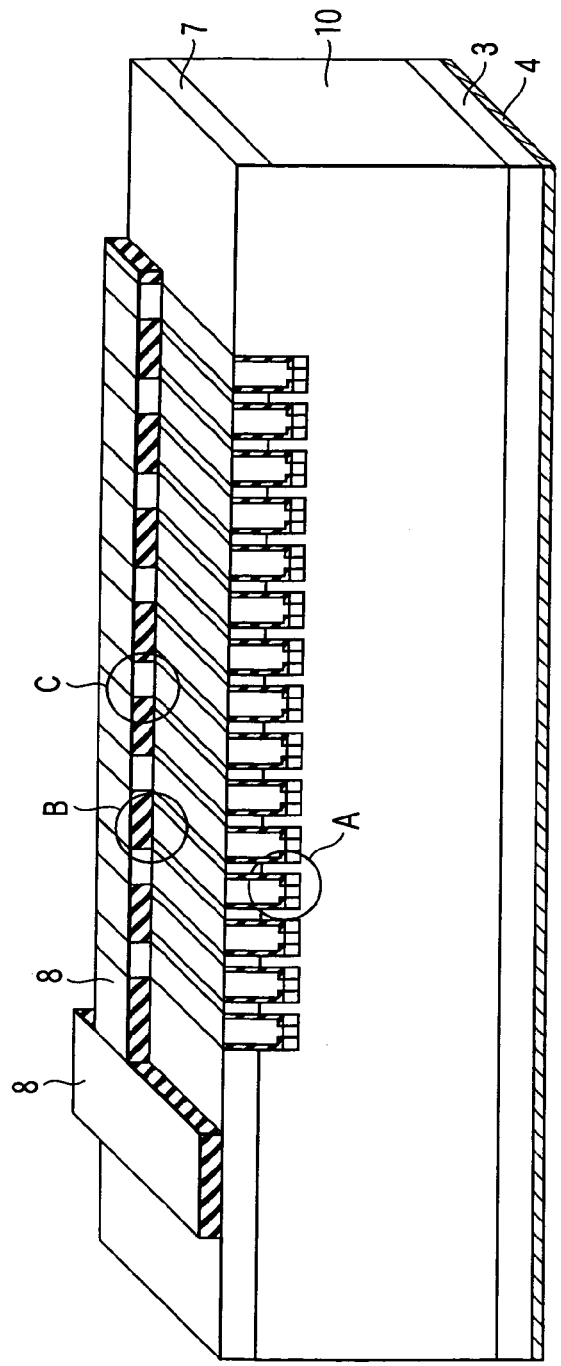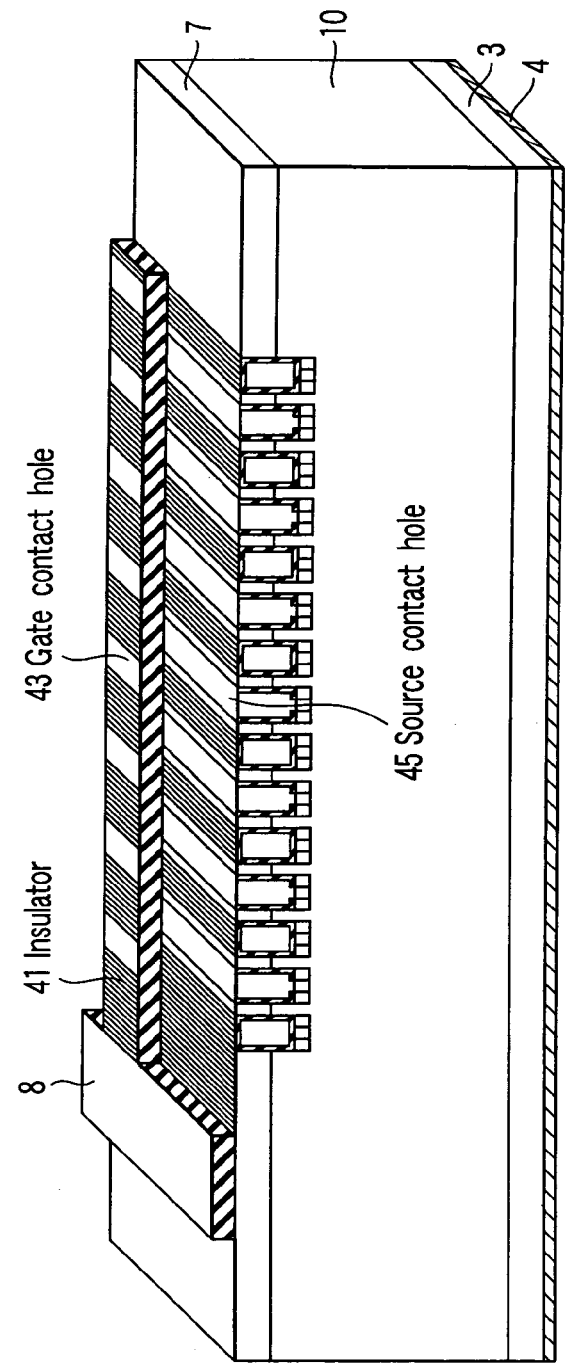
FIG. 26
FIG. 27

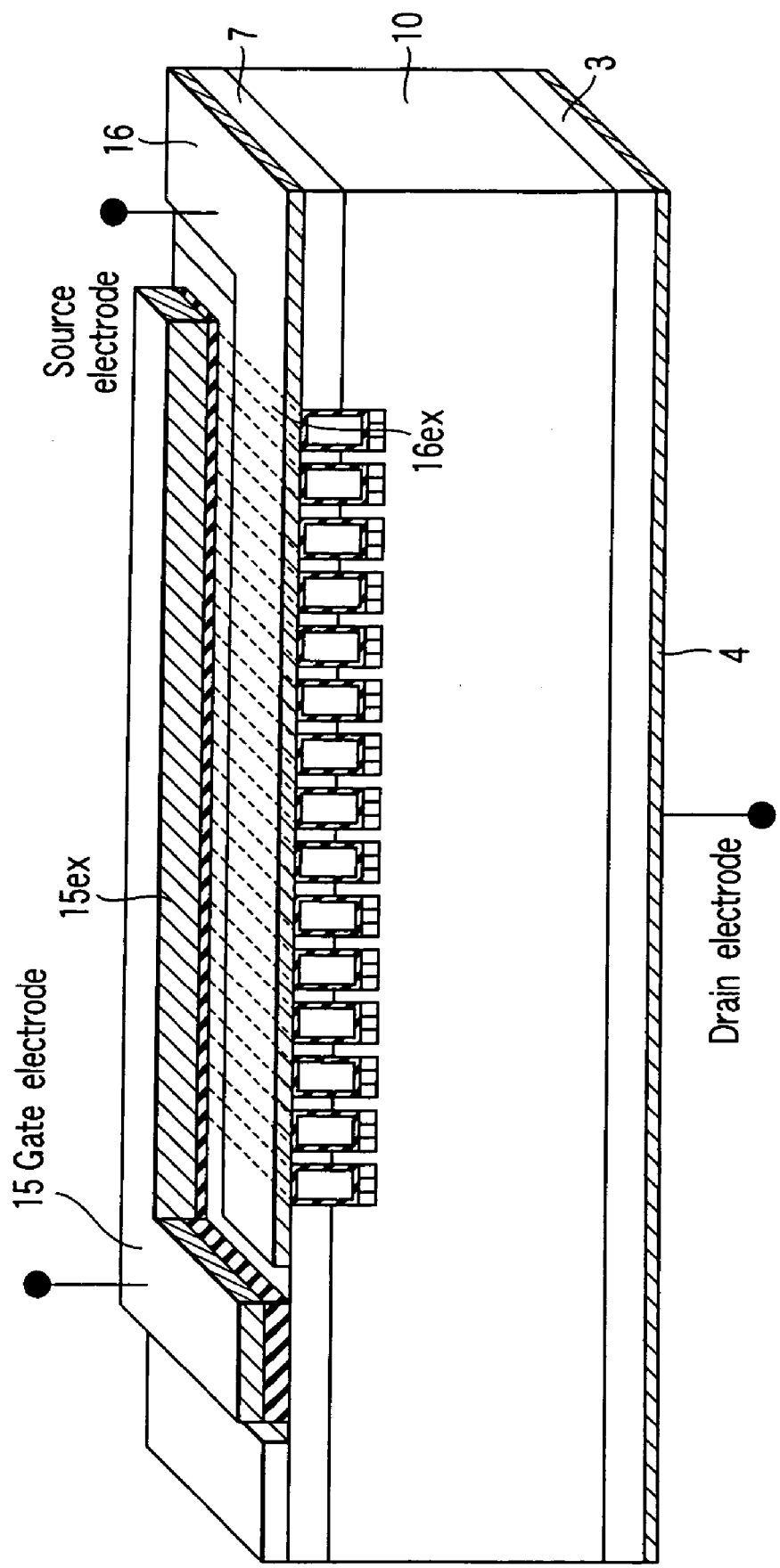
F I G. 31

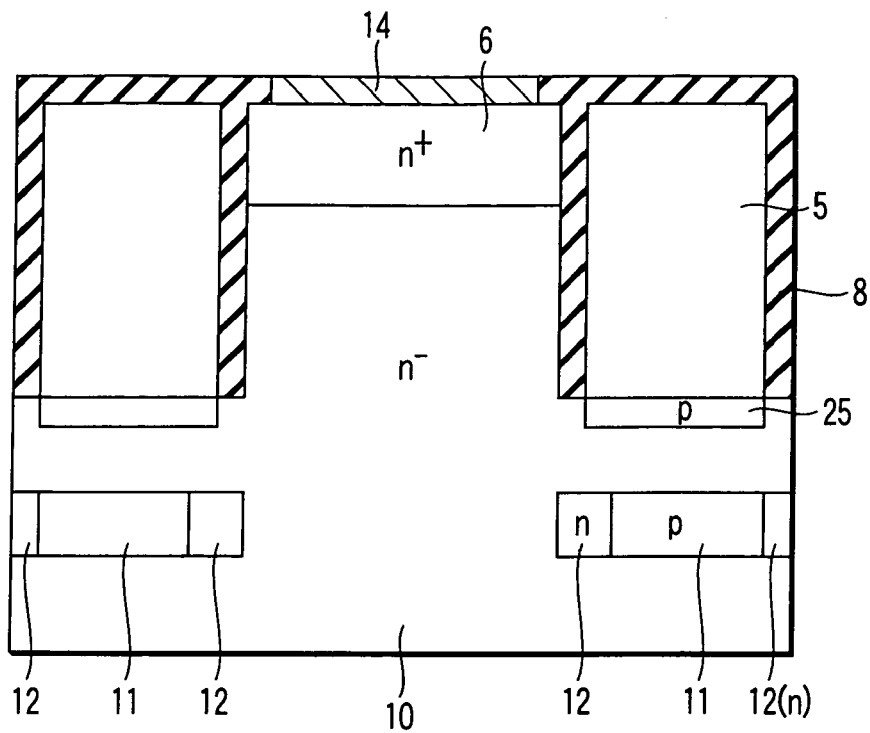
F I G. 44
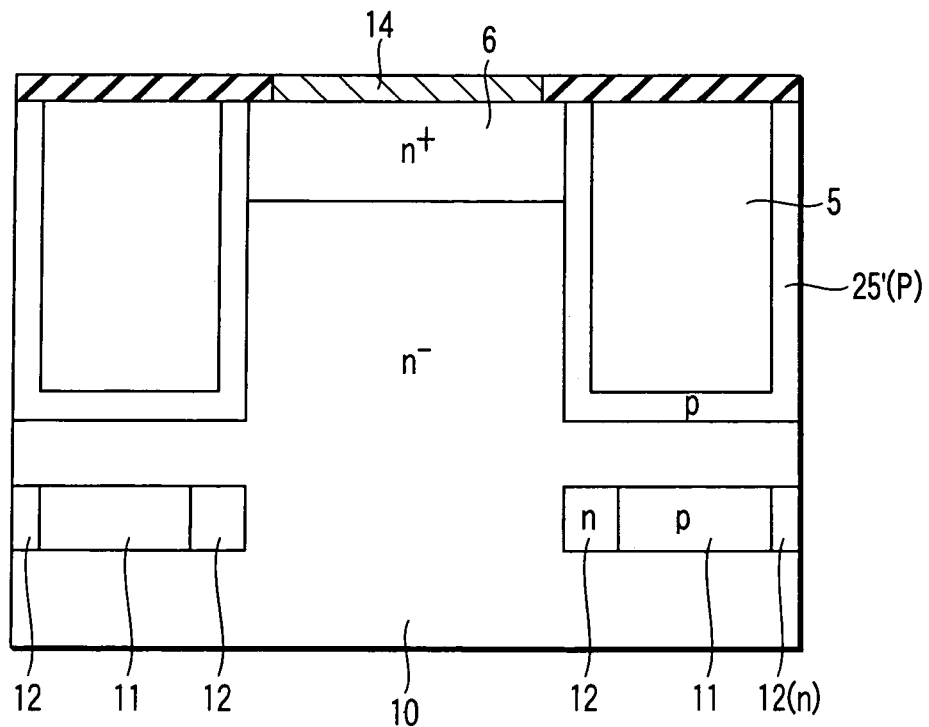
F I G. 45

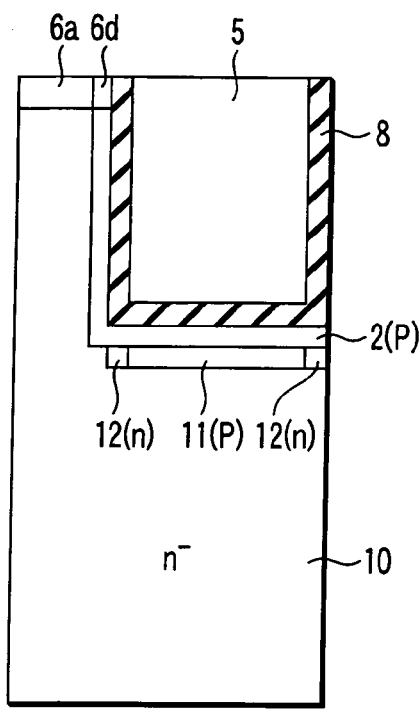
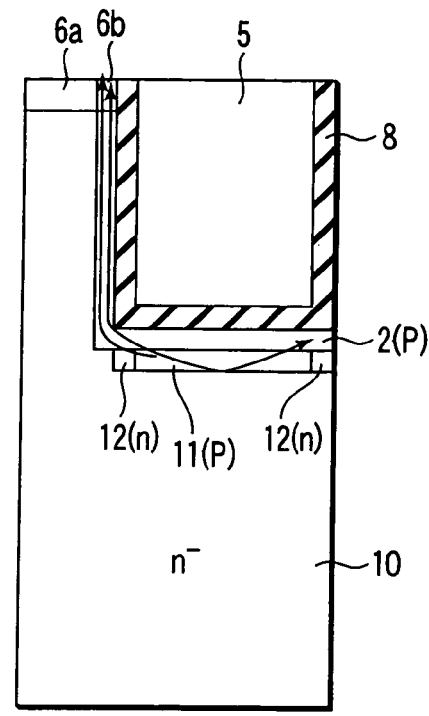
FIG. 50A    FIG. 50B
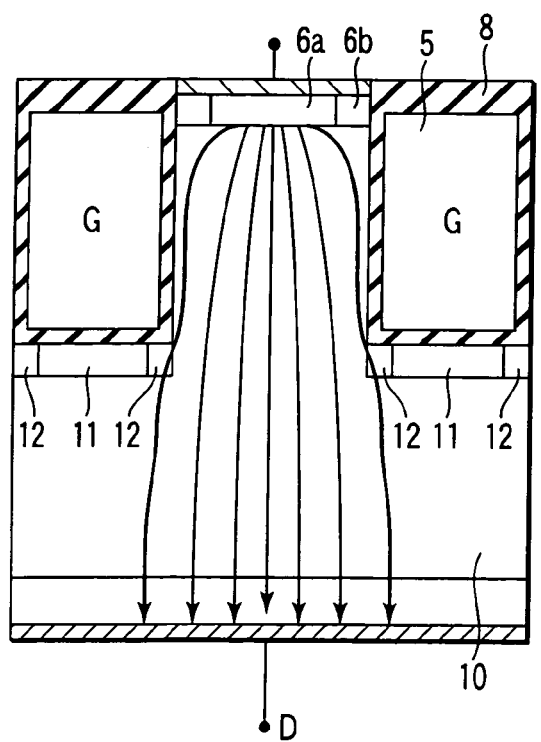
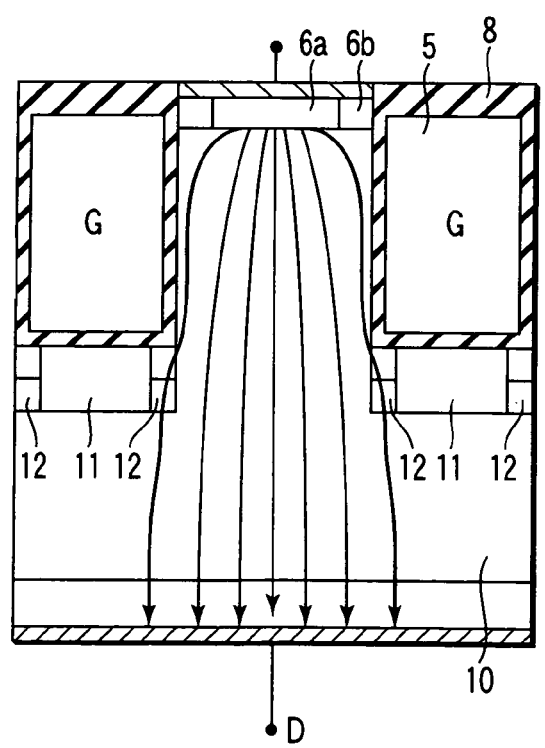
FIG. 51A    FIG. 51B On-resistance increase due to 6A area decrease On-resistance increase due to N-region current path

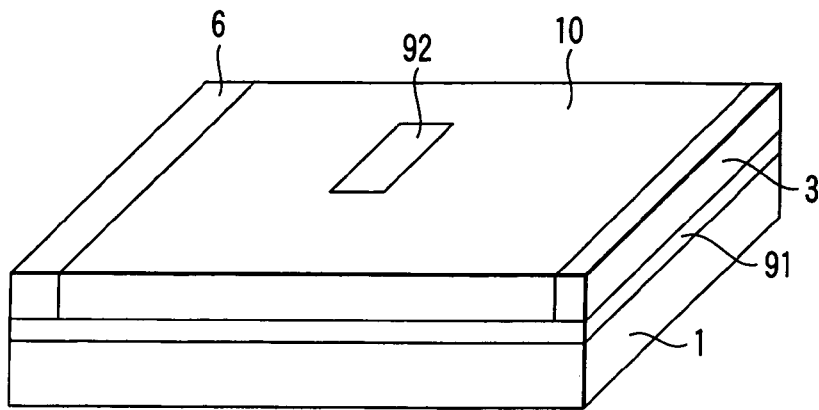
F I G. 71
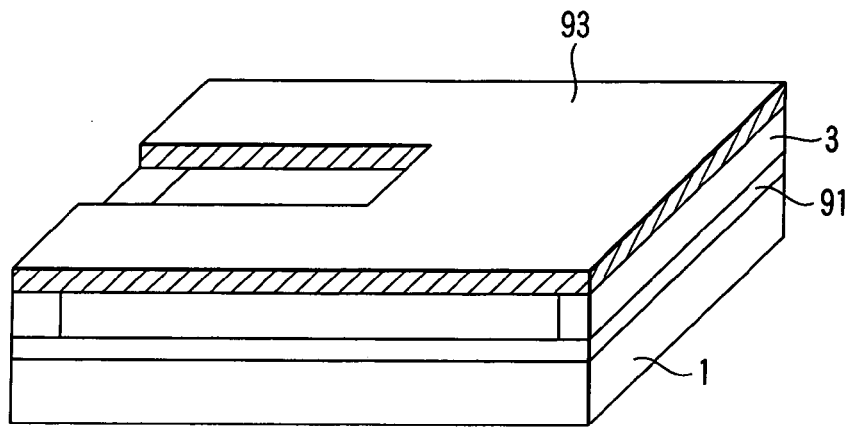
F I G. 72
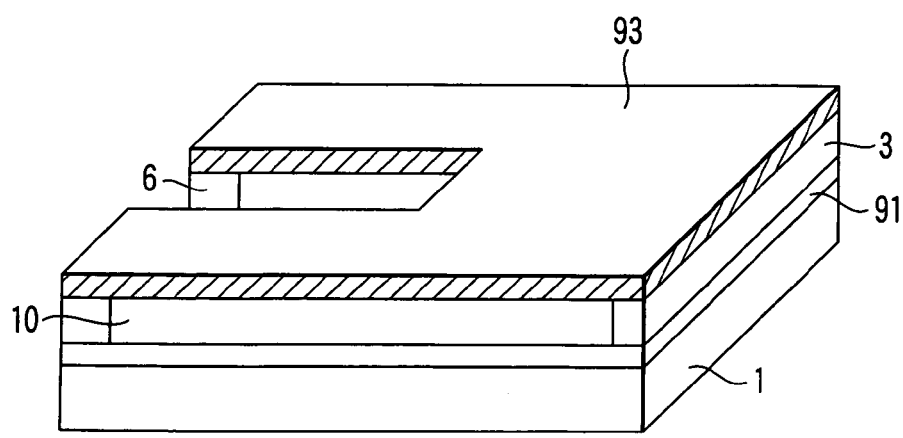
F I G. 73

SEMICONDUCTOR DEVICE

CROSS-REFERENCE TO RELATED APPLICATIONS

This application is a continuation of U.S. patent application Ser. No. 11/038,043, filed Jan. 21, 2005 now U.S. Pat. No. 6,969,887, and is based upon and claims the benefit of priority from prior Japanese Patent Applications No. 2004-015944, filed Jan. 23, 2004; and No. 2005-000796, filed Jan. 5, 2005. The entire contents of these applications are incorporated herein by reference.

BACKGROUND OF THE INVENTION

1. Field of the Invention

The present invention relates to a semiconductor device and, more particularly, to a power transistor capable of decreasing the on-resistance.

2. Description of the Related Art

As power transistors, a high-voltage static induction transistor (power SIT) and high-voltage junction field effect transistor (power JFET) are conventionally known, in which the current flowing between the main opposing terminals (source and drain) is controlled by a depletion layer formed by the voltage applied to the gate electrode. In these power transistors, a semiconductor layer which is located between the gate region formed in the semiconductor layer and the drain region formed in one surface of the semiconductor layer is depleted, thereby holding the breakdown voltage.

In these power transistors, however, when the semiconductor layer is depleted by turn-off, electrons flow to the power supply circuit through the drain electrode. Holes in the gate region flow to the gate circuit through the gate electrode. This gate current increases the load on the gate circuit and makes the gate circuit itself bulky.

To suppress the gate current and reduce the load on the gate circuit, a structure called a MOS-SIT has been invented (Jpn. Pat. Appln. KOKAI Publication No. 2002-83963). In MOS-SIT, a trench is formed in a substrate. An insulating film is formed on the inner surface of the trench, and then, a gate electrode material is buried in the trench. The insulating film suppresses the inflow of holes to the gate region at the time of depletion. For this reason, the gate current can be suppressed, and the load on the gate circuit can be reduced. However, when a high voltage is applied between the source and drain, a very large electric field concentrates on the edge portion on the bottom of the trench, and dielectric breakdown occurs in the insulating film.

To solve this problem, in Jpn. Pat. Appln. KOKAI Publication No. 2003-69042, a p-type impurity region is formed on the bottom of the trench filled with the gate electrode, thereby relaxing the high field concentrating on the edge portion on the bottom of the trench. This impurity region can also function to suppress the inflow of holes to the gate region, like the gate insulating film. However, the impurity concentration in the impurity region is much higher than that in the substrate. Even when the transistor is not operating, a depletion layer by a built-in potential always spontaneously extends. Hence, the current path is already narrow or is closed in the initial state, and the on-resistance is very high. For this reason, a power transistor capable of decreasing the on-resistance has been demanded.

BRIEF SUMMARY OF THE INVENTION

According to a first aspect of the invention, there is provided a semiconductor device which comprises:

a semiconductor substrate of a first conductivity type, which has a first major surface and a second major surface;

a lightly-doped semiconductor layer of the first conductivity type, which is formed on the first major surface of the semiconductor substrate;

a first semiconductor region of the first conductivity type, which is formed on a top of an island-shaped region on a surface of the lightly-doped semiconductor layer;

a first electrode, which surrounds the first semiconductor region and is buried in the lightly-doped semiconductor layer to a deeper position than the first semiconductor region;

a second semiconductor region which is formed on the second major surface of the semiconductor substrate;

a buried field relaxation layer which is formed in the lightly-doped semiconductor layer between a bottom surface of the first electrode and the second semiconductor region, the buried field relaxation layer including a first field relaxation layer of the first conductivity type and second field relaxation layers of the second conductivity type formed at two ends of the first field relaxation layer;

a first electrode which is formed on the second semiconductor region on the first major surface; and a second electrode which is formed on the third semiconductor region on the second major surface.

According to a second aspect of the invention, there is provided a semiconductor device which comprises:

a semiconductor substrate of a first conductivity type, which has a first major surface and a second major surface;

a first lightly-doped semiconductor layer of the first conductivity type, which is formed on the first major surface of the semiconductor substrate;

a second lightly-doped semiconductor layer of the first conductivity type, which is formed on the first lightly-doped semiconductor layer;

a third lightly-doped semiconductor layer of the first conductivity type, which is formed on the second lightly-doped semiconductor layer;

a first semiconductor region of the first conductivity type, which is formed on a top of an island-shaped region on a surface of the third lightly-doped semiconductor layer;

a first electrode which surrounds the first semiconductor region and is buried to a deeper position than the first semiconductor region so as to extend through the third lightly-doped semiconductor layer;

a second semiconductor region which is formed on the second major surface of the semiconductor substrate;

a buried field relaxation layer which is formed in the second lightly-doped semiconductor layer, the buried field relaxation layer including a first field relaxation layer of the first conductivity type and second field relaxation layers of the second conductivity type formed at two ends of the first field relaxation layer;

a second electrode which is formed on the first semiconductor region on the first major surface; and a third electrode which is formed on the second semiconductor region on the second major surface.

BRIEF DESCRIPTION OF THE SEVERAL VIEWS OF THE DRAWING

FIG. 3 is a sectional view of another comparative semiconductor device;

FIG. 4 is a sectional view for explaining the problem of another comparative semiconductor device;

FIG. 13 is a table showing the dependence of the on-resistance of the semiconductor device according to the first embodiment on a gate region depth (Xj) and a distance (dhalf) ½ the distance between gates;

FIGS. 14A to 23B are views showing steps in manufacturing the semiconductor device according to the first embodiment;

FIGS. 26 to 28 are partially cutaway perspective views showing steps in forming the first modification of the extraction conductive path;

FIGS. 29 to 31 are partially cutaway perspective views showing steps in forming a second modification of the extraction conductive path;

FIG. 44 is a sectional view of a semiconductor device according to the second embodiment;

FIG. 45 is a sectional view of a semiconductor device according to a third embodiment;

FIGS. 50A and 50B are views showing the flow of holes from the first field relaxation layer to the source electrode in the fifth embodiment;

FIGS. 51A to 51E are views showing variations of the flow of electrons when the semiconductor device according to the fifth embodiment operates;

FIGS. 71 to 74 are schematic perspective views showing steps in manufacturing a lateral semiconductor device (power SIT) according to a twelfth embodiment.

DETAILED DESCRIPTION OF THE INVENTION

Figure 1:
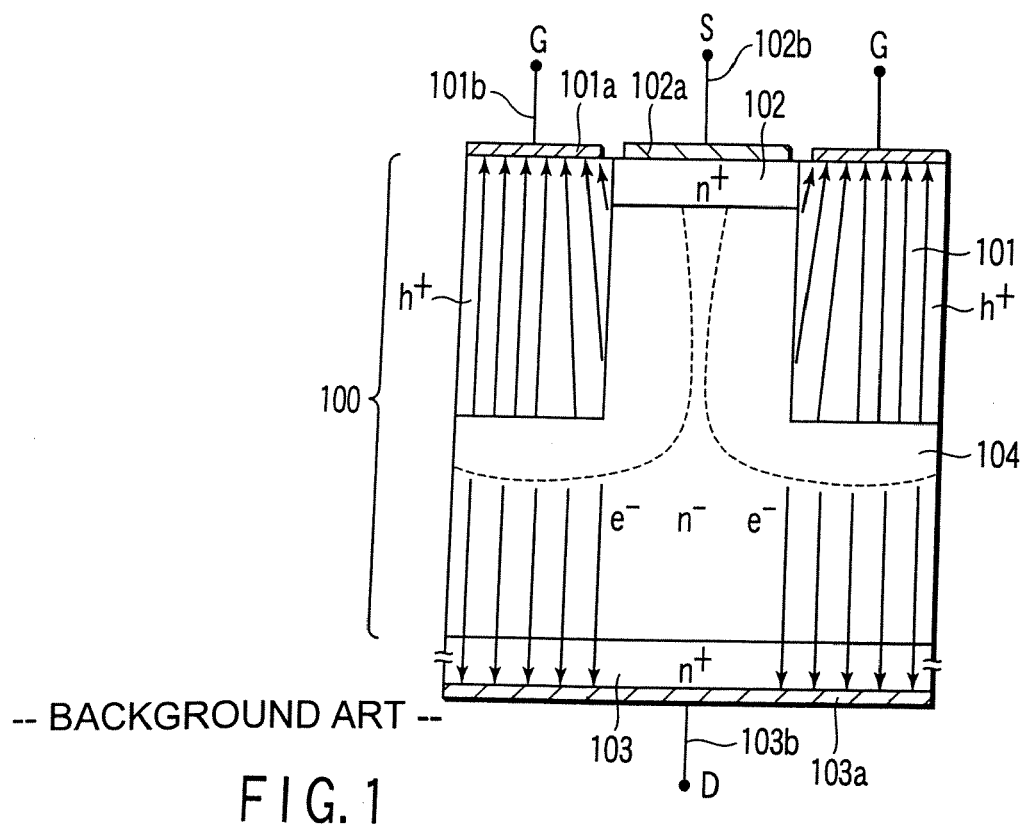
FIG. 1 is a sectional view of a comparative semiconductor device (power SIT)

The problems of comparative power transistors will be described in more detail before a description of the embodiments of the present invention. In a comparative power SIT or power JFET, a semiconductor layer 100 which is located between a gate region 101 formed in the semiconductor layer 100 formed on a substrate (103) and the drain region 103 in the substrate is depleted to form a depletion layer 104, thereby holding the breakdown voltage, as shown in FIG. 1.

However, the power transistor shown in FIG. 1 has the following problems. When the depletion layer 104 is formed by turn-off, electrons flow to the power supply circuit (not shown) through a drain electrode 103a (this current will be referred to as a "drain current" hereinafter). Holes in the gate region 101 flow to the gate circuit through a gate electrode 101a (this current will be referred to as a "gate current" hereinafter). This gate current increases the load on the gate circuit and makes the gate circuit itself bulky.

Figure 2:
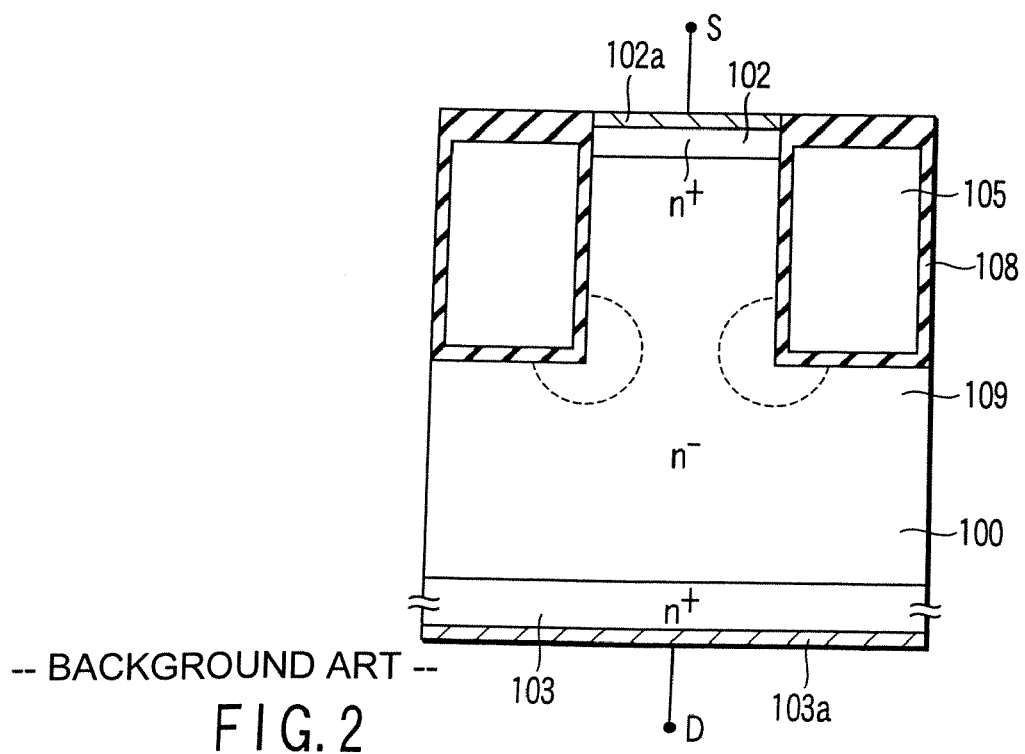
FIG. 2 is a sectional view of a comparative semiconductor device (MOS-SIT)

As described above, to suppress the gate current and reduce the load on the gate circuit, a structure called a MOS-SIT has been invented. FIG. 2 is a sectional view of a MOS-SIT. Unlike the structure shown in FIG. 1, a trench is formed in a substrate. An insulating film 108 is formed on the inner surface of the trench, and then, a gate electrode material is buried in the trench. A gate electrode 105 is covered with the gate insulating film 108. The gate insulating film 108 functions to suppress the inflow of holes to the gate region 105 at the time of depletion of the semiconductor layer 100. For this reason, the gate current can be suppressed, and the load on the gate circuit can be reduced.

However, the MOS-SIT shown in FIG. 2 has the following problem. Since the MOS-SIT is normally used as a high-voltage element, a voltage of about several hundred V is applied between the drain and source. At this time, a very large electric field concentrates on the edge portion (indicated by dotted lines) on the bottom of the trench in which the gate electrode 105 is buried. If a high field of, e.g., about 800 V/μm concentrates on the gate insulating film 108 at the edge portion, dielectric breakdown occurs.

To solve this problem, a structure shown in FIG. 3 has been invented. The structure shown in FIG. 3 is the same as in FIG. 2 except that a p-type impurity region 109 is formed on the bottom of the trench in which the gate electrode 105 is buried. The impurity region 109 relaxes the high field concentrating on the edge portion on the bottom of the trench.

However, the following problem arises in the MOS-SIT shown in FIG. 3. FIG. 4 shows the same MOS-SIT structure as in FIG. 3. The p-type impurity concentration in the impurity region 109 is much higher than that the n-type impurity concentration in the substrate 100. Even when the device is not operating, a depletion layer by a built-in potential always spontaneously extends. Hence, the current path is already narrow, or depletion layers extending from two gate electrodes are connected in the initial state. This state generates a very high on-resistance. Its influence becomes conspicuous when the channel region and gate region are microfabricated. For example, when the concentration of a lightly-doped layer of 4H—SiC (band gap: 3.02 eV) with a hexagonal system is set to $4 \times 10^{15}$ cm$^{-3}$, the length of the depletion layer extending from the impurity region 109 is about 0.8 μm. For this reason, the channel cannot be open unless the channel width is 1.6 μm or more. This is a limiting factor in microfabrication. This problem is not limited to 4H—SiC and arises in all kinds of semiconductors. It is especially conspicuous in wide-band-gap semiconductors such as 4H—SiC, 6H—SiC, 3C—SiC, GaN, and diamond.

In the semiconductor device of this embodiment, when the semiconductor layer between the gate region and the drain region is of, e.g., an n-type, a buried field relaxation layer having an npn structure which is not connected to the gate region is formed between the gate and drain. An n-type epitaxial layer between the field relaxation layer and the drain is depleted to hold the breakdown voltage. The n-type impurity concentration in the n-type layer of the field relaxation layer having the npn structure is higher than that in the epitaxial layer. For this reason, the depletion layer which spontaneously extends by a built-in potential can be limited to small. Hence, the on-resistance in the initial state can be reduced. In addition, since the p-type impurity layer of the field relaxation layer is not in contact with the gate electrode, holes which are discharged from the p-n junction interface upon depleting the n-type drift layer do not flow in the gate circuit. Hence, the gate circuit can be kept small. Detailed embodiments will be described below.

First Embodiment

Figure 5:
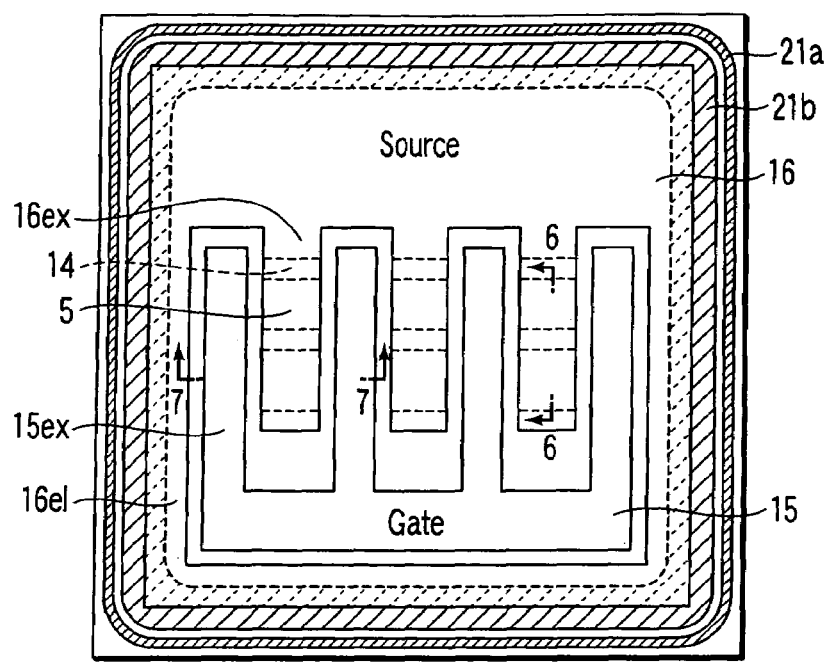
FIG. 5 is a plan view of a semiconductor device according to the first embodiment of the present invention.
Figure 6:
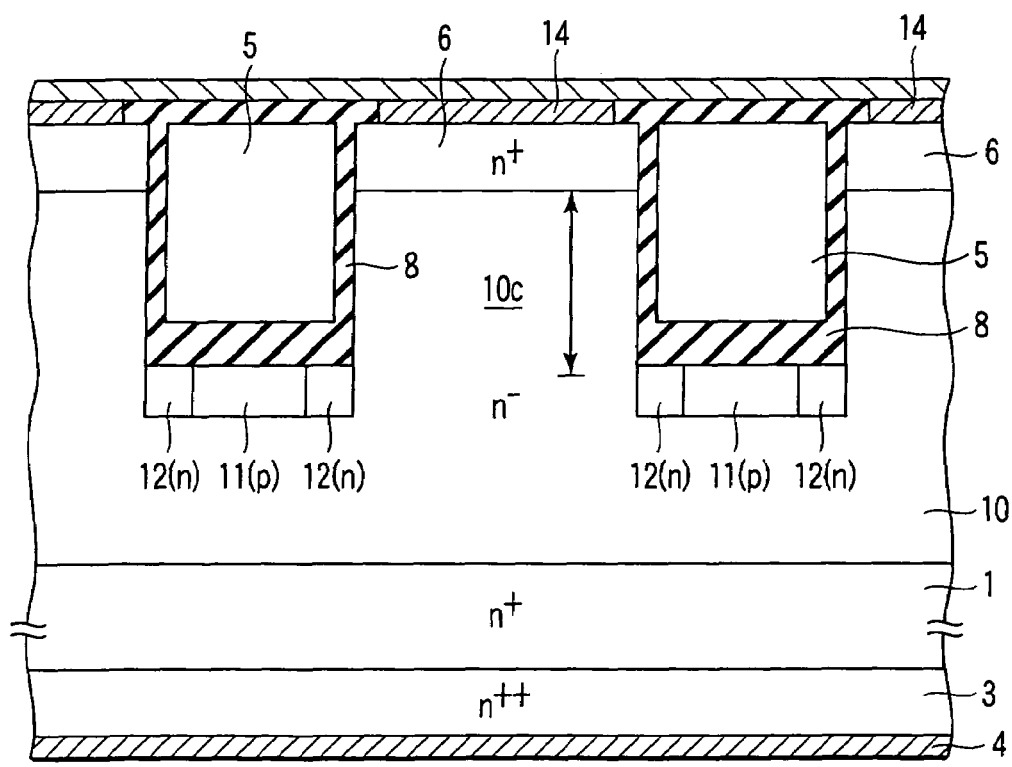
FIG. 6 is a sectional view taken along a line 6-6 in FIG. 5.
Figure 7:
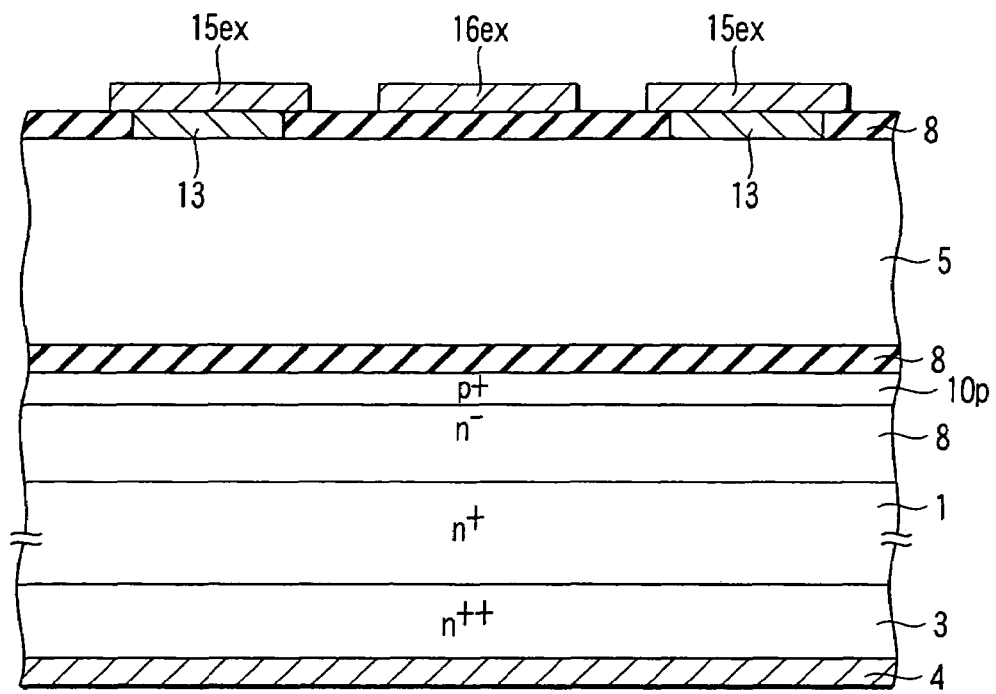
FIG. 7 is a sectional view taken along a line 7-7 in FIG. 5.

FIG. 5 is a plan view of a semiconductor device according to a first embodiment. FIGS. 6 and 7 are sectional views taken along a line 6-6 and a line 7-7 in FIG. 5, respectively. In the semiconductor device of this embodiment, one power transistor is formed by connecting a plurality of unit transistors in parallel. FIG. 5 is a plan view of this power transistor. A plurality of unit transistors are formed in an element formation region surrounded by a guard ring 21a and a RESURF layer 21b, which serve as an edge termination structure. The plurality of unit transistors are arrayed under a source extraction electrode line 16ex. The source regions of the unit transistors are commonly connected to a source pad 16 through a source contact 14 and source extraction electrode 16ex. The gate electrodes of the unit transistors are extracted to both sides of the source extraction electrode 16ex and commonly connected to a gate pad 15 through a gate extraction electrode 15ex. The source pad 16 has a source electrode extension portion 16el around the element formation region. The source pad 16 and extension portion 16el are electrically connected to the RESURF layer 21b of the edge termination structure.

FIG. 6 shows the section of a unit transistor. An epitaxial layer 10 which has a thickness of about 10 μm is formed on an n$^+$-type SiC substrate 1. The n-type impurity concentration (e.g., $5 \times 10^{15}$ cm$^{-3}$) in the epitaxial layer 10 is lower than that in the SiC substrate 1. An n$^+$-type impurity region (the impurity concentration is, e.g., $2 \times 10^{20}$ cm$^{-3}$) is formed on the surface of the epitaxial layer 10 and serves as a source region 6. Gate regions (electrodes) 5 are formed via a gate insulating film 8 while sandwiching the source region 6. The thickness of the gate insulating film 8 is, e.g., 0.1 μm. The width of the gate insulating film 8 is, e.g., 0.3 μm. The height of the gate insulating film 8 is, e.g., 2.8 μm.

A first field relaxation layer 11 having a p-type impurity concentration of $1 \times 10^{18}$ cm$^{-3}$ is formed under each gate region 5. The first field relaxation layer 11 is not separated from the gate insulating film 8. Second field relaxation layers 12 having an n-type impurity concentration of $1 \times 10^{17}$ cm$^{-3}$ are formed on both sides of the first field relaxation layer 11. The whole structure including the first and second field relaxation layers corresponds to the above-described buried field relaxation layer.

An n$^{++}$-type drain layer 3 and a drain electrode 4 are formed sequentially under the n$^+$-type SiC substrate 1.

FIG. 7 is a sectional view showing the manner the gate electrode is extracted. Under the gate extraction electrode 15ex, the gate extraction electrode 15ex and gate region 5 are connected through a gate contact 13 formed on the opening portion of the insulating film 8.

Referring to FIG. 6, the first field relaxation layer 11 and second field relaxation layers 12 are in contact with each other. With this structure, the second field relaxation layers 12 suppress a depletion layer from extending horizontally from the first field relaxation layer 11. The first field relaxation layer 11 and second field relaxation layers 12 need not always be in contact. However, if they are separated too far, the depletion layer from the first field relaxation layer 11 horizontally extends and spreads toward the center of the epitaxial layer 10. In this case, the advantage of the present invention cannot be enhanced.

Figure 8A:
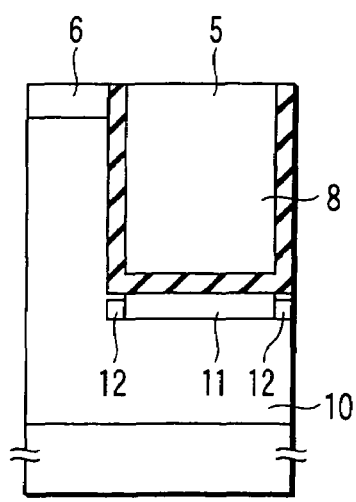
FIGS. 8A to 8C are sectional views showing variations of the position of the buried field relaxation layer in FIG. 5.
Figure 8B:
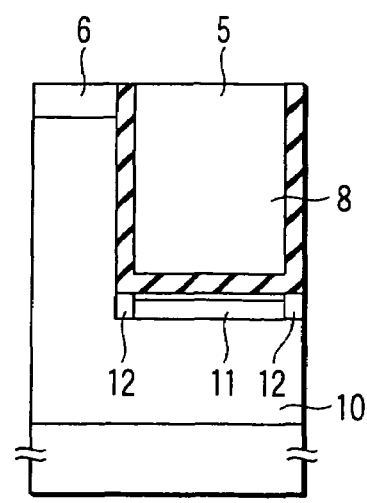
Figure 8C:
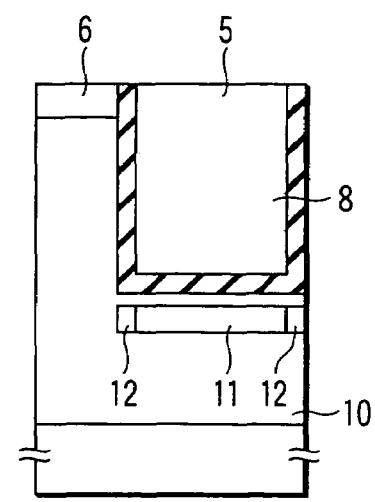

The first field relaxation layer 11 and second field relaxation layers 12 need not always be in contact with the gate insulating film 8 and may be separated from the gate insulating film 8. Referring to FIG. 6, both the first field relaxation layer and the second field relaxation layers are in contact with the gate insulating film. As shown in FIGS. 8A to 8C, only the first field relaxation layer 11 may be in contact with the gate insulating film 8 (FIG. 8A). Only the second field relaxation layers 12 may be in contact with the gate insulating film 8 (FIG. 8B). Both the first field relaxation layer 11 and the second field relaxation layers 12 may be separated from the gate insulating film (FIG. 8C).

FIGS. 9 to 12 show results obtained by verifying the advantage of the second field relaxation layers 12 by using a device simulator. In the calculation, the thickness of the epitaxial layer 10 is 10 μm. The depth of a channel region 10c (FIG. 6) is 2.2 μm. The gate width is 0.3 μm. The gate region 5 is in direct contact with the gate insulating film 8.

The first field relaxation layer 11 having a p-type impurity concentration of $1\times10^{18}$ cm$^{-3}$ is formed under the gate electrode 5 at a position separated from the gate insulating film 8 by 0.1 µm. The second field relaxation layers 12 having an n-type impurity concentration of $1\times10^{17}$ cm$^{-3}$ are formed on both sides of the first field relaxation layer 11. That is, the structure shown in FIG. 8C is simulated.

In addition, no electrical path which connects the first field relaxation layer 11 to the source contact 14 is present. That is, only extinction by carrier recombination is assumed. The calculation is based on the following conditions. When on, a gate voltage (Vg) is 2.5V, and a drain voltage (Vd) is 3V. when off, the gate bias Vg is −20V.

Figure 9:
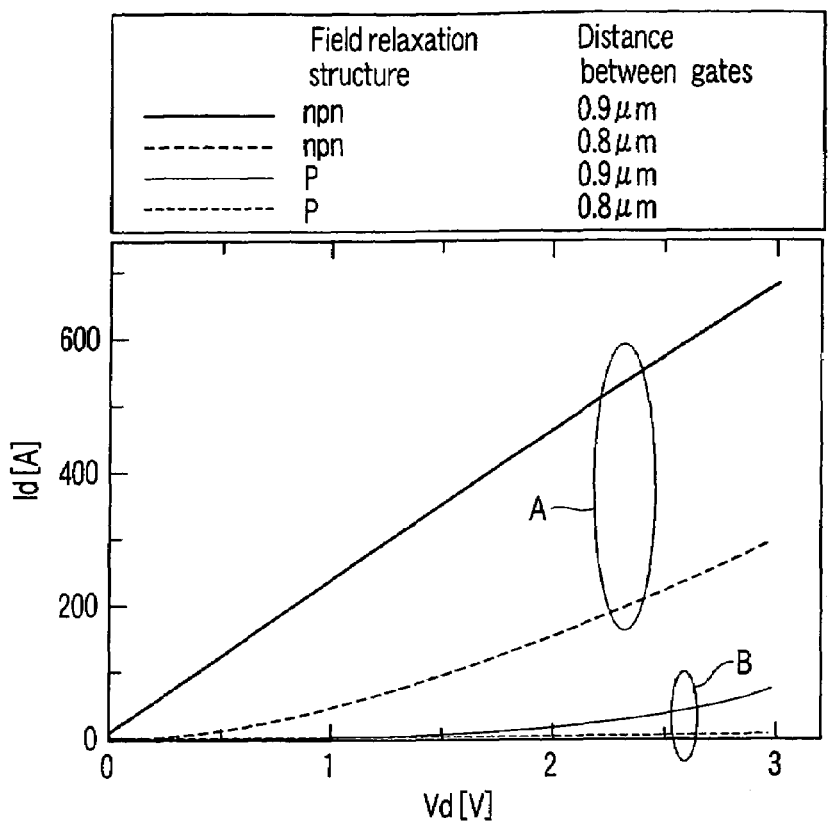
FIG. 9 is a graph showing I-V characteristics representing the effect of the buried field relaxation layer of the present invention.

FIG. 9 is a graph showing I-V characteristics in the ON state when the distance between the adjacent gate regions 5 is set to 0.8 µm and 0.9 µm. The gate voltage (Vg) is 2.5V. A drain-to-source voltage (Vsd) is 3V. Referring to FIG. 9, A indicates a case (the structure of the first embodiment) in which the second field relaxation layers 12 are formed on both sides of the first field relaxation layer 11. B indicates a case in which only the first field relaxation layer 11 is in contact with the gate insulating film 8.

When the distance between the gate regions 5 is 0.9 µm, the on-resistance is 4.3 mΩ·cm$^2$ in the case A. In the case B, the on-resistance is higher than in the case A by about 10 times although the channel is open because depletion layers extending from the p-type field relaxation layers (corresponding to the first field relaxation layer 11) are not connected between the adjacent gate regions 5.

When the distance between the gate regions 5 is 0.8 µm, the on-resistance is 10 mΩ·cm$^2$ in the case A. In the case B, the channel is closed because the depletion layers extending from the p-type field relaxation layers are connected.

Figure 10:
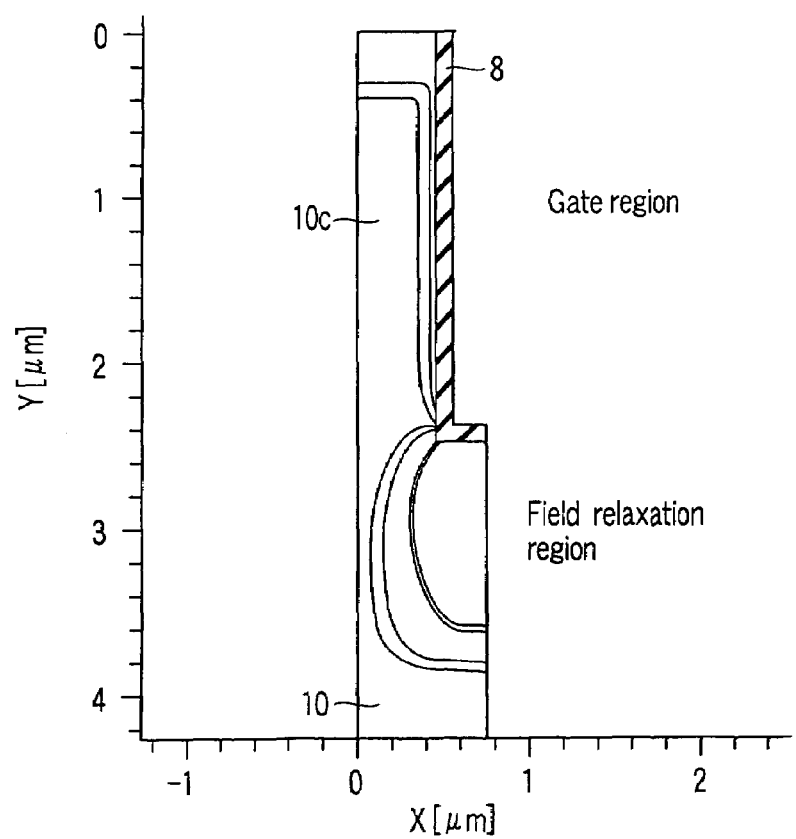
FIG. 10 is a view showing the profile of the electron density near the channel region of the semiconductor device according to a first embodiment.
Figure 11:
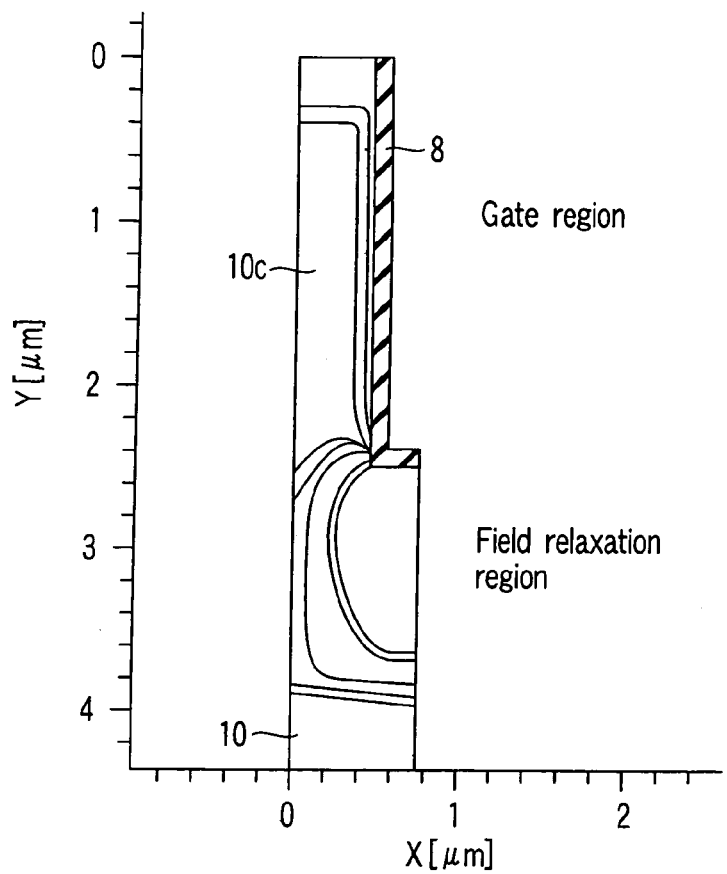
FIG. 11 is a view showing the profile of the electron density near the channel region of the comparative semiconductor device (FIG. 3)

FIG. 10 shows the electron density when on in the structure (FIG. 5) of this embodiment. FIG. 11 shows the electron density when on in the comparative structure (FIG. 3). FIGS. 10 and 11 show a portion of about 4 µm in the depth direction (Y direction) when the upper surface of the epitaxial layer 10 is defined as 0. In addition, the central portion between the gate electrodes is defined as 0 of the X-axis. In a region with a width of about 0.7 µm in the X direction, only the channel region 10c along the insulating film 8 and the side portion of the second field relaxation layer 12 are illustrated. Each curve indicates a profile obtained by connecting equivalent points of the electron density.

On the side surface of the gate oxide film 8, the electron density is high because a channel is formed in both FIGS. 10 and 11. Referring to FIG. 10, a depletion layer extends to the side surface of the second field relaxation layer 12 (not shown). The electron density curve equivalent to the channel region is bent toward the central portion (X=0) between the gates. The channel is still open at the central portion between the gate regions 5. Referring to FIG. 11, a depletion layer largely extends on the side portion of the second field relaxation layer 12 (side portion), and the channel is kept closed. For this reason, in FIG. 11, the on-resistance becomes high because of the influence of the buried field relaxation layer.

Figure 12:
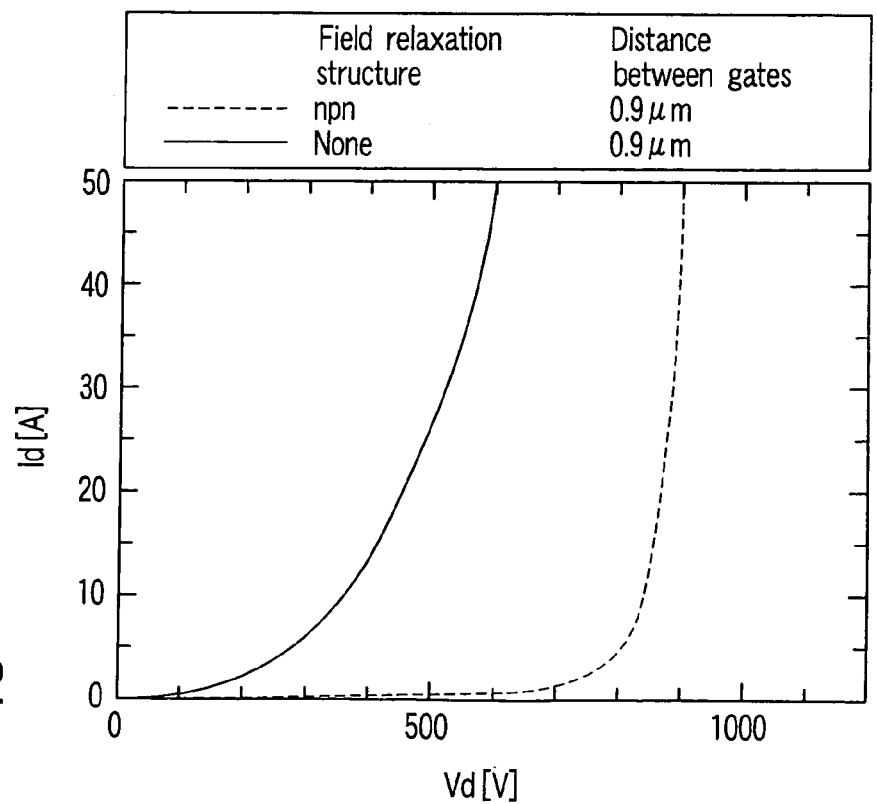
FIG. 12 is a graph of I-V characteristics, which shows comparison between a structure having the buried field relaxation layer of the present invention and a structure having no buried field relaxation layer.

FIG. 12 shows a breakdown voltage when the height of the gate electrode is 2.5 µm, and the distance between the adjacent gate regions 5 is 0.9 µm in the structure of this embodiment in which the second field relaxation layers 12 are formed on both sides of the first field relaxation layer 11, and a breakdown voltage when the distance between the adjacent gate regions 5 is 0.9 µm, and no buried field relaxation layer is formed. When no buried field relaxation layer is formed, the breakdown voltage is about 400V. In the structure of the first embodiment, the breakdown voltage is about 850V. The breakdown voltage is defined as a voltage obtained when a current of 10 mA/cm$^2$ flows to the drain.

As is apparent from this calculation result, when the first field relaxation layer 11 is formed, a high breakdown voltage can be achieved. In addition, when the second field relaxation layers 12 are formed on both sides of the first field relaxation layer 11, as in the first embodiment, the on-resistance can be decreased 10 times or more.

The first and second field relaxation layers 11 and 12 are not electrically connected to the gate region 5. Hence, the load on the gate circuit which applies a voltage to the gate region 5 in switching can be reduced.

FIG. 13 shows a typical example of the dependence of the ON resistance on a gate depth (Xj) and a distance (dhalf) ½ the distance between gates. In this calculation, the thickness of the epitaxial layer 10 is fixed to 10 µm. The distance between the gate insulating film 8 and the first and second field relaxation layers 11 and 12 is set to 0.2 µm. The dhalf dependence of the on-resistance is large. When dhalf=0.6 µm, the on-resistance is about 1.1 mΩcm$^2$. When dhalf=0.4 µm, the on-resistance increases about 8 times. Calculation was also done (not shown) while setting the distance between the gate insulating film 8 and the first and second field relaxation layers 11 and 12 to 0.5 µm and 1.0 µm. When dhalf=0.6 µm, the on-resistance is about 1.2 mΩcm$^2$. When dhalf=0.4 µm, the on-resistance increases about 20 times. Hence, dhalf is preferably at least 0.4 µm from the viewpoint of on-resistance.

The calculation was done assuming that the metal electrode in the gate region 5 is in direct contact with the gate insulating film 8. However, the gate region 5 formed in the trench gate region may be filled with polysilicon. In this case, when the conductivity type of polysilicon is an n-type, the sheet resistance of the buried polysilicon gate electrode can be decreased, and the switching speed can be increased. When the conductivity type of polysilicon is a p-type, the depletion layer easily extends to the n-type channel region 10c even when the gate bias is 0V. That is, an element that is normally off can be formed. When the electrode in contact with the insulating film 8 of the trench gate is made of a metal or silicide, the depletion layer can be extended to the n-type channel region 10c by appropriately selecting the work function. Hence, an element that is normally off can be formed.

A method of manufacturing the semiconductor device according to the first embodiment will be described next with reference to FIGS. 14A and 14B to 23A and 23B. First, an n$^+$-type SiC substrate 1 on which the n—type epitaxial layer 10 having an impurity concentration of $5\times10^{15}$ cm$^{-3}$ and a thickness of about 10 µm is formed is prepared. The resistivity of the n$^+$-type SiC substrate is, e.g., 0.02 Ωcm.

As shown in FIGS. 14A and 14B, p-type ions are implanted partially in the surface of the n—type epitaxial layer 10 to form an edge termination structure (RESURF layer 21b and guard ring 21a) to hold the breakdown voltage. As shown in FIG. 15, p-type ions are implanted in a portion inside the edge termination structure except an active region 10a to form a source contact p-type region 7.

As shown in FIG. 16, P (phosphorus) ions are implanted in the active region 10a at about $1\times10^{18}$ cm$^{-3}$ to $5\times10^{20}$ cm$^{-3}$ to form the n$^+$-type source region 6 having a thickness of abut 0.6 µm and a surface concentration of, e.g., $1\times10^{19}$ cm$^{-3}$. P ions are used here. However, the present invention is not limited to this. For example, N (nitrogen) ions may be used.

Figure 17A:
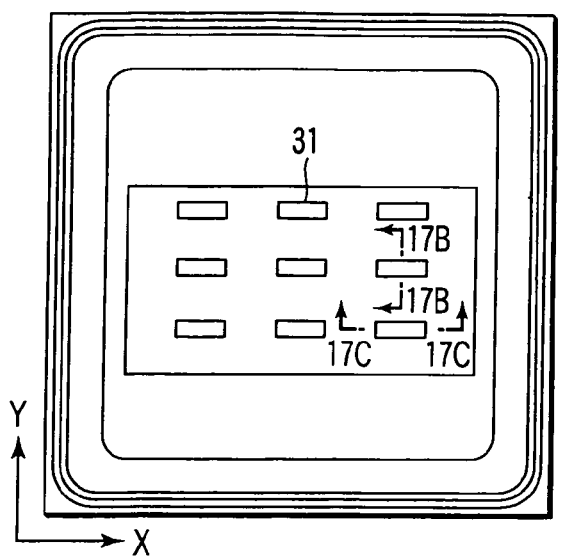
Figure 17B:
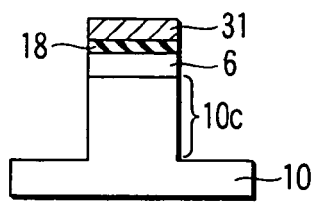
Figure 17C:
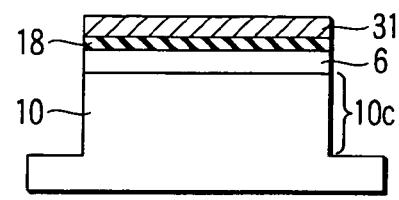

After the impurity region serving as the source region 6 is formed, a silicon oxide film 18 having a several μm is formed on the source region 6, and a trench formation mask 31 of Al is formed, as shown in FIGS. 17A to 17C. Patterning of the trench formation mask 31 is done by Al etching by chlorine-based RIE. The trench formation mask 31 may be made of a metal, $SiO_2$, or a resist. Since the trench formation mask 31 is also used in the ion implantation step immediately after, as will be described later, a material which has a very low etching rate with respect to SiC and can inhibit implantation of ions in the ion implantation step is preferably used.

After the pattern of the trench formation mask 31 is formed, the n-type epitaxial layer 10 is etched in accordance with the pattern along the trench formation mask 31 by SiC dry etching using $CF_4$ gas to form a trench. The depth of the trench is, e.g., 0.5 to 5 μm. The width of the trench is, e.g., 0.5 to 5 μm.

Note that an etching gas is not limited to $CF_4$, and $SF_6$ can be used instead. An additive gas such as HBr or $Cl_2$ may be used if necessary.

As shown in FIGS. 17A to 17C, the region between the plurality of masks 31 is called a trench. At this time, the trench portions extending in the Y direction are etched in advance. After that, the trench portions in the Y and X directions are simultaneously etched. Accordingly, the trench portions extending in the Y direction can selectively be made deep. With the process, a sidewall bottom horizontal p-type portion 101$p$ shown in FIG. 18D (to be described later) can be formed. In the steps shown in FIGS. 20A to 20D, the p-type region of the first field relaxation layer 11 is connected to the sidewall bottom horizontal p-type portion 101$p$. After that, when the source contact 14 is formed on the source region 6, a path which connects the first field relaxation layer 11 to the source contact 14 is formed. Accordingly, holes generated in the first field relaxation layer 11 (p-type region) can flow to the source contact 14. A portion of the epitaxial layer 10, which remains under the source region 6 in this etching step, serves as the channel region 10$c$. The substrate 1 under the epitaxial layer 10 is not illustrated in FIGS. 17B and 17C. This also applies to the remaining drawings.

Figure 18A:
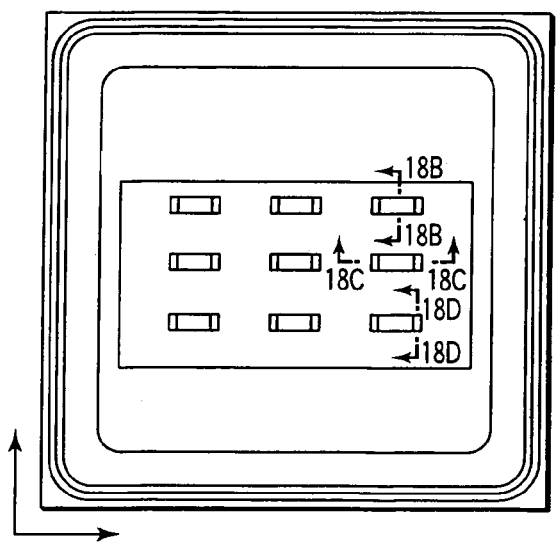
Figure 18B:
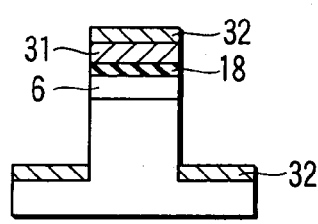
Figure 18C:
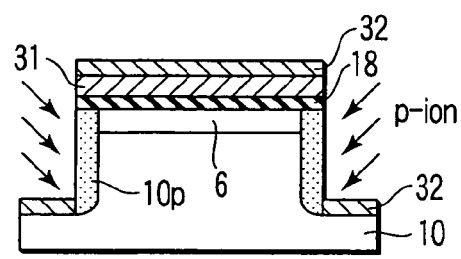
Figure 18D:
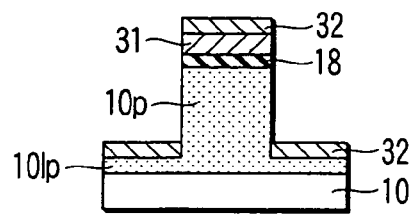
Figure 19A:
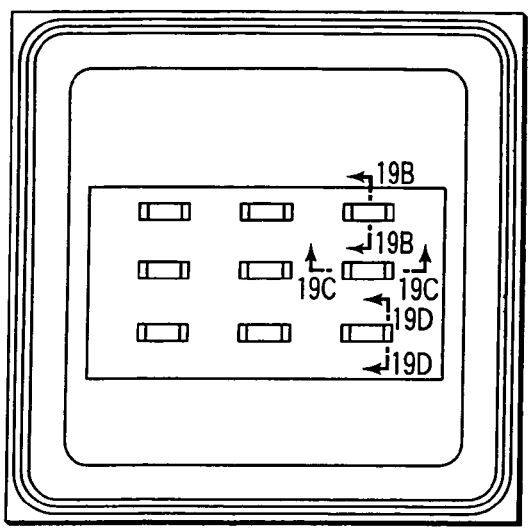
Figure 19B:
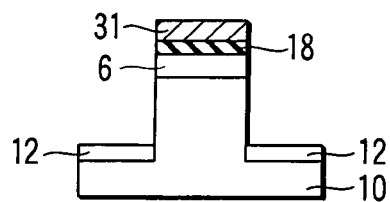
Figure 19C:
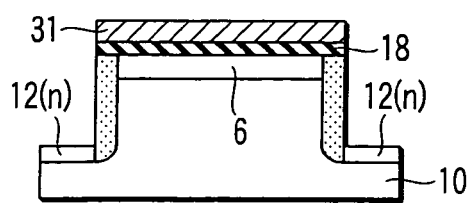

After the trench is formed, an ion implantation mask 32 of Mo or the like is formed on the top and bottom portions of the trench, as shown in FIGS. 18A to 18D. As shown in FIG. 18C, p-type ions (e.g., B) are obliquely implanted in the sidewalls of the trench. The ion implantation mask 32 prevents the p-type ions which enter the trench bottom portion upon oblique ion implantation from reaching the substrate. The ions can be implanted in only sidewalls 10$p$ shown in FIGS. 18B and 18C so that the p-type region 10$p$ (including the portion 10$p$) is formed. In this case, the ions are implanted at an angle of 60° from the sidewall of the trench. The concentration of the implanted ions is, e.g., $1 \times 10^{20}$ $cm^{-3}$.

The Mo mask 32 is selectively removed by etching using $CF_4$. As shown in FIGS. 19A to 19D, n-type ions are implanted in the trench bottom portion without peeling the trench formation mask 31. With this process, a region serving as the second field relaxation layer 12 can selectively be formed at the trench formation portion. The impurity concentration of the n-type ions must be higher than at least that in the n-type epitaxial layer 10. In this case, the concentration is $1 \times 10^{17}$ $cm^{-3}$.

As shown in FIGS. 20A to 20D, after the trench formation mask 31 is peeled using a mixed solution of sulfuric acid and hydrogen peroxide, the resultant structure is rinsed with water. Trace metal impurities are removed by a mixed solution of hydrochloric acid and hydrogen peroxide, followed by water rinsing. Next, a silicon oxide film is formed on the surface of the n-type epitaxial layer 10 including the trench surface by chemical vapor deposition (CVD). Anisotropic etching is executed to leave sidewall silicon oxide films 19 on the trench sidewalls. At this time, the silicon oxide film 18 on the source region is also left. The thickness of the sidewall silicon oxide film 19 is 50 to 100 nm. A p-type impurity is ion-implanted to form the first field relaxation layer 11. The concentration of the implanted ions is preferably higher than that in the second field relaxation layer 12. In this case, the concentration is, e.g., $1 \times 10^{18}$ $cm^{-3}$. The p-type region serving as the first field relaxation layer 11 and the p-type region 10$p$ on the trench sidewall formed in the above-described oblique ion implantation step are connected. Since this ion implantation is done while covering the substrate surface (source region 6) with the silicon oxide film 18, the source region 6 maintains the $n^+$-type. In implanting the p-type ions in the trench bottom portion, the silicon oxide film 18 formed on the substrate surface and the silicon oxide film 19 formed on the sidewall of the trench serve as an ion implantation mask. For this reason, the p-type ions are selectively implanted in the trench bottom portion. When this step is used, the p-type ions can always be implanted in the region serving as the first field relaxation layer 11 formed on the bottom surface of the trench in a self-aligned manner.

After the p-type region serving as the first field relaxation layer 11 is formed, the sidewall silicon oxide film 19 is removed by, e.g., hydrofluoric acid. Although not illustrated, to form a drain region, n-type ions are implanted in the n-type SiC substrate 1 at a high dose to form an $n^{++}$-type layer serving as the drain region (FIG. 6). The implanted n-type ions are activated by activation annealing to form the drain region 3. The activation temperature is preferably 1,500° C. to 1,800° C. In this embodiment, activation is executed at 1,600° C. for 5 min.

After the drain region is formed, the entire SiC substrate 1 is oxidized to form a thermal oxide film on the surface. Examples of the oxidation method are wet oxidation and dry oxidation. A polysilicon film is buried in the trench. The polysilicon film is planarized by annealing. The polysilicon film excessively formed in the trench region is etched back to form the gate region 5 (FIGS. 21A to 21D). Although not illustrated, simultaneously with formation of the gate region 5, a region where the gate contact 13 is to be formed later is also formed by the polysilicon film.

If ion implantation is to be executed to change the conductivity type of polysilicon buried in the trench to the n-type or p-type, an n-type impurity (e.g., phosphorus or nitrogen) or p-type impurity (e.g., boron or aluminum) is ion-implanted after formation of the polysilicon film. Thermal diffusion is executed in an atmosphere containing $N_2$: $O_2$=10:1 at 1,050° C. for 20 min to diffuse the impurity in the entire polysilicon film. Oxygen in the atmosphere prevents the impurity from being eliminated from the surface by oxidizing the polysilicon surface during thermal diffusion.

Figure 22A:
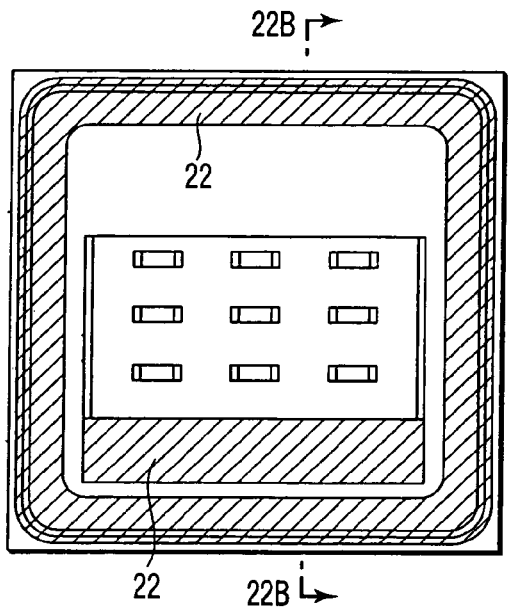
Figure 22B:
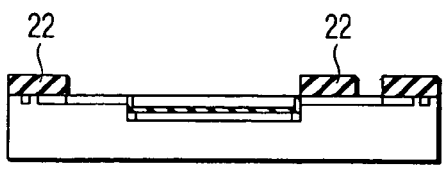

After thermal oxidation, a silicon oxide film 22 is formed by CVD. The silicon oxide film 22 is patterned such that the edge termination portion and gate pad portion remain. A portion except these is removed by hydrofluoric acid. FIG. 22B is a sectional view.

Figure 23A:
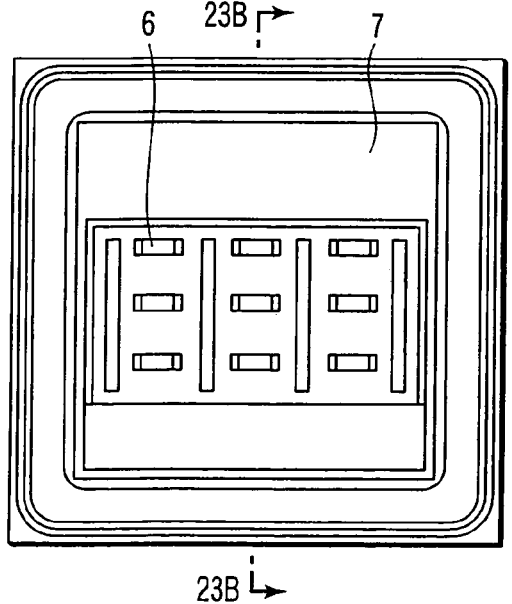
Figure 23B:
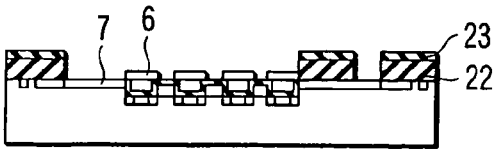

After the surface is thermally oxidized at about 1,150° C., the silicon oxide film 22 is formed by CVD. As shown in FIG. 23A, patterns serving as the source contact, gate contact, and source interconnection contact are formed by photolithography. Without removing the resist used in photolithography, an Ni film is formed on the entire surface of the n-type epitaxial layer 10 by E-gun deposition (electron gun deposition by a metal thin film forming apparatus) and left in only the opening portions by lift-off. After the Ni film is formed, annealing is executed in a sinter furnace in an Ar atmosphere at 1,000° C. for 5 min to bring the source region 6, gate region 5, and source interconnection contact p-type region 7 into ohmic-contact with the Ni film. Accordingly, the source contact (not shown), gate contact (not shown), and source interconnection contact (not shown) are formed.

When the source contact and source interconnection contact are connected to the source pad 16, and the gate contact is connected to the gate pad 15 by Ti/Al interconnections, the structure shown in FIGS. 5 and 6 is completed. With the above-described process, the first and second field relaxation layers 11 and 12 having an npn structure can be formed under the gate region 5 surrounded by the gate insulating film 8.

Figure 24:
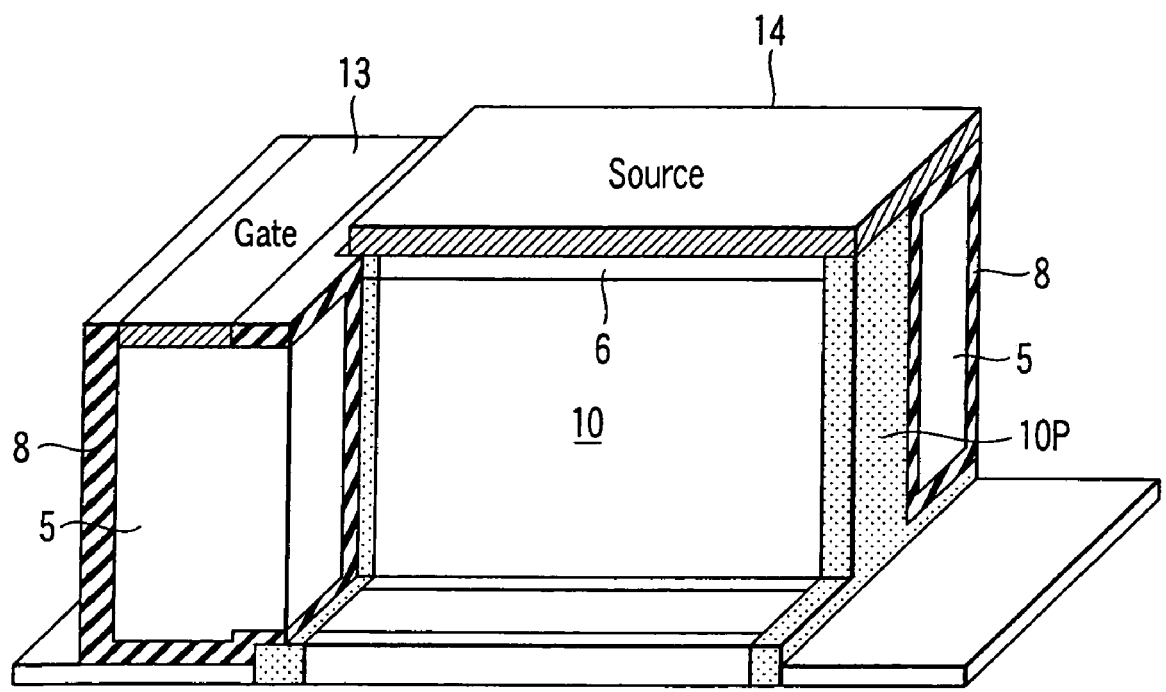
FIG. 24 is a partially cutaway perspective view showing the extraction conductive path from the first field relaxation layer to the source electrode in the semiconductor device according to the first embodiment.
Figure 25:
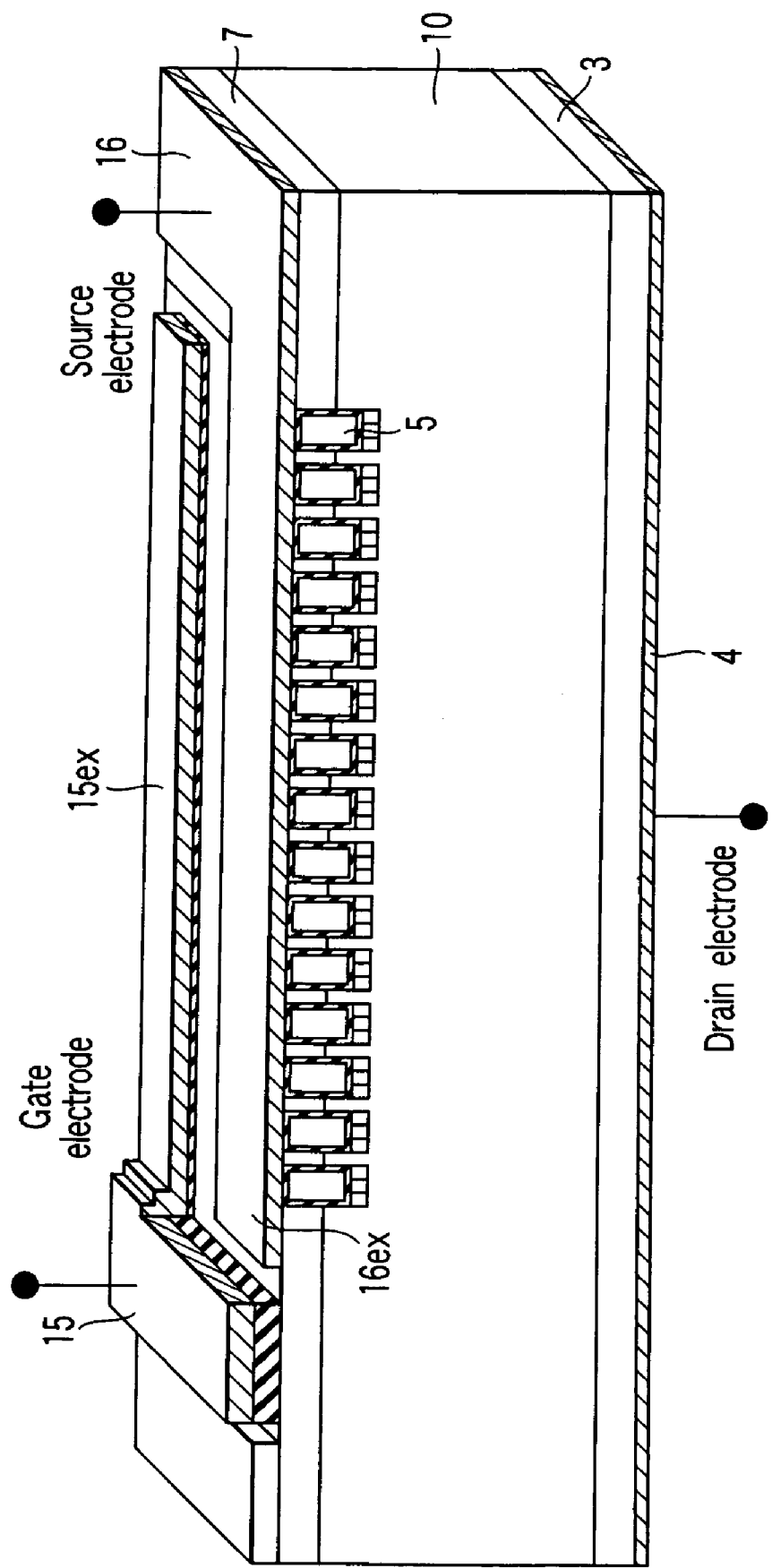
FIG. 25 is a partially cutaway perspective view of the semiconductor device according to the first embodiment.

As described with reference to FIGS. 17A to 17C, a p-type layer path (a semiconductor region) which connects the p-type layer of the first field relaxation layer 11 to the source contact 14 is formed. FIG. 24 is a partially cutaway perspective view showing the path. As is apparent from FIG. 24, the p-type layer 10p is formed which extends from under the gate region 5, where the first field relaxation layer 11 is formed, and is connected to the source contact 14 through the side surface of the epitaxial layer 10. FIG. 25 is a partially cutaway perspective view of the finished product described with reference to FIGS. 5 and 6.

In the above-described steps, the source region 6 is connected to the first and second field relaxation layers 11 and 12 by the oblique ion implantation step (FIG. 18C) of a p-type impurity. However, the present invention is not limited to this, and epitaxial growth may be used. In addition, they need not always be connected. If they are not to be connected, the trench formation step shown in FIG. 17C is unnecessary. The concentration in the n-type region of the second field relaxation layer needs to be higher than at least that in the epitaxial layer 10 (n⁻-type layer). The trench sidewall to form the gate region 5 needs to be a p-type layer after activation annealing. If the gate electrode 5 has a trench gate structure, as in this embodiment, the material to be buried in the trench may be p-type polysilicon, n-type polysilicon, or a metal. A p-type region may be formed in the drain region to form a bipolar transistor.

Some modifications of the method of extracting the first field relaxation layer 11 to the source contact 14 will be described next.

(First Modification)

As indicated by a portion A in FIG. 26, a via hole is formed at a part of the gate insulating film 8 formed on the bottom portion of the trench to bring the first field relaxation layer 11 (p-type region) into contact with the gate region 5 (polysilicon buried in the trench region). The polysilicon in the gate region 5 is only buried in the trench portion and is not extracted to the gate contact 13, as indicated by a portion B. Polysilicon buried in a trench region without any via hole is extracted to the gate contact 13, as indicated by a portion C.

As shown in FIG. 27, an insulator 41 is formed. Then, a source contact hole 45 which comes into contact with the source extraction electrode 16ex is formed in the polysilicon buried in the trench region in contact with the first field relaxation layer 11 (p-type region). In addition, a gate contact hole 43 is formed in the polysilicon portion extracted onto the gate line insulating film 8.

Figure 28:
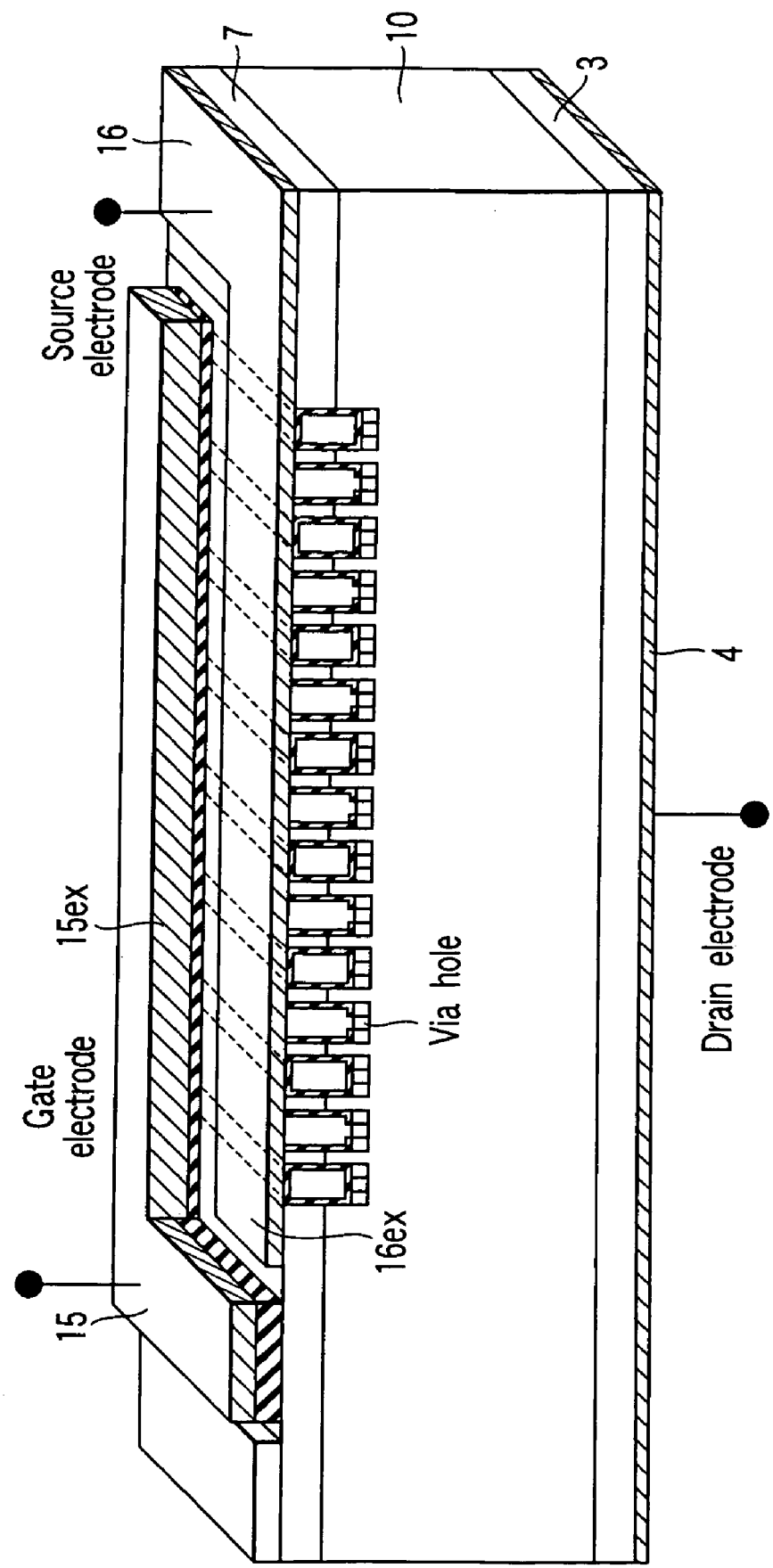

As shown in FIG. 28, the source pad 16, source extraction electrode 16ex, gate pad 15, and gate extraction electrode 15ex are formed. Accordingly, the polysilicon extracted to the gate contact 13 is connected to the gate extraction electrode 15ex through a gate connection 47. The polysilicon buried in the trench region, which is in contact with the first field relaxation layer 11 (p-type region) is connected to the source extraction electrode 16ex.

With this structure, holes discharged from the first field relaxation layer 11 (p-type region) flow to the source pad 16 through the trench-region-buried polysilicon region (gate region) 5.

Figure 20A:
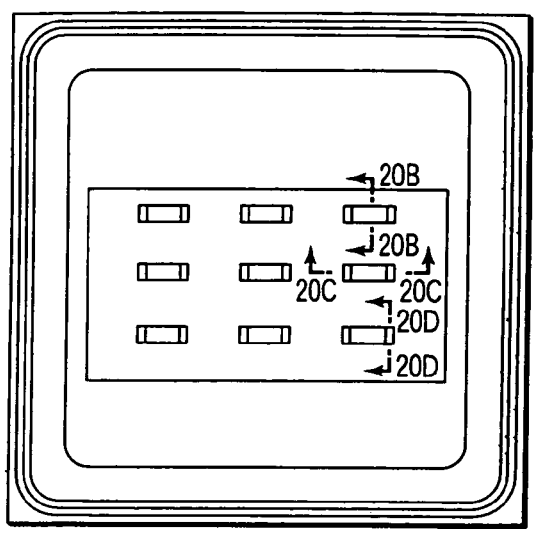
Figure 20B:
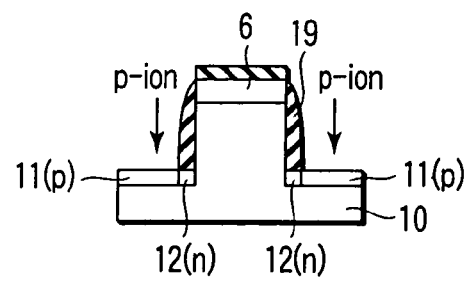
Figure 20C:
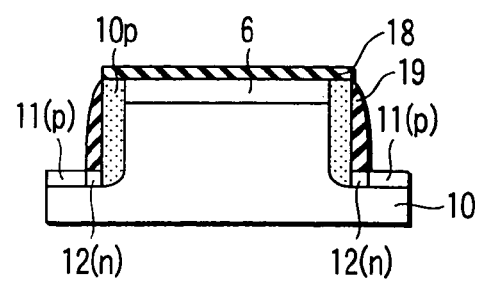
Figure 19D:
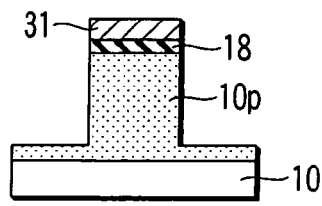
Figure 20D:
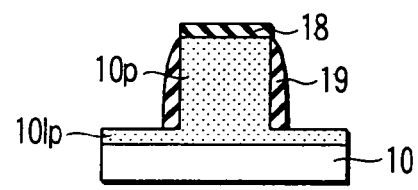
Figure 21B:
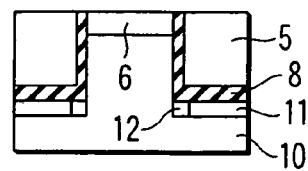
Figure 21C:
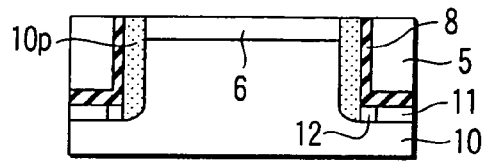
Figure 21A:
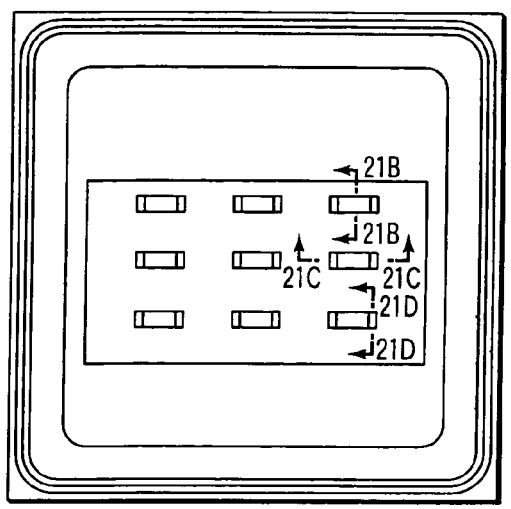
Figure 21D:
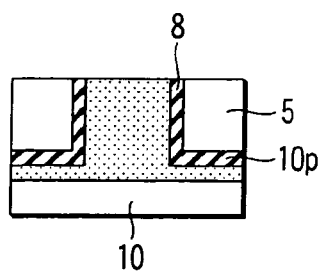

As is apparent from FIG. 20C, the first field relaxation layers 11 (p-type regions) are electrically connected to each other through the p-type ion-implanted region 10p. Hence, holes discharged from the first field relaxation layer 11 (p-type region) under the trench gate without any via hole also flow to the source pad 16 through the trench-region-buried polysilicon region (gate region 5).

In the first modification, trench-region-buried polysilicon regions serving as the gate regions 5 and trench-region-buried polysilicon regions which do not serve as the gate regions 5 are alternately arranged. However, they need not always be alternated. It is only necessary that at least one trench region has a via hole on its bottom to electrically connect the first field relaxation layer 11 (p-type region) to the source electrode, and the trench-region-buried polysilicon connects the first field relaxation layer 11 (p-type region) to the source pad 16.

(Second Modification)

Figure 29:
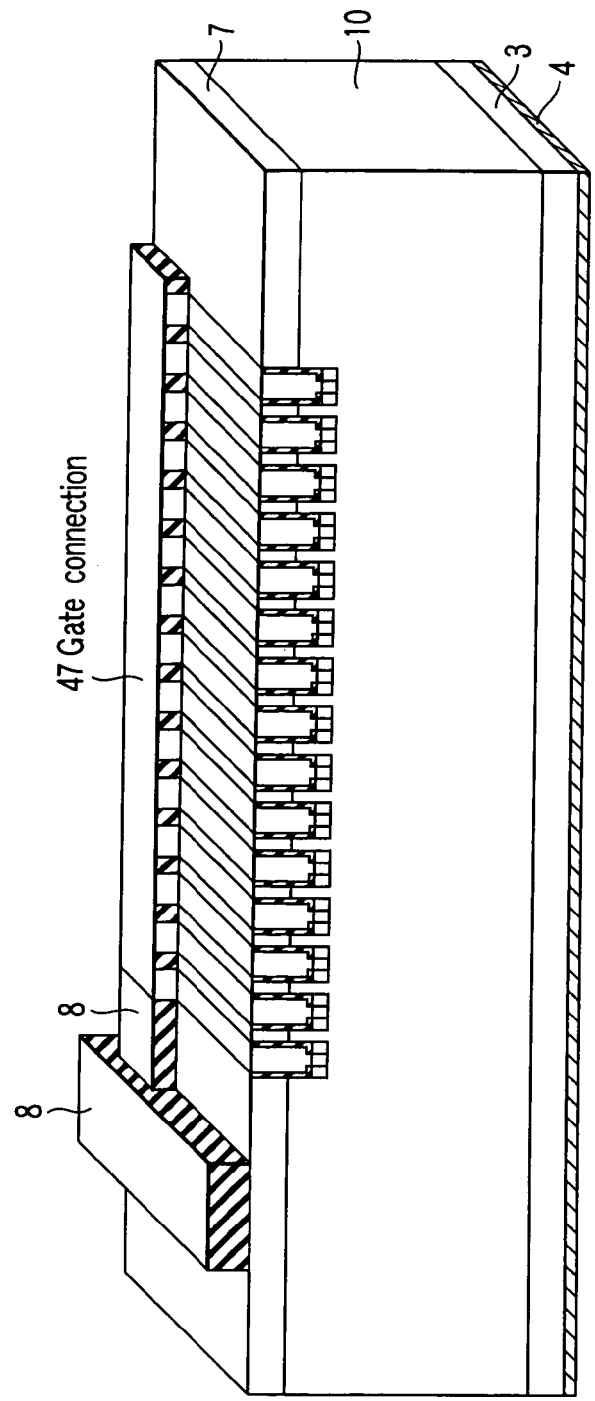
Figure 30:
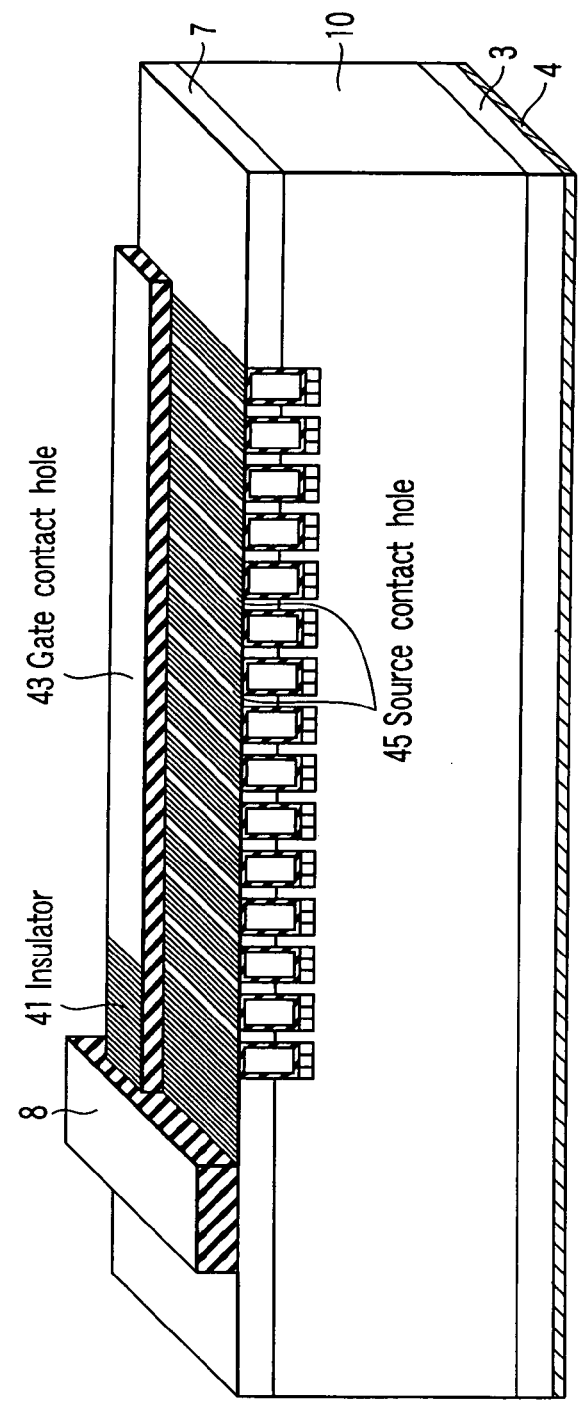

The first field relaxation layer 11 may be extracted in the following way. As shown in FIG. 29, polysilicon buried in the trench is extracted above the gate line insulating film 8 through the gate connection 47. Next, as shown in FIG. 30, the polysilicon surface is oxidized. Then, the CVD oxide film 41 is formed. The oxide film 41 on the gate connection 47 is etched to form the gate contact hole 43. Simultaneously, the oxide film 41 on the source region 6 is etched to form the source contact hole 45.

As shown in FIG. 31, the gate connection 47 is brought into contact with the gate extraction electrode 15ex through the gate contact hole 43. The source region 6 is brought into contact with the source extraction electrode 16ex through the source contact hole 45.

(Third Modification)

A third modification provides an arrangement capable of making holes discharged from the first field relaxation layer 11 flow to the source pad 16 more easily than the first embodiment which performs oblique ion implantation or the first modification which forms via holes.

First, the n-type SiC substrate 1 on which the n-type epitaxial layer 10 having an impurity concentration of $5 \times 10^{15}$ cm$^{-3}$ and a thickness of about 10 μm is formed is prepared. The resistivity of the n-type SiC substrate 1 is, e.g., 0.02 Ωcm.

Figure 32A:
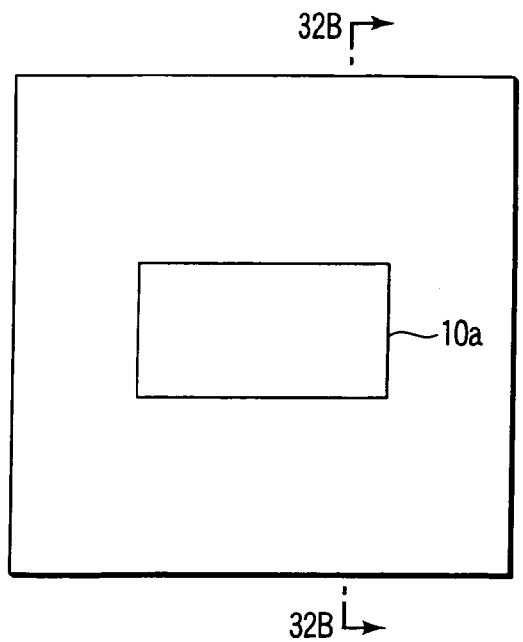
FIGS. 32A to 43C are views showing steps in manufacturing the third modification of the extraction conductive path.
Figure 32B:
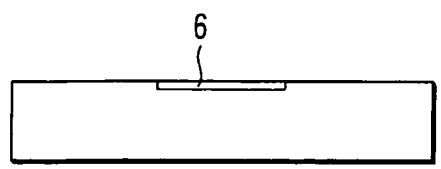

As shown in FIGS. 32A and 32B, P (phosphorus) ions are implanted in the active region 10a at about $1 \times 10^{18}$ cm$^{-3}$ to $5 \times 10^{20}$ cm$^{-3}$ to form an impurity region serving as the source region 6 (source contact n-type layer) having a thickness of about 0.6 μm and a surface concentration of, e.g., $1 \times 10^{19}$ cm$^{-3}$. P ions are used here. However, the present invention is not limited to this. For example, N (nitrogen) ions may be used.

Figure 33A:
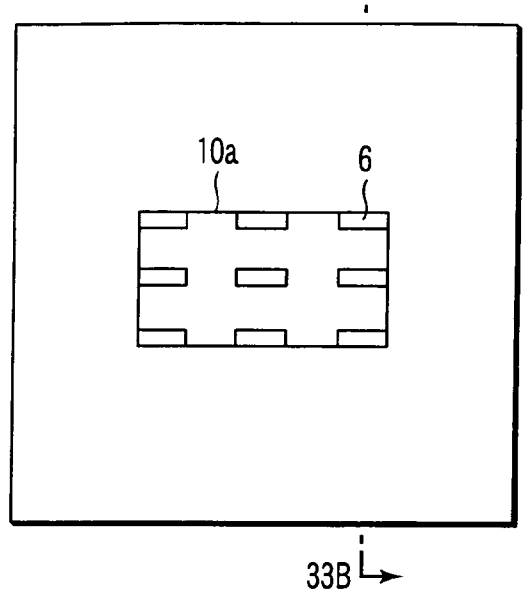
Figure 33B:
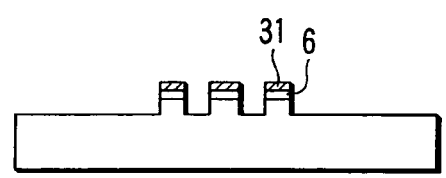

Before the edge termination structures 21a and 21b shown in FIG. 14B and the source interconnection contact p-type region 7 shown in FIG. 15 are formed, the silicon oxide film 18 (not shown) is formed, and a metal mask (trench formation mask 31 of Al) is selectively formed on the silicon oxide film 18 in the active region. The trench formation mask 31 is patterned by Al etching by chlorine-based RIE. As shown in FIGS. 33A and 33B, the n-type epitaxial layer 10 is etched to almost the depth of the trench gate in accordance with the pattern along the trench formation mask 31 by SiC dry etching using $CF_4$ gas. The depth of the trench is, e.g., 0.5 to 5 µm. The width of the trench is, e.g., 0.5 to 5 µm. A portion remaining after etching serves as a source contact region. For the trench formation mask 31, the above-described material can be used. An unetched portion (remaining portion) under the source region 6 in this etching step serves as a channel region.

Figure 34A:
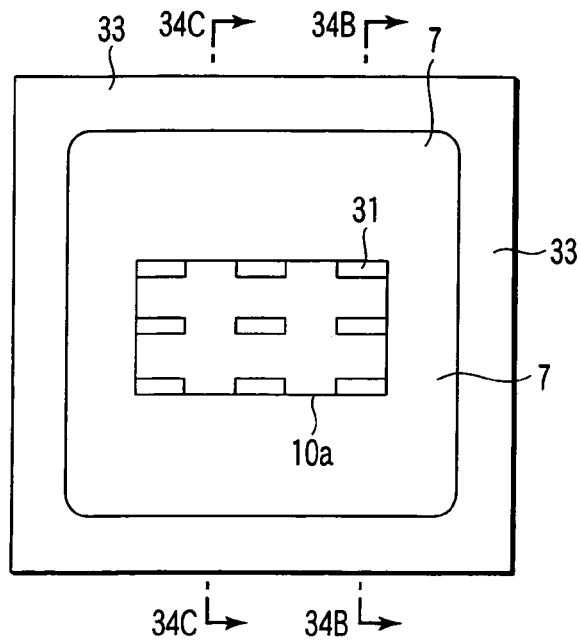
Figure 34B:
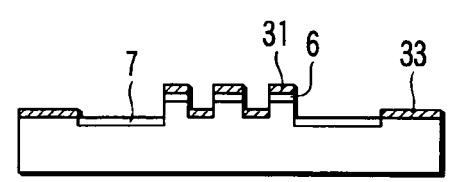
Figure 34C:
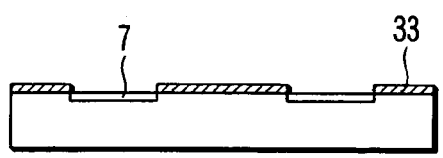

After that, a metal mask 33 is formed again. As shown in FIGS. 34A to 34C, the source interconnection contact p-type region 7 is formed outside the active region by ion implantation.

Figure 35A:
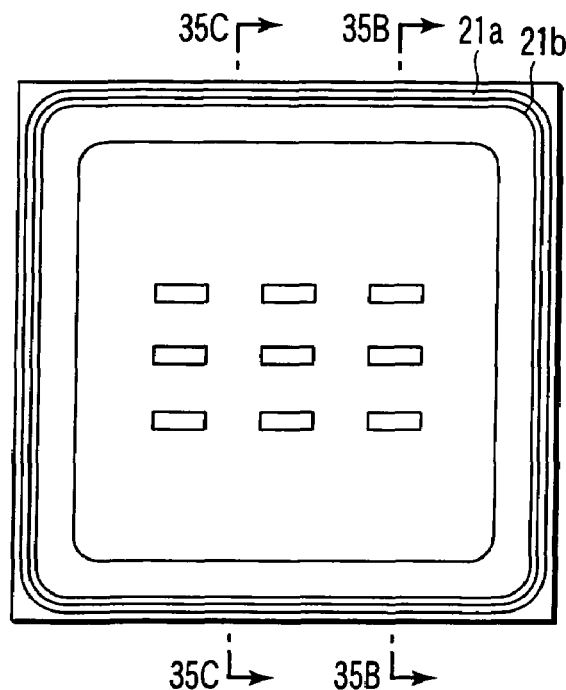
Figure 35B:
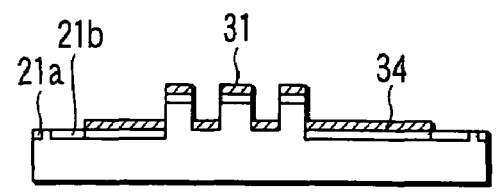
Figure 35C:
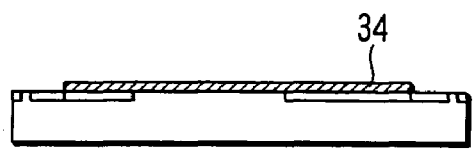

A metal mask 34 is formed again. As shown in FIGS. 35A to 35C, the metal mask is patterned, and the edge termination regions 21a and 21b are formed outside the source interconnection contact p-type region 7 by ion implantation. The impurity concentration in the source interconnection contact p-type region 7 is preferably higher than the n-type impurity concentration in the second field relaxation layer 12 to be formed later.

Figure 36A:
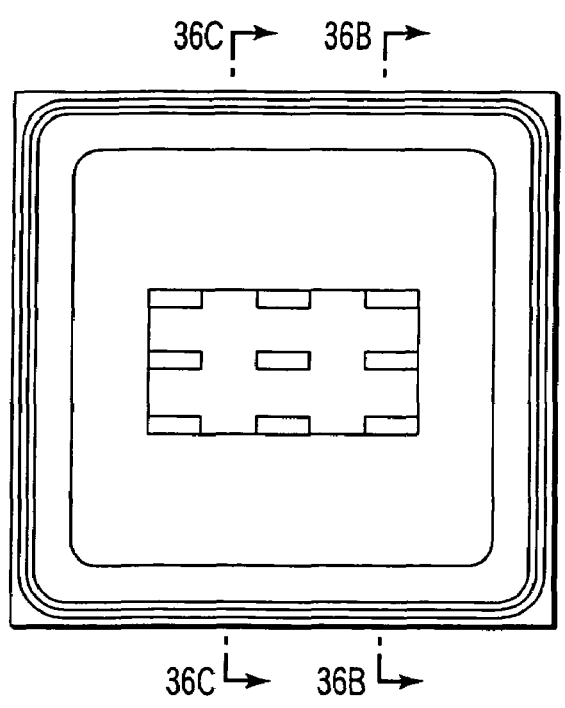
Figure 36B:
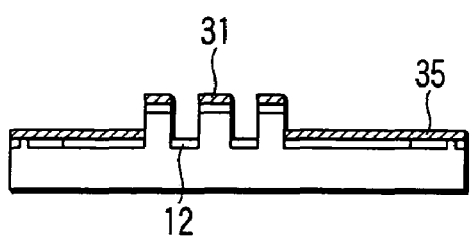
Figure 36C:
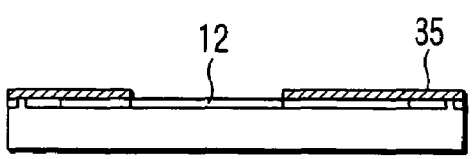

As shown in FIGS. 36A to 36C, a metal mask 35 is formed in the source interconnection contact p-type region 7 and edge termination regions 21a and 21b without peeling the trench formation mask 31. Then, n-type ions are implanted in the trench bottom portion in the active region 10a. With this process, a region serving as the n-type second field relaxation layer 12 can selectively be formed in the trench formation portion. The impurity concentration of n-type ions must be higher than at least the impurity concentration in the n-type epitaxial layer 10. In this case, the impurity concentration is $1 \times 10^{17}$ cm$^{-3}$.

Figure 37A:
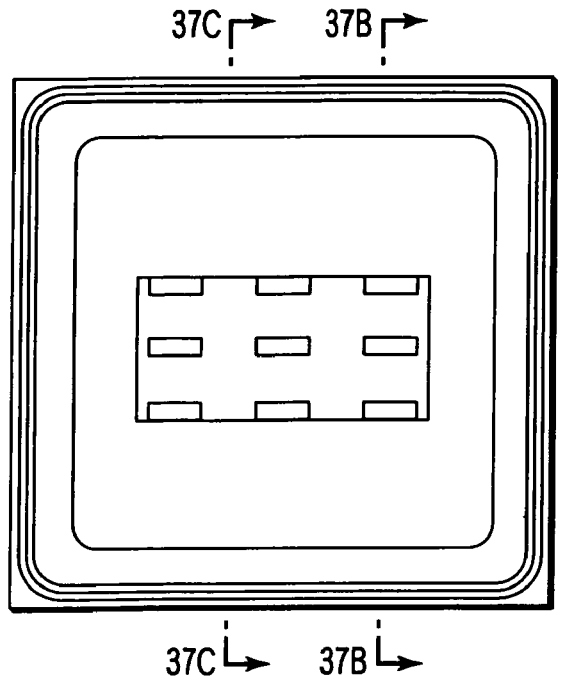
Figure 37B:
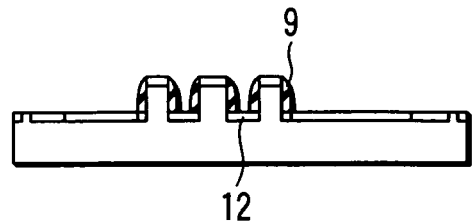
Figure 37C:
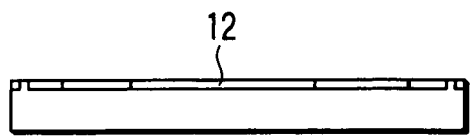

As shown in FIGS. 37A to 37C, after the trench formation mask 31 and metal mask 35 are peeled, an Si oxide film is formed on the surface of the n-type epitaxial layer 10 including the trench surface by CVD. Anisotropic etching is executed to leave an Si oxide film 9 on the trench side surfaces. The thickness of the Si oxide film 9 is 50 to 100 nm.

Figure 38A:
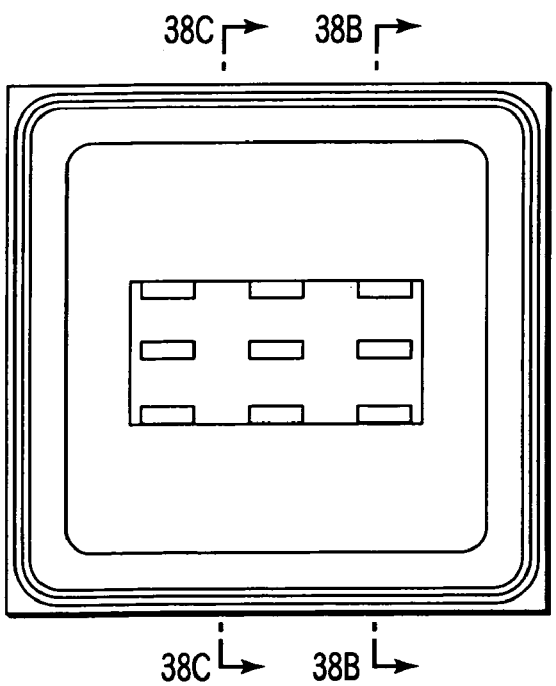
Figure 38B:
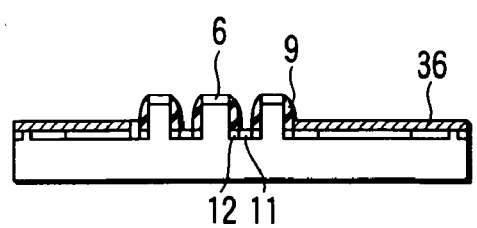
Figure 38C:
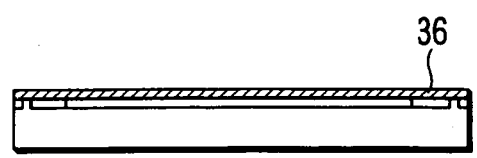

A metal mask 36 is formed in the source interconnection contact p-type region 7 and edge termination regions 21a and 21b. A p-type impurity is ion-implanted to form the p-type first field relaxation layer 11, as shown in FIGS. 38A to 38C. The concentration of the implanted ions is preferably lower than that in the region serving as the source region 6 and higher than that in the second field relaxation layer 12. In this case, the concentration is, e.g., $1 \times 10^{18}$ cm$^{-3}$.

Since the surface of the source region 6 is covered with the silicon oxide film 18 during ion implantation, the source region 6 maintains the n-type. In implanting the p-type ions in the trench bottom portion, the Si oxide film 9 formed on the trench side surface serves as an ion implantation mask. For this reason, the p-type ions are selectively implanted in the trench bottom portion. When this step is used, the p-type ions can always be implanted in center of the region serving as the second field relaxation layer 12 (n-type) formed on the bottom surface of the trench in a self-aligned manner. Accordingly, a field relaxation layer having an npn structure is formed.

With this process, the p-type region of the first field relaxation layer 11 is electrically connected to the source interconnection contact p-type region 7 formed before through the p-type ion implantation. Hence, the oblique ion implantation step of the first embodiment can be omitted.

After the p-type region is formed, the native oxide film is removed by hydrofluoric acid. Then, n-type ions are implanted in the lower surface of the n-type SiC substrate 1 at a high dose (not shown). The implanted n-type ions are activated by activation annealing to form an n-type region serving as the drain region (not shown). The activation temperature is preferably 1,500° C. to 1,800° C. In this embodiment, activation is executed at 1,600° C. for 5 min.

Figure 39A:
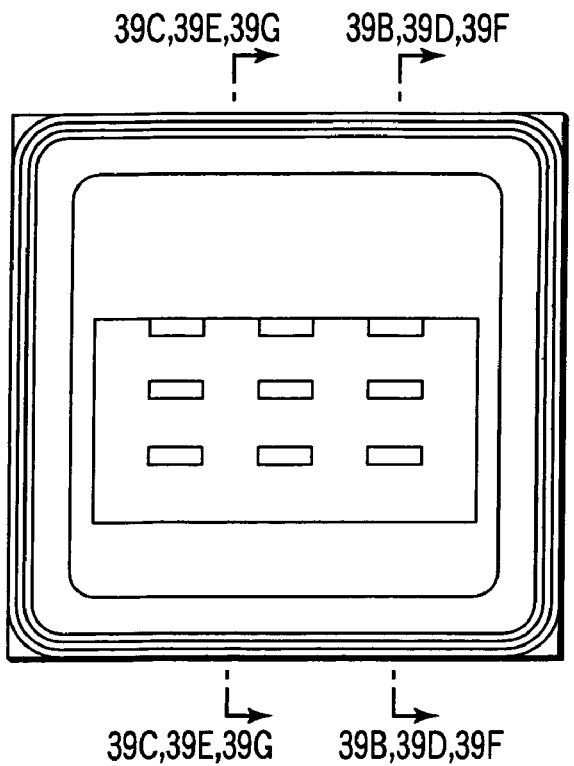
Figure 39B:
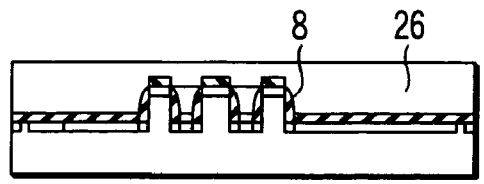
Figure 39C:
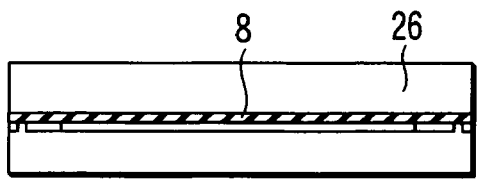
Figure 39D:
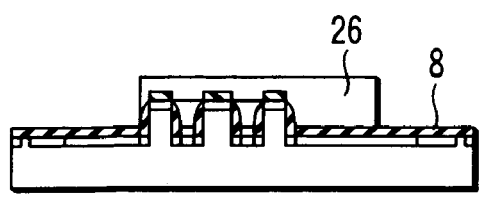
Figure 39E:
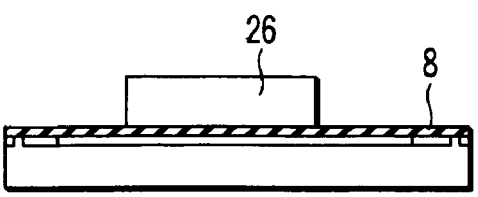
Figure 39F:
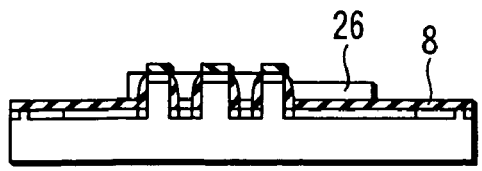
Figure 39G:
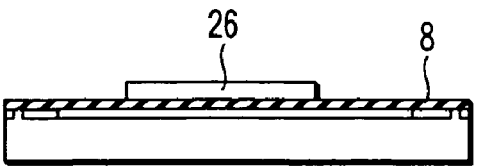

After the drain region is formed, the SiC substrate 1 is oxidized to form a thermal oxide film on the surface. Examples of the oxidation method are wet oxidation and dry oxidation. An oxide film is formed on the substrate surface. Of the oxide film, a portion in contact with the trench sidewall and bottom portion serves as the gate oxide film 8. As shown in FIGS. 39A to 39C, the trench is filled with polysilicon to form a gate pad region. Then, a polysilicon film 26 is planarized if necessary by etching back or impurity-diffusing annealing. As shown in FIGS. 39D and 39E, the polysilicon film 26 outside the trench region and gate pad is removed. As shown in FIGS. 39F and 39G, the polysilicon film 26 excessively formed in the trench region and gate pad is etched back.

If ion implantation is to be executed to change the conductivity type of polysilicon buried in the trench to the n-type or p-type, an n-type impurity (e.g., phosphorus or nitrogen) or p-type impurity (e.g., B or Al) is ion-implanted after formation of the polysilicon film. Thermal diffusion is executed in an atmosphere containing N: $O_2=10:1$ at 1,050° C. for 20 min to diffuse the impurity in the entire polysilicon film 26. Oxygen used in the atmosphere prevents the impurity from being eliminated from the surface by oxidizing the polysilicon surface during thermal diffusion.

Figure 40A:
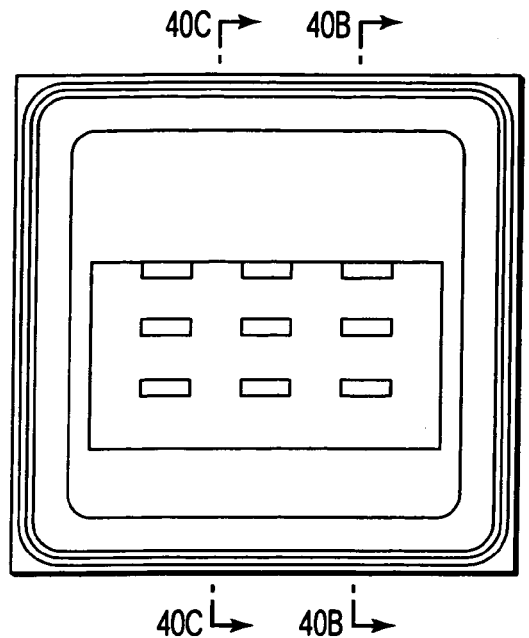
Figure 40B:
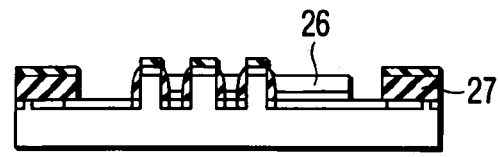
Figure 40C:
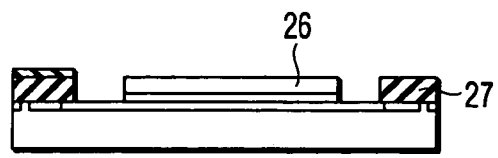

After thermal oxidation, an Si oxide film 27 is formed by CVD. The Si oxide film 27 is patterned such that the edge termination portion remains. As shown in FIGS. 40A to 40C, a portion except this is removed by hydrofluoric acid.

Figure 41A:
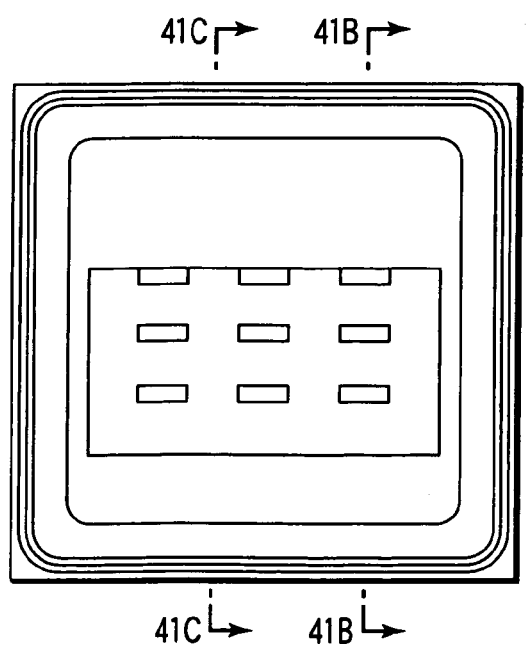
Figure 41B:
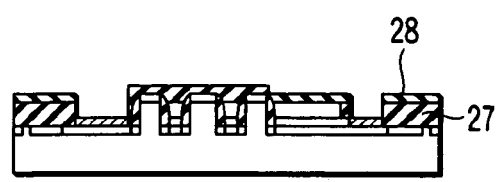
Figure 41C:
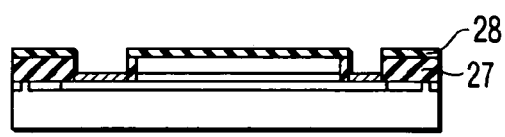
Figure 42A:
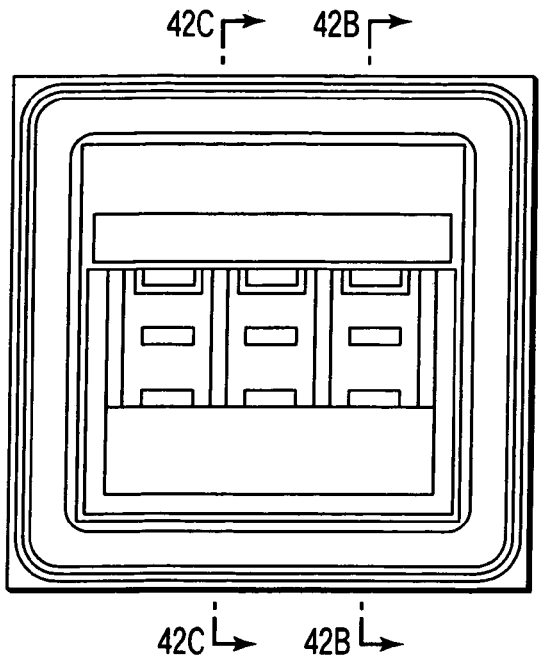
Figure 42B:
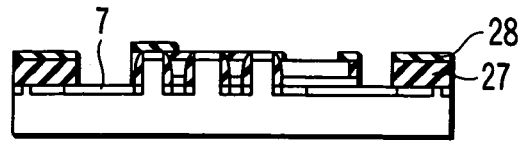
Figure 42C:
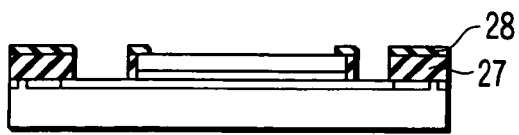

As shown in FIGS. 41A to 41C, the surface is thermally oxidized at about 1,150° C., an Si oxide film 28 is formed by CVD. As shown in FIGS. 42A to 42C, patterns serving as the source contact 14, gate contact 13, and source interconnection contact p-type region 7 are formed by photolithography.

Of the gate regions which sandwich the source contact region closest to the source pad, no trench gate is present on the source pad side. Pinch-off of the channel portion is difficult independently of the bias applied to the gate. For this reason, no contact hole is preferably formed at the portion closest to the source pad 16 in the source contact 14.

Figure 43A:
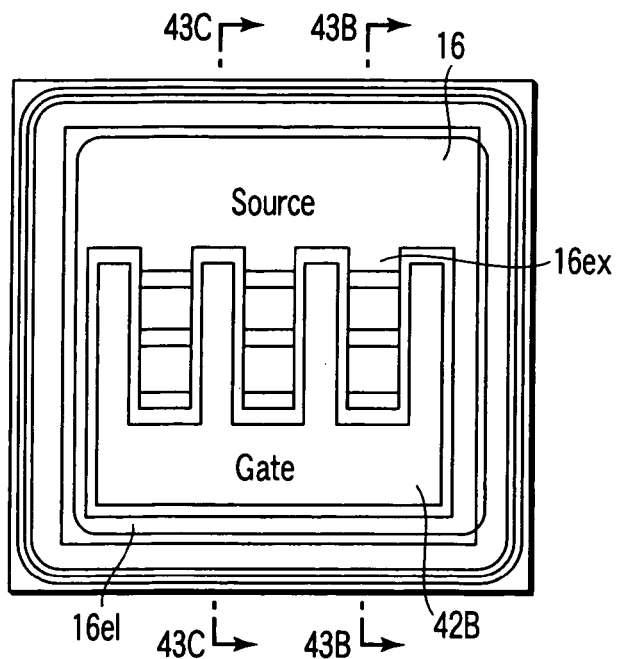
Figure 43B:
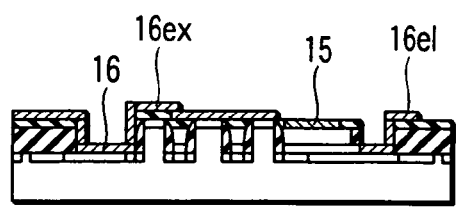
Figure 43C:
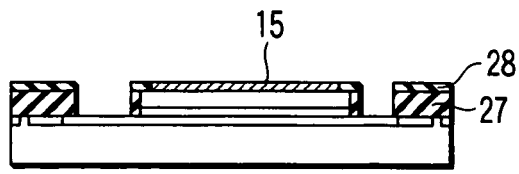

Without removing the resist used in photolithography, an Ni film is formed on the entire surface of the n-type epitaxial layer 10 by E-gun deposition (electron gun deposition by a metal thin film forming apparatus) and left in only the opening portions by lift-off. After the Ni film is formed, annealing is executed in a sinter furnace in an Ar atmosphere at 1,000° C. for 5 min to bring the source region 6 and gate region 5 into ohmic-contact with the Ni film. Accordingly, the source contact (not shown), gate contact (not shown), and source interconnection contact (not shown) are formed. When the source contact and source interconnection contact are connected to the source pad 16, and the gate contact is connected to the gate pad 15 by Ti/Al interconnections, as shown in FIGS. 43A to 43C, the same structure as shown in FIG. 5 is completed.

With the above-described process, the first and second field relaxation layers 11 and 12 having an npn structure can be formed under the gate electrode 5 surrounded by the gate insulating film 8. Accordingly, holes discharged from the p-type layer of the first field relaxation layer 11 can more easily flow to the source electrode without the above-described oblique ion implantation of the first embodiment or via hole formation of the first modification.

Before the edge termination structure and source interconnection contact p-type region 7 shown in FIGS. 35A to 35C are formed, the edge termination structure region and source interconnection contact p-type region 7 are etched to almost the depth of the trench gate. Then, the edge termination structure and source interconnection contact p-type region 7 are formed by ion implantation. These regions need not always be etched to the desired depth. The edge termination structure and source interconnection contact p-type region 7 may be formed by executing ion implantation to the desired depth.

Second Embodiment

FIG. 44 is a schematic sectional view showing a pair of gate regions of a semiconductor device according to a second embodiment of the present invention. The structure under an epitaxial layer 10 is not illustrated. The second embodiment is different from the first embodiment in that no gate insulating film 8 is formed on the bottom of a gate region 5, and a p-type region 25 is formed instead. A first field relaxation layer 11 is separated from the p-type region 25. The remaining parts are the same as in the first embodiment, and a description thereof will be omitted.

According to the second embodiment, the width of a depletion layer which extends from the p-type region 25 upon applying a negative bias to the gate region 5 is not limited to the thickness of the oxide film, unlike the depletion layer described in the first embodiment, which extends through the oxide film. For this reason, the breakdown voltage increases. When the element recovers to the power supply voltage when off, the depletion layer in the epitaxial layer 10 extends from the first field relaxation layer 11. Accordingly, no holes are discharged from the p-type gate region 5 so that the gate current can be suppressed.

Even in the second embodiment, the first and second field relaxation layers 11 and 12 need not always be connected to a source region 6, as in the first embodiment.

Third Embodiment

FIG. 45 is a schematic sectional view showing a pair of gate regions of a semiconductor device according to a third embodiment of the present invention. The structure under an epitaxial layer 10 is not illustrated. The third embodiment is different from the second embodiment in the following point. In the second embodiment, the p-type region 25 is formed on only the bottom surface of the gate region 5. In the third embodiment, a p-type region 25' is formed not only on the bottom surface of a gate region 5 but also on the side surface of the gate electrode 5. That is, no gate insulating film 8 is formed on any surface of the gate region 5. The remaining parts are the same as in the first embodiment, and a description thereof will be omitted. As the area of the p-type region 25' is larger, the breakdown voltage of the semiconductor device according to the third embodiment is higher than that of the semiconductor device according to the second embodiment.

In this embodiment as well, first and second field relaxation layers 11 and 12 need not always be connected to a source region 6, as in the second embodiment.

Fourth Embodiment

Figure 46:
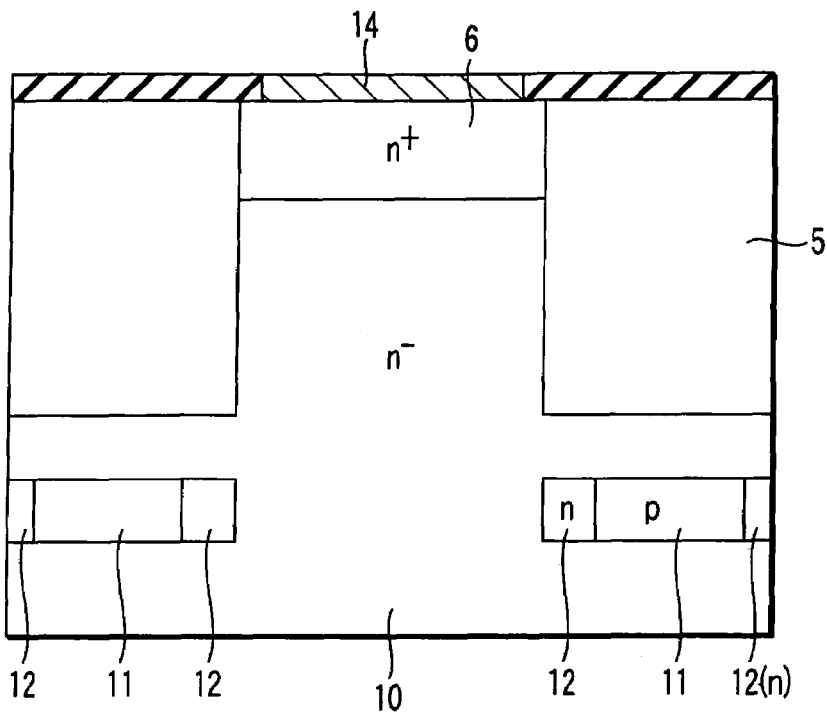
FIG. 46 is a sectional view of a semiconductor device according to a fourth embodiment.

FIG. 46 is a schematic sectional view showing a pair of gate regions of a semiconductor device according to a fourth embodiment of the present invention. In the first to third embodiments, the gate region 5 is made of polysilicon containing an impurity. The fourth embodiment is different from the above-described embodiments in that a gate region 5' is an impurity region formed by ion implantation. In the structure of the fourth embodiment, no trench is formed. A lightly-doped n-type layer 10 is epitaxially grown on an n-type SiC substrate in which a field relaxation layer is formed in advance. The gate region 5 and a source region 6 are formed in the surface of the layer, thereby forming a transistor. For this reason, the step of forming a trench including lithography can be omitted.

In this embodiment as well, first and second field relaxation layers 11 and 12 need not always be connected to a source region 6, as in the second embodiment.

Fifth Embodiment

Figure 47:
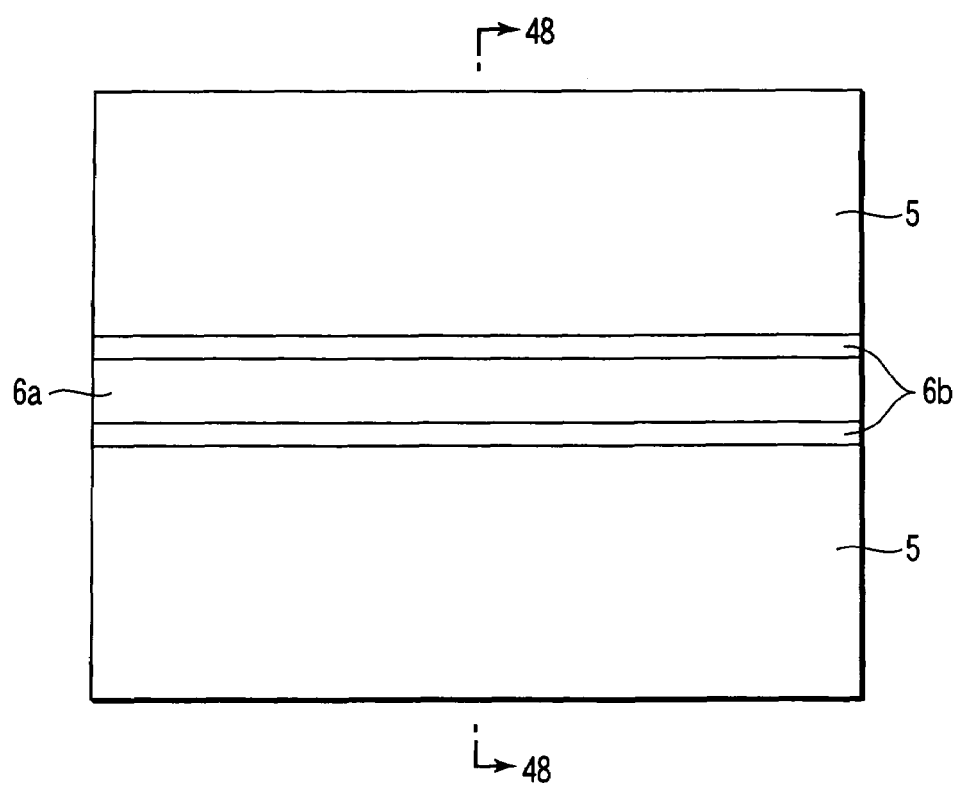
FIG. 47 is a plan view of a semiconductor device according to a fifth embodiment.
Figure 48:
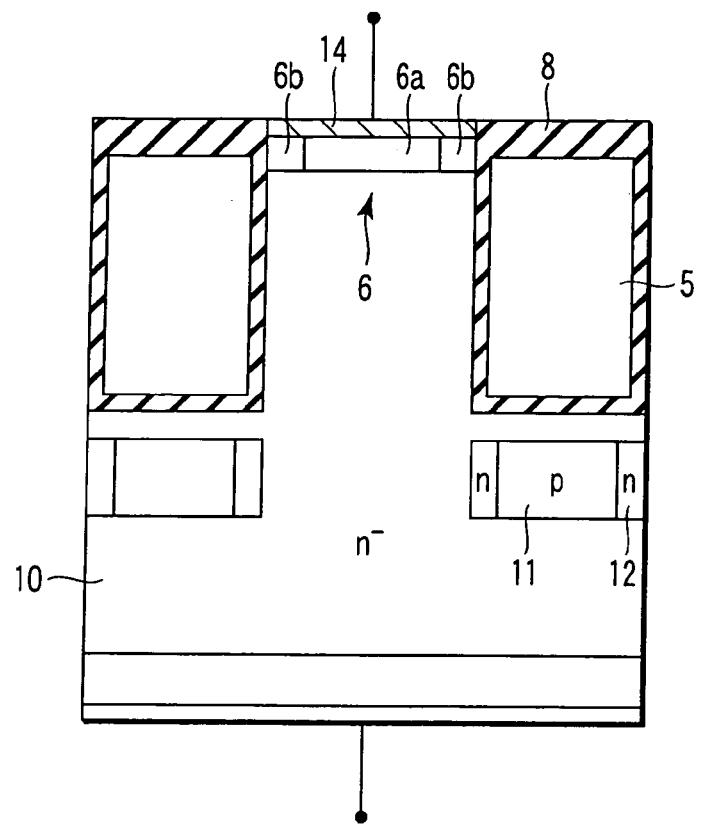
FIG. 48 is a sectional view of the semiconductor device according to the fifth embodiment.

FIG. 47 is a plan view of a semiconductor device according to a fifth embodiment of the present invention. FIG. 48 is a sectional view taken along a line 48-48 in FIG. 47. The fifth embodiment is different from the first embodiment in the positional relationship between a gate region 5 and first and second field relaxation layers 11 and 12 and the structure of a source region 6.

As for the positional relationship between the first field relaxation layer 11 and a gate insulating film 8, the first field relaxation layer 11 needs to be in contact with the gate insulating film 8. If they are separated, at least a region which changes to a p-type layer as an inversion layer when a negative bias is applied to the gate region 5 and the p-type region of the first field relaxation layer 11 must be in contact with each other. As for the positional relationship between the second field relaxation layer 12 and the gate insulating film 8, the second field relaxation layer 12 needs to be separated from the gate insulating film 8. If they are in contact, the interface of the gate insulating film 8 and an n-type layer near the gate insulating film 8 need to change to the p conductivity type when a negative bias is applied to the gate region 5.

If the n-type region which is inverted to the p conductivity type upon applying a negative bias to the gate region 5 is to be formed, and the semiconductor material is SiC, the concentration in the interface of the gate insulating film 8 and the n-type region near the gate insulating film 8 is preferably $5 \times 10^{17}$ cm$^{-3}$ or less.

Of the source region 6, a portion 6b which is in contact with the gate insulating film 8 must be a p-type region or an n-type region which is inverted to the p conductivity type upon applying a negative bias to the gate region 5. If an n-type region to be inverted to the p conductivity type is to be formed, and the semiconductor material is SiC, the concentration in the interface of the gate insulating film 8 and the n-type region near the gate insulating film 8 is preferably $5 \times 10^{17}$ cm$^{-3}$ or less. A central portion 6a of the source region 6 has the n conductivity type.

In this embodiment, that the source region 6b has the p conductivity type indicates that the source region 6b has the 2 conductivity type when a negative bias is applied to the gate region 5. When no bias is applied to the gate region 5, the source region need not always have the p conductivity type. FIGS. 49A to 49D show examples of this structure.

Figures 49A, 49B, 49C, 49D:
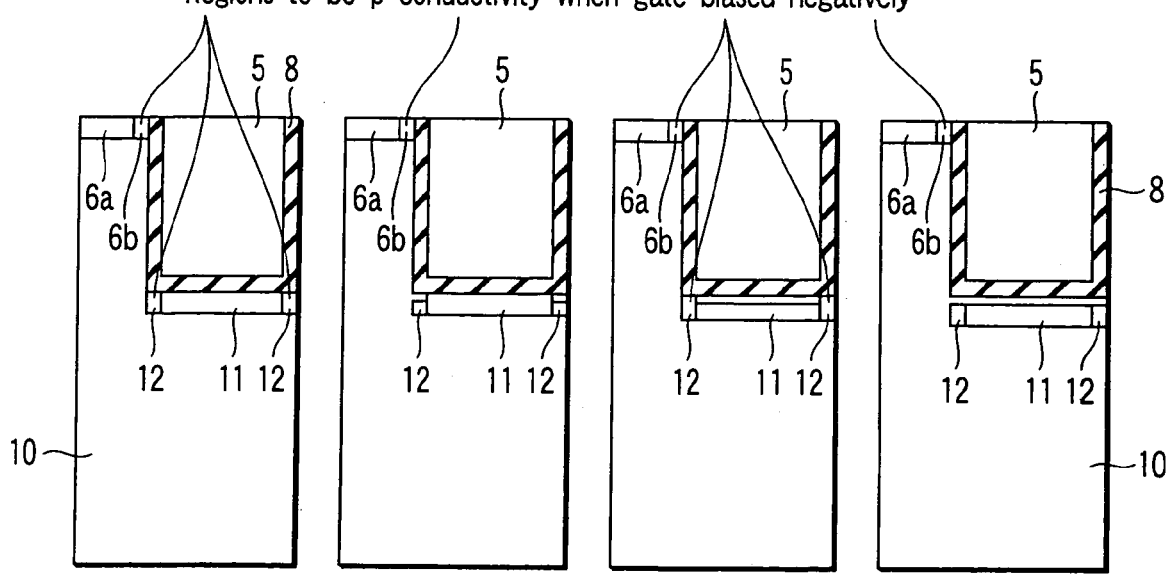
FIGS. 49A to 49D are views showing variations of formation of the extraction conductive path from the first field relaxation layer to the source electrode in the fifth embodiment.

FIG. 49A shows a case in which both the first field relaxation layer 11 (p-type region) and the second field relaxation layer 12 (n-type region) are in contact with the gate insulating film 8. In this case, the concentration in the interface of the gate insulating film 8 and the n-type field relaxation layer near the gate insulating film 8 is preferably $5 \times 10^{17}$ cm$^{-3}$ or less.

FIG. 49B shows a case in which only the first field relaxation layer 11 (p-type region) is in contact with the gate insulating film 8. FIG. 49C shows a case in which only the second field relaxation layer 12 (n-type region) is in contact with the gate insulating film 8. In these cases, the concentration in the interface of the gate insulating film 8 and the n-type field relaxation layer near the gate insulating film 8 is preferably $5 \times 10^{17}$ cm$^{-3}$ or less. In addition, at least the region which changes to a p-type layer as an inversion layer when a negative bias is applied to the gate region 5 and the first field relaxation layer 11 (p-type region) preferably come into contact with each other.

FIG. 49D shows a case in which both the first field relaxation layer 11 (p-type region) and the second field relaxation layer 12 (n-type region) are separated from the gate insulating film 8. In this case, at least the region which changes to a p-type layer as an inversion layer when a negative bias is applied to the gate and the first field relaxation layer 11 (p-type region) preferably come into contact with each other.

The operation of the semiconductor device according to this embodiment will be described with reference to FIGS. 50A and 50B and 51A to 51D. FIG. 50A is a conceptual diagram showing a state in which a negative bias is applied to the gate region 5 of the semiconductor device of this embodiment with the structure shown in FIG. 49A, the conductivity type of the interface of the gate insulating film 8 is inverted to form an inversion layer 2, and the first field relaxation layer 11 is electrically connected to the end portion 6b (p-type region) of the source region 6 through the p-type inversion layer 2. FIG. 50B is a conceptual diagram showing charge movement when the semiconductor device having the structure shown in FIG. 49A is turned off. To turn off the device, a negative bias is applied to the gate region 5. At this time, the inversion layer 2 is formed in the interface between the gate insulating film 8 and the n-type epitaxial layer 10. In addition, the inversion layer 2 is formed in the interface between the second field relaxation layer 12 (n-type region) and the gate insulating film 8 and near the gate insulating film 8. The first field relaxation layer 11 is connected to the p-type region 6b in the source region 6 through the inversion layer. Even when the depletion layer extends, and holes are generated in the first field relaxation layer 11, the holes can flow to the source region 6b, and the turn-off speed can also be increased.

To turn off the semiconductor device of this embodiment with the structure shown in FIG. 49B, a negative bias is applied to the gate region 5. At this time, the inversion layer 2 is formed in the interface between the gate insulating film 8 and the n-type epitaxial layer 10. The first field relaxation layer 11 is connected to the p-type region 6b in the source region 6 through the inversion layer 2. Even when the depletion layer extends, and holes are generated in the first field relaxation layer 11, the holes can flow to the source region 6b, and the turn-off speed can also be increased. The conceptual diagram representing this state is the same as in FIG. 50A. Charge movement when the semiconductor device is turned off is represented by the same conceptual diagram as FIG. 50B.

To turn off the semiconductor device of this embodiment with the structure shown in FIG. 49C, a negative bias is applied to the gate region 5. At this time, the inversion layer 2 is formed in the interface between the gate insulating film 8 and the n-type epitaxial layer 10. In addition, the inversion layer 2 is formed in the interface between the second field relaxation layer 12 (n-type region) and the gate insulating film 8 and near the gate insulating film 8. Furthermore, the inversion layer is also formed in the n-type region between the first field relaxation layer 11 (p-type region) and the gate insulating film 8. The first field relaxation layer 11 is connected to the p-type region 6b in the source region 6 through the inversion layer. Even when the depletion layer extends, and holes are generated in the first field relaxation layer 11, the holes can flow to the source region 6, and the turn-off speed can also be increased. The conceptual diagram representing this state is the same as FIG. 50A. Charge movement when the semiconductor device is turned off is represented by the same conceptual diagram as in FIG. 50B.

To turn off the semiconductor device of this embodiment with the structure shown in FIG. 49D, a negative bias is applied to the gate region 5. At this time, the inversion layer 2 is formed in the interface between the gate insulating film 8 and the n-type epitaxial layer 10. The first field relaxation layer 11 is connected to the p-type region 6b in the source region 6 through the inversion layer 2. Even when the depletion layer extends, and holes are generated in the first field relaxation layer 11, the holes can flow to the source region 6b, and the turn-off speed can also be increased. The conceptual diagram representing this state is the same as FIG. 50A. Charge movement when the semiconductor device is turned off is represented by the same conceptual diagram as in FIG. 50B.

FIGS. 51A to 51D are conceptual diagrams showing charge movement when the semiconductor device of this embodiment is turned on. To turn on the semiconductor device, a positive bias is applied to the gate region 5. At this time, an accumulation layer is formed in the interface between the gate insulating film 8 and the n-type epitaxial layer 10. Accordingly, majority carriers are generated in the channel region, i.e., between the adjacent gate regions 5. The resistance of the channel region is decreased by the accumulation layer. In addition, since the channel region having very low resistance intervenes between the accumulation layer and the second field relaxation layer 12, the on-resistance can be decreased. In this embodiment as well, the first and second field relaxation layers 11 and 12 need not always be connected to the source region 6, as in the second embodiment.

Figure 51C:
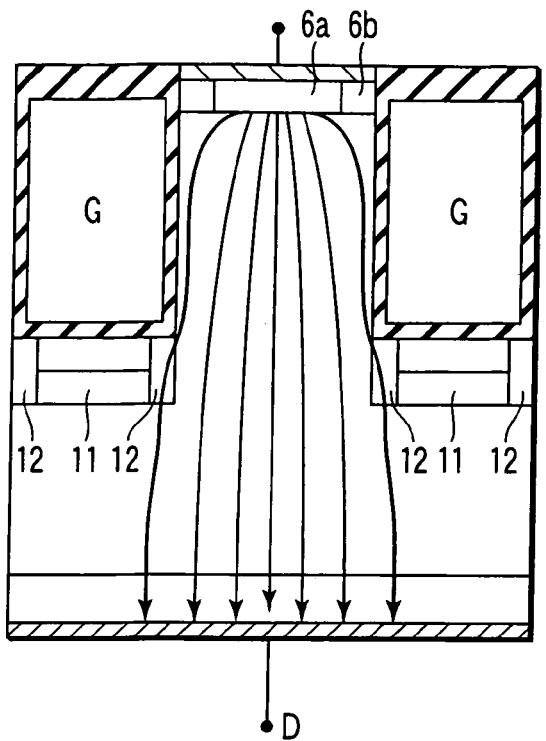
Figure 51D:
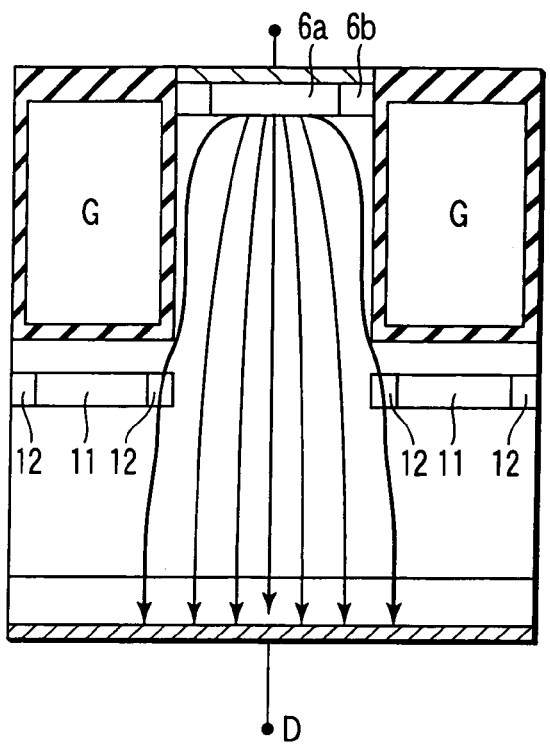
Figure 51E:
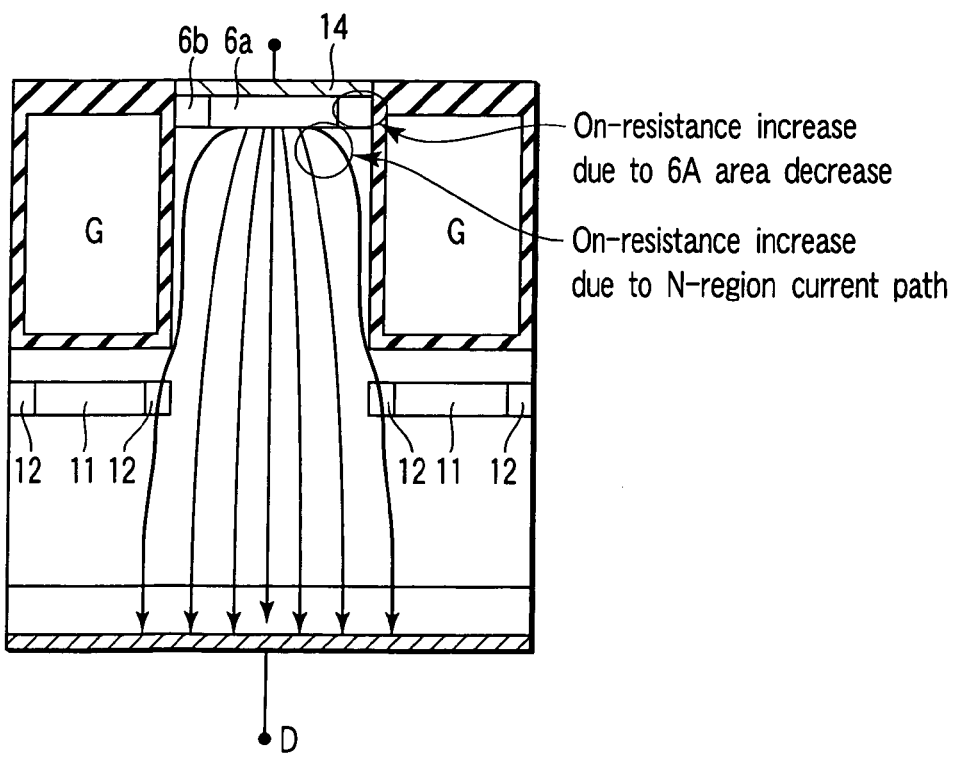

Referring to FIGS. 51A to 51D, of the source region 6, the portion 6b in contact with the gate insulating film 8 uses an n-type layer having a such concentration that changes the layer to the p-type when a negative bias is applied to the gate. Hence, when a positive bias is applied, the portion 6b exhibits the n-type. If this portion exhibits the p-type even when a positive bias is applied, the n-type region area in the source region decreases, and the on-resistance increases. In addition, when the n-type source region is separated from the accumulation layer formed in the interface to the gate insulating film, the path of carriers (electrons) extends from the n-type source region 6a to the accumulation layer through the high-resistance n-type layer. For this reason, the on-resistance increases due to the high-resistance n-type layer (FIG. 51E).

The shape of the field relaxation layer region according to the present invention is achieved by one of the structures shown in FIGS. 49A to 49D or a combination thereof.

Sixth Embodiment

Figure 52:
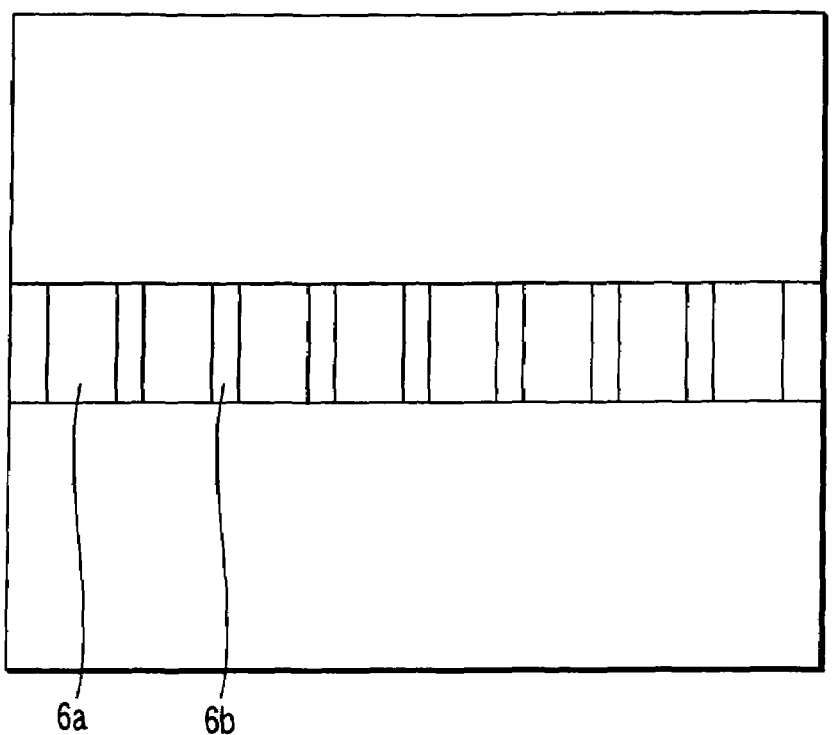
FIG. 52 is a plan view of a semiconductor device according to a sixth embodiment.

FIG. 52 is a plan view of a semiconductor device according to a sixth embodiment of the present invention. The sixth embodiment is different from the fifth embodiment in the planar pattern of a source region 6.

In the planar pattern of the source region 6 of the fifth embodiment, three regions, i.e., the p-type region 6b, h-type region 6a, and p-type region 6b must be formed in parallel between the adjacent gate regions 5. Along with microfabrication of the channel region, it becomes difficult to form the three regions. In the planar pattern of the source region 6 according to the sixth embodiment, however, p-type regions 6 and n-type regions 6a are formed in a direction perpendicular to the direction of the fifth embodiment. For this reason, the regions can be formed without any limitation by microfabrication of the channel region.

In this embodiment as well, first and second field relaxation layers 11 and 12 need not always be connected to the source region 6, as in the second embodiment.

Seventh Embodiment

Figure 53:
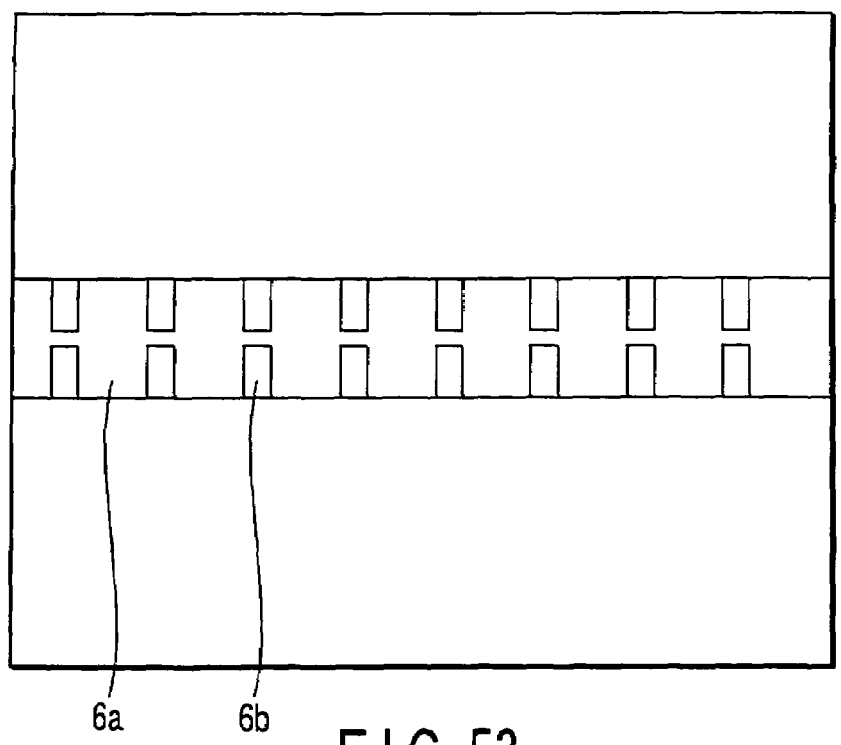
FIG. 53 is a plan view of a semiconductor device according to a seventh embodiment.

FIG. 53 is a plan view of a semiconductor device according to a seventh embodiment of the present invention. The seventh embodiment is different from the sixth embodiment in that an n-type region 6a is formed at the central portion of a p-type region 6b so that the p-type region 6b is divided into two regions.

In the sixth embodiment, the n-type regions 6a and p-type regions 6b can be formed independently of the distance between the adjacent gate regions 5. However, the central portion of the p-type region 6b far apart form the gate insulating film 8 rarely functions to discharge holes. Hence, the p-type region 6b in contact with the source region 6a causes an increase in ON resistance when a principal current is supplied. To prevent this, the p-type region 6b which does not serve to discharge no holes is changed to the n-type region 6a. Accordingly, the on-resistance can further be decreased, as compared to the sixth embodiment.

As shown in FIG. 51E, in the fifth embodiment, the lightly-doped n-type layer (epitaxial layer 10) is formed under the p-type region 6b of the source contact portion. This n-type layer is a high-resistance layer. Assume that a positive bias is applied to the gate region 5, and an accumulation layer as a low-resistance region is formed in the interface to the gate insulating film 8. At this time, if the high-resistance lightly-doped n-type layer intervenes between the n-type source region 6a and the accumulation layer, the on-resistance increases. However, when the n-type source region 6a always comes into contact with the accumulation region upon applying a positive bias to the gate region 5, like the planar pattern of the sixth and seventh embodiments, the on-resistance can be decreased.

In the fifth to seventh embodiments, the p-type region 6b in contact with a source contact 14 only needs to serve as a path to discharge holes generated in the first field relaxation layer 11 to the source contact 14 through the inversion layer which is formed when a negative bias is applied to the gate region 5. The region only needs to serve as a path to pass holes when a negative bias is applied to the gate region 5 and need not always be a p-type region. That is, it may be an n-type layer which is inverted to the p-type when a negative bias is applied to the gate region 5. In this case, when the semiconductor material is SiC, the concentration in the n-type region is preferably $5 \times 10^{17}$ cm$^{-3}$ or less.

Eighth Embodiment

As described above, in the vertical semiconductor device of the present invention, an channel region 10c sandwiched between opposing gate regions 5 serves as a channel. The depletion layer extending for the gate region 5 in the horizontal direction determines the pinch-off performance of the channel. The extension of the depletion layer was checked while changing a gate bias (Vg), oxide film thickness (Ox), and impurity concentration (D) by using a simple MOS diode model.

Figure 54:
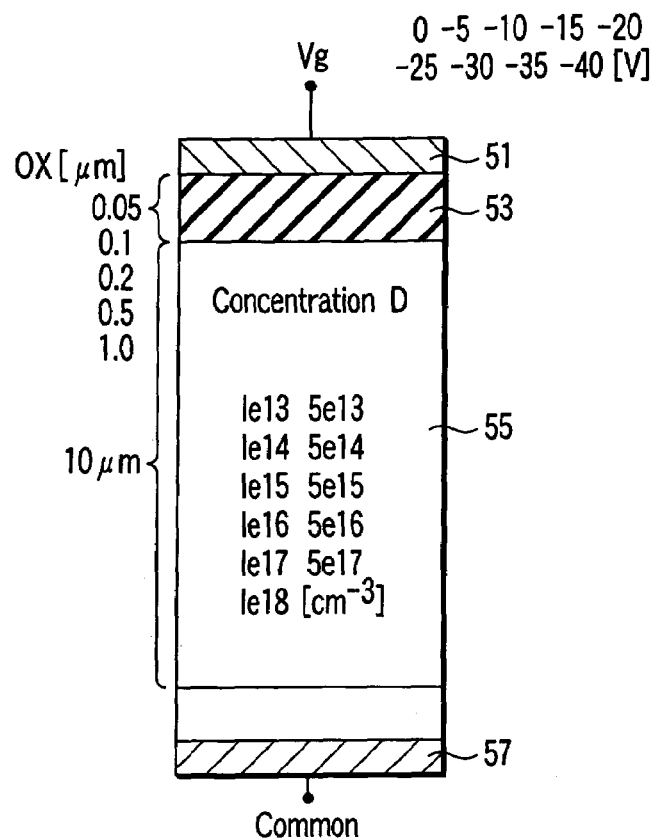
FIG. 54 is a view of a diode model used for simulation according to a eighth embodiment.

FIG. 54 shows a diode model used for simulation to be described in the eighth embodiment. An upper electrode 51 simulates a gate electrode or gate region. An oxide film 53 simulates a gate oxide film. An epitaxial layer 55 corresponds to a channel region. A lower electrode 57 corresponds to an opposing gate electrode or gate region.

In the simulation, the gate bias Vg was changed from 0V to −40V in 5V steps. The oxide film thickness Ox was changed to 0.05, 0.1, 0.2, 0.5, and 1.0 µm. The thickness of the epitaxial layer 55 was 10 µm. The impurity concentration D was changed from $1 \times 10^{13}$ cm$^{-3}$ to $1 \times 10^{18}$ cm$^{-3}$ in 11 levels.

Figure 55:
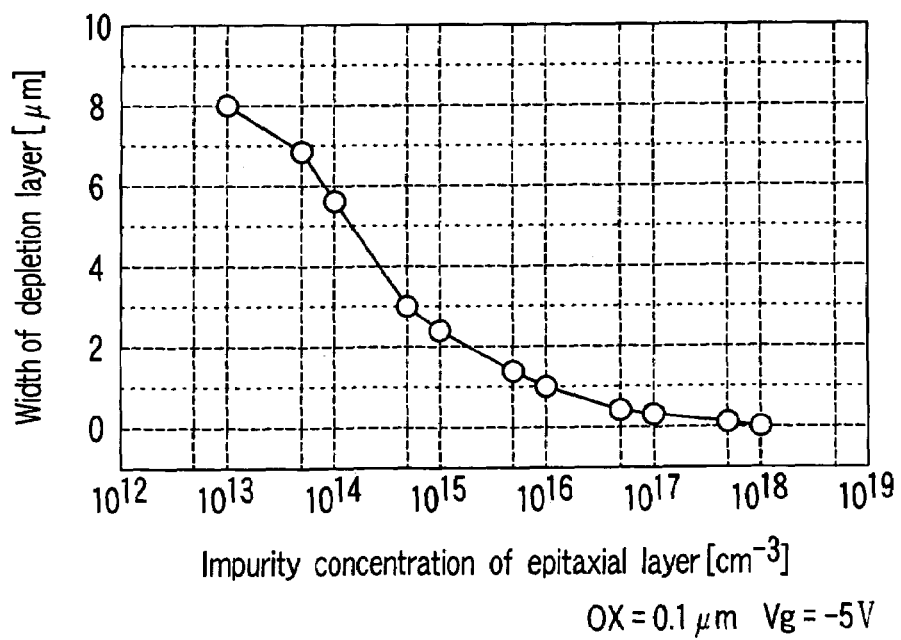
FIG. 55 is a graph showing the dependence of the width of the depletion layer on the impurity concentration of the epitaxial layer in the eighth embodiment.

As is apparent from the result of simulation under these conditions, even when the gate bias Vg is changed from −5V to −40V, the extension (width) of the depletion layer does not change. In addition, even when the oxide film thickness (Ox) is changed, the extension (width) of the depletion layer does not change. FIG. 55 shows the relationship between the impurity concentration D of the epitaxial layer 55 and the extension (width) of the depletion layer when Ox=0.1 µm, and Vg=−5V. When the impurity concentration is $1 \times 10^{18}$ cm$^{-3}$ or more, the depletion layer does not extend at all. Practically, the impurity concentration should be at least $1 \times 10^{17}$ cm$^{-3}$ or less. In an actual device, the channel region is sandwiched between the gate regions. Hence, a value twice the depletion layer width obtained by the above calculation can be set as the channel width in terms of design. Actually, the channel cannot sufficiently be close unless the channel width is ⅙ (or ⅓ when extension from both sides is taken into consideration) the depletion layer width obtained in FIG. 55.

Ninth Embodiment

Figure 56:
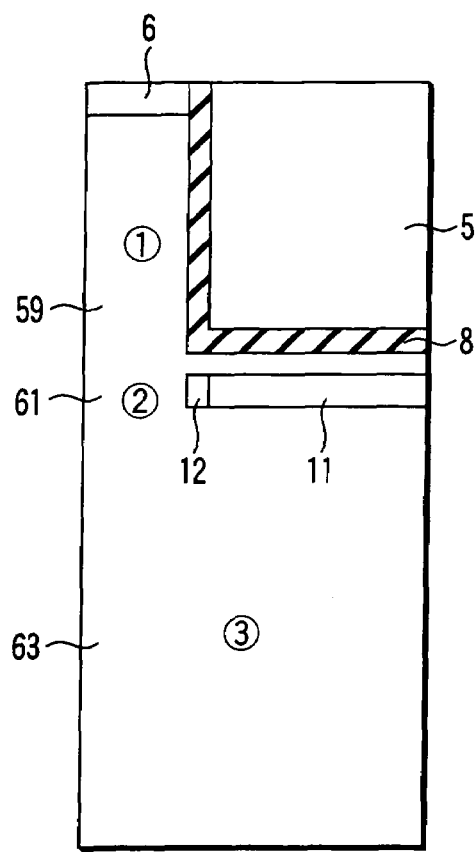
FIG. 56 is a partially sectional view showing the structure of the epitaxial layer of a semiconductor device according to a ninth embodiment.

In the above-described embodiments, the impurity concentration in the epitaxial layer 10 is uniform. As shown in FIG. 56, the region of an epitaxial layer 10 can be divided to optimize the concentration in the epitaxial layer. This example will be described in a ninth embodiment.

Referring to FIG. 56, a first region 59 is a channel region from the bottom portion of a source region 6 to the bottom portion of a gate insulating film 8. A second region 61 is a region from the bottom portion of the gate insulating film 8 to the bottom portion of first and second field relaxation layers 11 and 12. A third region 63 is a region (drift region) from the bottom portion of the first and second field relaxation layers 11 and 12 to the bottom portion of the epitaxial layer 10.

The relationship described in the eighth embodiment is applied to the first region 59 shown in FIG. 56. As described above, as the relationship between the impurity concentration in the first region 59 and the distance between the gate regions, the depletion layer thickness obtained from FIG. 55 is doubled and decreased to ⅓ or less.

If the concentration in the second region 61 is the same as in the first region 59, the concentration is the same as in the channel region from the bottom portion of the source region 6 to the bottom portion of the first and second field relaxation layers 11 and 12. If the concentration in the second region 61 is the same as in the third region 63, the concentration is the same as in the drift region from the bottom portion of the gate insulating film 8 to the bottom portion of the epitaxial layer 10. If a concentration D2 in the second region 61 is equal to or higher than concentrations D1 and D3 in the first and third regions 59 and 63, it can be regarded that the n-type regions of the adjacent second field relaxation layers 12 are connected. That is, the concentrations satisfy $D1 \leq D3 \leq D2$ or $D3 \leq D1 \leq D2$. When the second region 61 is to be changed to an inversion layer by applying a negative bias to the gate, the concentration D2 in the second region 61 is preferably $5 \times 10^{17}$ cm$^{-3}$ or less. The impurity concentration and thickness of the third region 63 are determined by the target breakdown voltage of the element.

The structure described in the third modification to the first embodiment in which the first field relaxation layer 11 (p-type region) is extracted to the source electrode can also be applied even when the channel region and drift region have different concentrations, as in this embodiment. When the concentration in the second region 61 is equal to or higher than that in the first region 59, i.e., the concentrations satisfy $D1 \leq D3 \leq D2$ or $D3 \leq D1 \leq D2$, any decrease in breakdown voltage can be suppressed by forming the edge termination structure after the second region 61 in the edge termination structure formation region is removed by etching. This method will be described below.

Figure 57A:
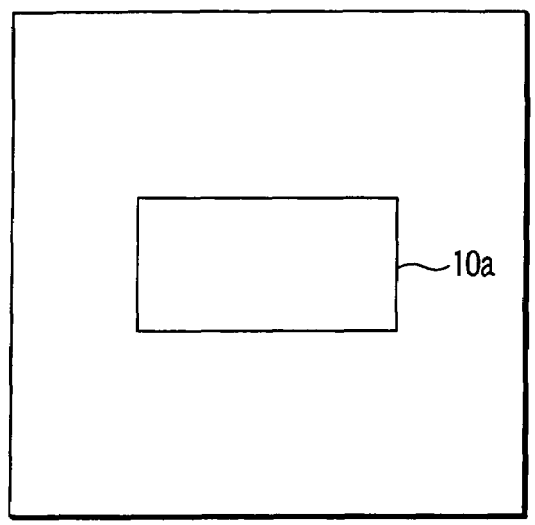
FIGS. 57A to 65C are sectional views showing steps in manufacturing the semiconductor device according to the ninth embodiment.
Figure 57B:
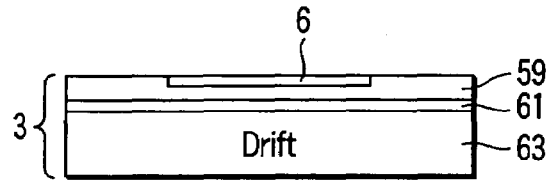

First, as shown in FIGS. 57A and 57B, an n-type SiC substrate (not shown) on which an n-type impurity epitaxial layer 3 is formed is prepared. The n-type impurity epitaxial layer 3 has a three-layered structure obtained by sequentially forming, on its upper surface, the n-type drift layer 63 having an impurity concentration of $5 \times 10^{15}$ cm$^{-3}$, the n-type layer 61 (n-type region serving as the second field relaxation layer 12 later) having an impurity concentration of about $1 \times 10^{17}$ cm$^{-3}$, and the channel region 59 having an impurity concentration of $1 \times 10^{14}$ cm$^{-3}$. The resistivity of the n-type SiC substrate is, e.g., 0.02 Ωcm.

P (phosphorus) ions are implanted in an active region 10a at about $1 \times 10^{18}$ cm$^{-3}$ to $5 \times 10^{20}$ cm$^{-3}$ to form an impurity region serving as a source region 6 having a thickness of about 0.6 μm and a surface concentration of, e.g., $1 \times 10^{19}$ cm$^{-3}$. P ions are used here. However, the present invention is not limited to this. For example, N (nitrogen) ions may be used.

Figure 58A:
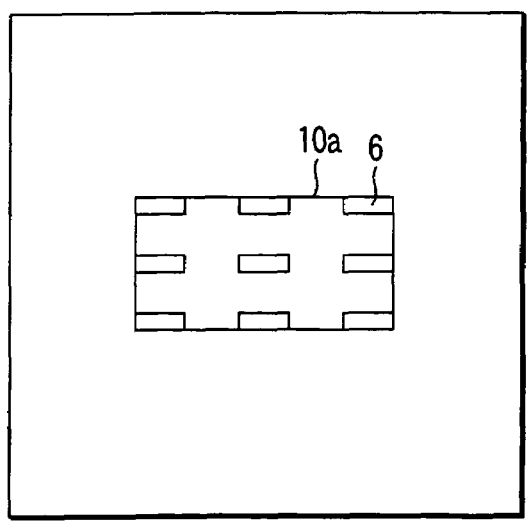
Figure 58B:
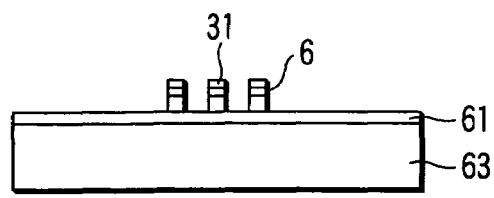

Before the edge termination structure shown in FIG. 14B and the source interconnection contact p-type region shown in FIG. 15 are formed, a metal mask (trench formation mask of Al) 31 is selectively formed in the active region 10a. As shown in FIGS. 58A and 58B, etching is executed to almost the depth of the trench gate (up to the n-type impurity layer 61 serving as the second field relaxation layer 12). The depth of the trench is, e.g., 0.5 to 5 μm. The width of the trench is, e.g., 0.5 to 5 μm. A portion remaining after etching serves as a source contact region. For the trench formation mask 31, the same material as that used in the first embodiment can be used. An unetched portion (remaining portion) under the source region 6 in this etching step serves as a channel region.

Figure 59A:
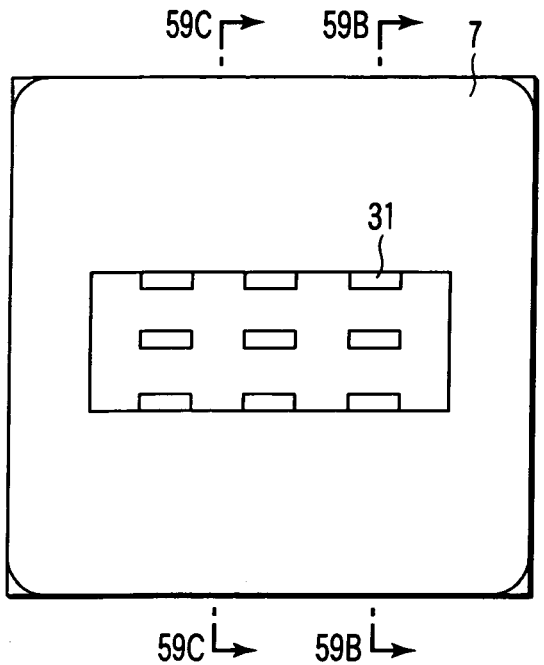
Figure 59B:
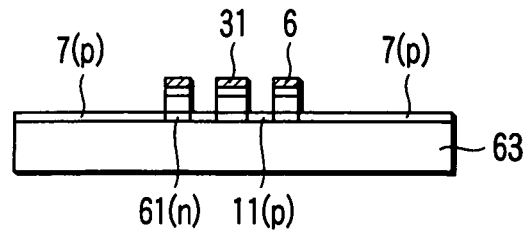
Figure 59C:
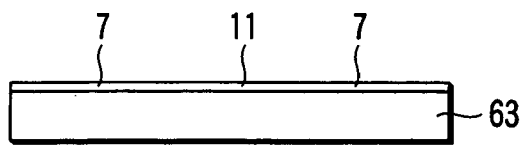

After that, as shown in FIGS. 59A to 59C, a source interconnection contact p-type region 7 and first field relaxation layer 11 (p-type region) are simultaneously formed outside the active region 10a by ion implantation. Accordingly, a buried field relaxation layer including the first field relaxation layer 11 and second field relaxation layers 12 (n-type layers 61) is formed. The impurity concentration in the p-type region is preferably higher than the n-type impurity concentration in the second field relaxation layer 12. With this process, the first field relaxation layer 11 (p-type region) is electrically connected to the source interconnection contact p-type region 7 by p-type ion implantation.

Figure 60A:
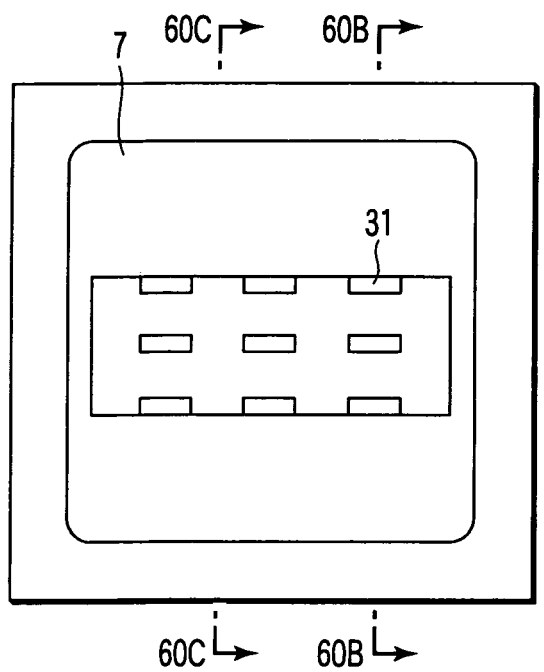
Figure 60B:
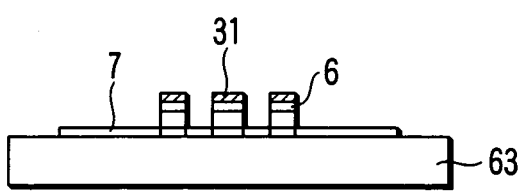
Figure 60C:
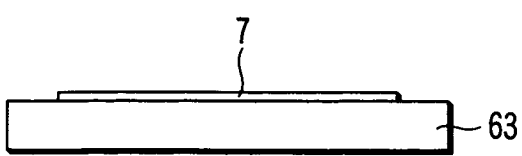
Figure 61A:
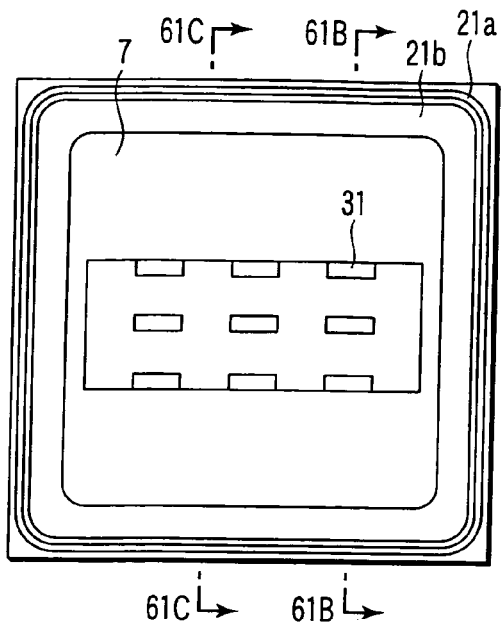
Figure 61B:
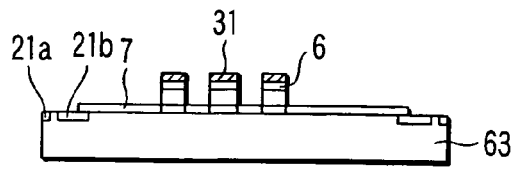
Figure 61C:

As shown in FIGS. 60A to 60C, a metal mask is formed again and patterned. The edge termination region is etched to the drift layer (third region 63), and edge termination regions 21a and 21b are formed by ion implantation, as shown in FIGS. 61A to 61C.

After the native oxide film is removed by hydrofluoric acid, n-type ions are implanted in the lower surface of the n-type SiC substrate at a high dose (not shown). The implanted n-type ions are activated by activation annealing to form an n-type region serving as the drain region (not shown). The activation temperature is preferably 1,500° C. to 1,800° C. In this embodiment, activation is executed at 1,600° C. for 5 min.

Figure 62A:
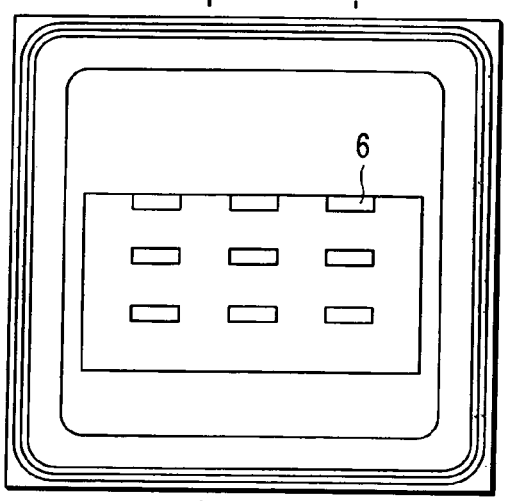
Figure 62B:
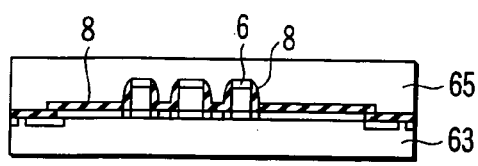
Figure 62C:
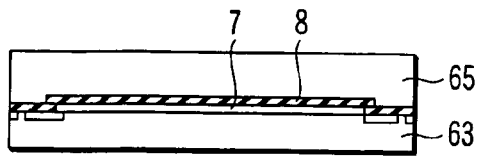
Figure 62D:
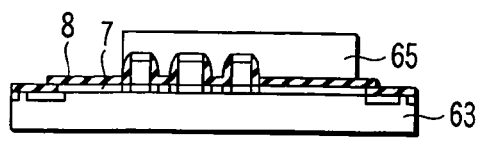
Figure 62F:
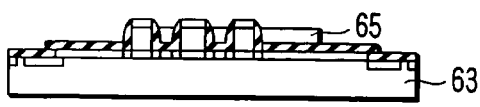
Figure 62E:
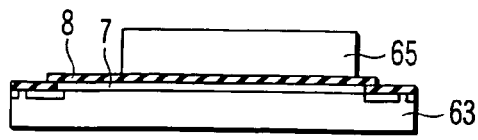
Figure 62G:
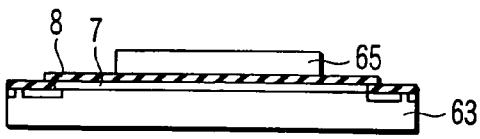

After the drain region is formed, the SiC substrate is oxidized to form a thermal oxide film on the surface, as shown in FIG. 62A. Examples of the oxidation method are wet oxidation and dry oxidation. An oxide film is formed on the substrate surface. Of the oxide film, a portion in contact with the trench sidewall and bottom portion serves as the gate oxide film 8. To help understanding, even oxide films formed in other regions simultaneously are indicated by reference numeral 8. As shown in FIGS. 62B and 62C, the trench is filled to form a polysilicon film 65 to form a gate pad region. Then, the polysilicon film is planarized by annealing. As shown in FIGS. 62D and 62E, the polysilicon film 65 outside the trench region and gate pad is removed. As shown in FIGS. 62F and 62G, the polysilicon film 65 excessively formed in the trench region and gate pad is etched back. If ion implantation is to be executed to change the conductivity type of polysilicon buried in the trench to the n-type or p-type, the same process as described in the first embodiment is executed.

Figure 63B:
Figure 63C:
Figure 63A:
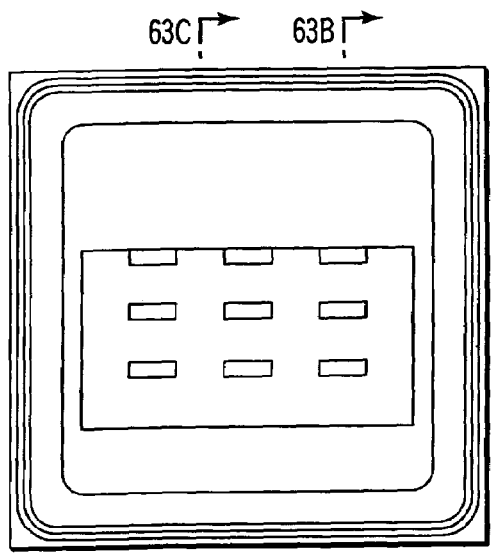

After thermal oxidation, an Si oxide film 67 is formed by CVD. As shown in FIGS. 63A to 63C, patterning is executed such that the edge termination portion remains. A portion except this is removed by hydrofluoric acid.

Figure 64B:
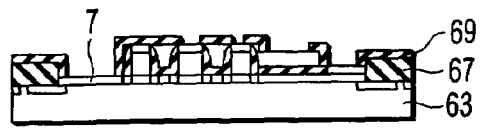
Figure 64C:
Figure 64A:
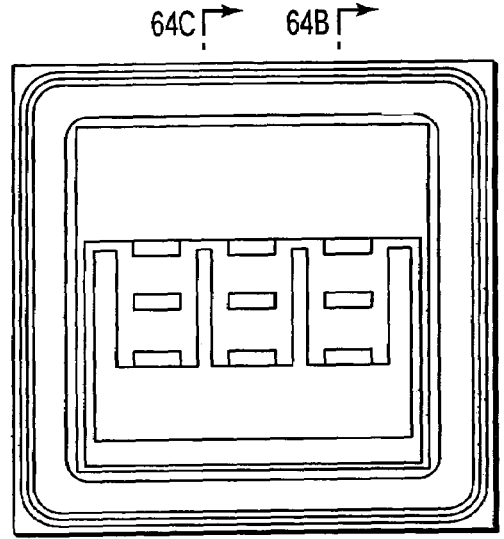

After the surface is thermally oxidized at about 1,150° C., an Si oxide film 69 is formed by CVD. As shown in FIGS. 64A to 64C, patterns serving as a source contact 14, gate contact 13, and source interconnection contact p-type region are formed by photolithography.

Of the gate regions 5 which sandwich the source contact region 6 closest to a source pad 16, no trench gate is present on the side of the source pad 16. Pinch-off of the channel portion is difficult independently of the bias applied to the gate. For this reason, no contact hole is preferably formed at the portion closest to the source pad 16 in the source contact 14.

Figure 65A:
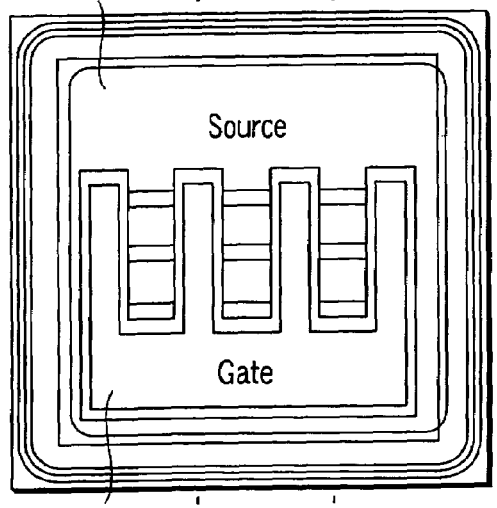
Figure 65B:
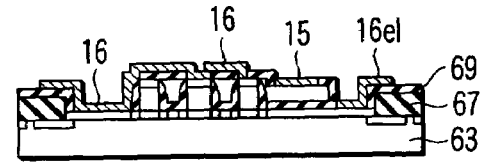
Figure 65C:
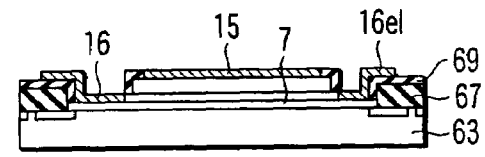

Without removing the resist used in photolithography, an Ni film is formed on the entire surface of the n-type epitaxial layer 10 by E-gun deposition (electron gun deposition by a metal thin film forming apparatus) and left in only the opening portions by lift-off. After the Ni film is formed, annealing is executed in a sinter furnace in an Ar atmosphere at 1,000° C. for 5 min to bring the source region 6, gate electrode 5, and source interconnection contact p-type region 7 into ohmic-contact with the Ni film. Accordingly, the source contact (not shown), gate contact (not shown), and source interconnection contact (not shown) are formed. When the source contact and source interconnection contact are connected to the source pad 16, and the gate contact is connected to the gate pad 15 by Ti/Al interconnections, as shown in FIGS. 65A to 65C, the same structure as shown in FIG. 5 is completed.

With the above-described process, the first and second field relaxation layers 11 and 12 having an npn structure can be formed under the gate electrode 5 surrounded by the gate insulating film 8. Accordingly, holes discharged from the p-type region of the first field relaxation layer 11 can more easily flow to the source electrode without executing oblique ion implantation which is introduced in the first embodiment to make the holes discharged from the first field relaxation layer 11 (p-type layer) to the source electrode or forming via holes at part of the trench region surrounded by the insulating film. For the materials and concentrations of the respective regions, the same notes as in the first embodiment are applied.

Tenth Embodiment

In the ninth embodiment, the epitaxial layer 3 is divided into the three regions 59, 61, and 63. With this structure, the number of variations of the position of the bottom portion of the edge termination structure (guard ring 21b) increases.

FIGS. 66A to 66E show examples in which the trench at the end portion is filled with a p-type region having a concentration higher than that in a second region 61. FIGS. 66F to 66J show examples in which a p-type region having a concentration higher than that in the second region 61 is formed along the sidewall of the trench at the end portion.

Figure 66E:
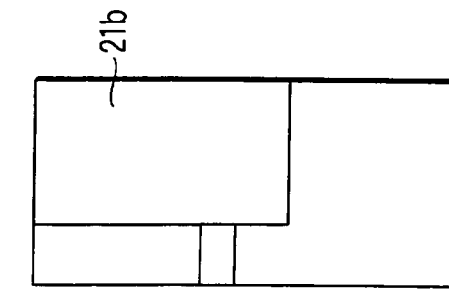
FIGS. 66A to 66J are partially sectional view showing variations of an edge termination structure according to a tenth embodiment.
Figure 66D:
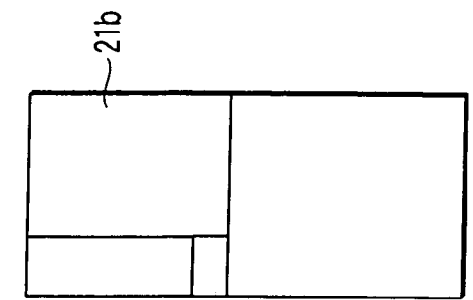
Figure 66C:
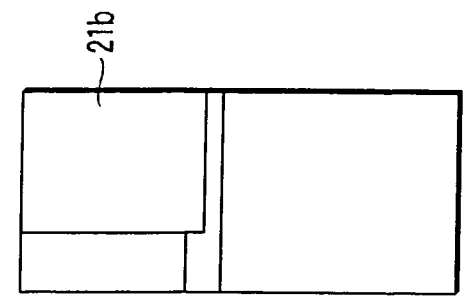
Figure 66B:
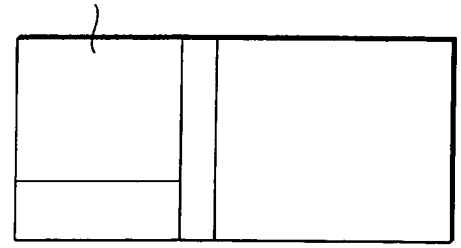
Figure 66A:
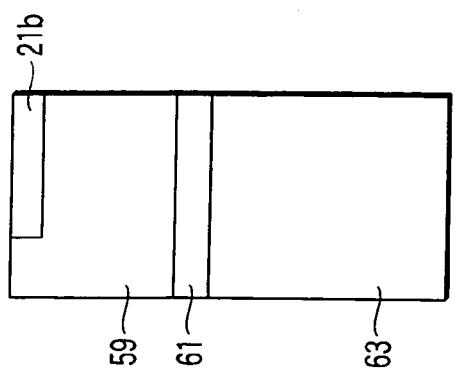
Figure 66J:
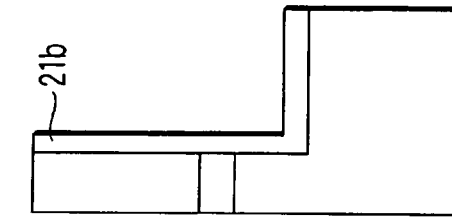
Figure 66I:
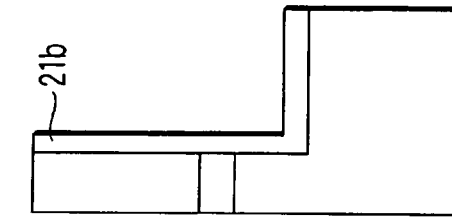
Figure 66H:
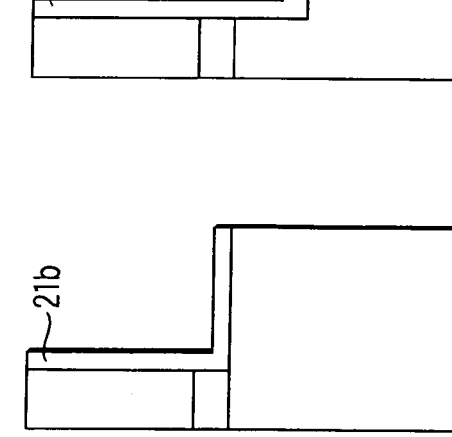
Figure 66G:
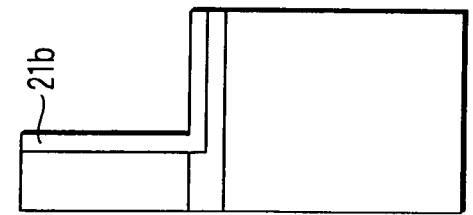
Figure 66F:
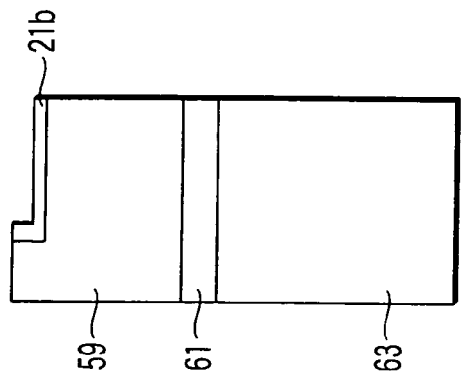

FIGS. 66A and 66F show examples in which the bottom portion of the edge termination structure is in a first region 59. FIGS. 66B and 66G show examples in which the bottom portion of the edge termination structure is in the interface between the first region 59 and the second region 61. FIGS. 66C and 66H show examples in which the bottom portion of the edge termination structure is in the second region 61. FIGS. 66D and 66I show examples in which the bottom portion of the edge termination structure is in the interface between the second region 61 and a third region 63. FIGS. 66E and 66J show examples in which the bottom portion of the edge termination structure is in the third region 63.

The position of the bottom portion of the edge termination structure is selected in accordance with the requirement for the characteristic of each semiconductor device, and a wide choice of options are provided.

Eleventh Embodiment

When a p-type region which crosses the central portion in the direction of the channel layer depth is added, the semiconductor device described in the above embodiments can be formed as a trench MOSFET. When the drain contact layer (n-type) of the trench MOSFET is changed to the p-type, IGBT can be formed.

Figure 67:
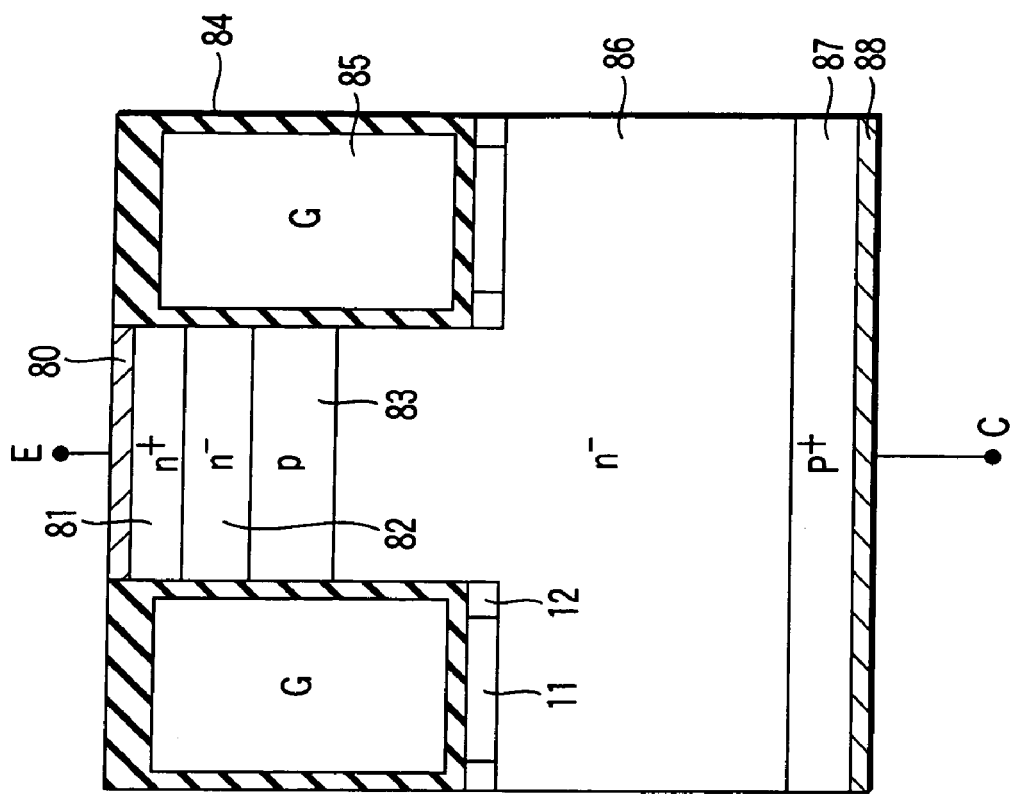
FIGS. 67 and 68 are sectional views of a trench MOSFET and IGBT according to the 11th embodiment.

FIG. 67 is a sectional view of a trench MOSFET according to the eleventh embodiment. Reference numeral 71 denotes an n-type source contact; 72, an n-type source region; 73, a p-type region (channel region); 74, a gate insulating film; 75, a gate region; 76, an n-type drift region; 77, an n-type drain contact; and 78, a drain electrode. First and second field relaxation layers 11 and 12 are formed in the drift region 76 immediately under the gate region 75.

Figure 68:
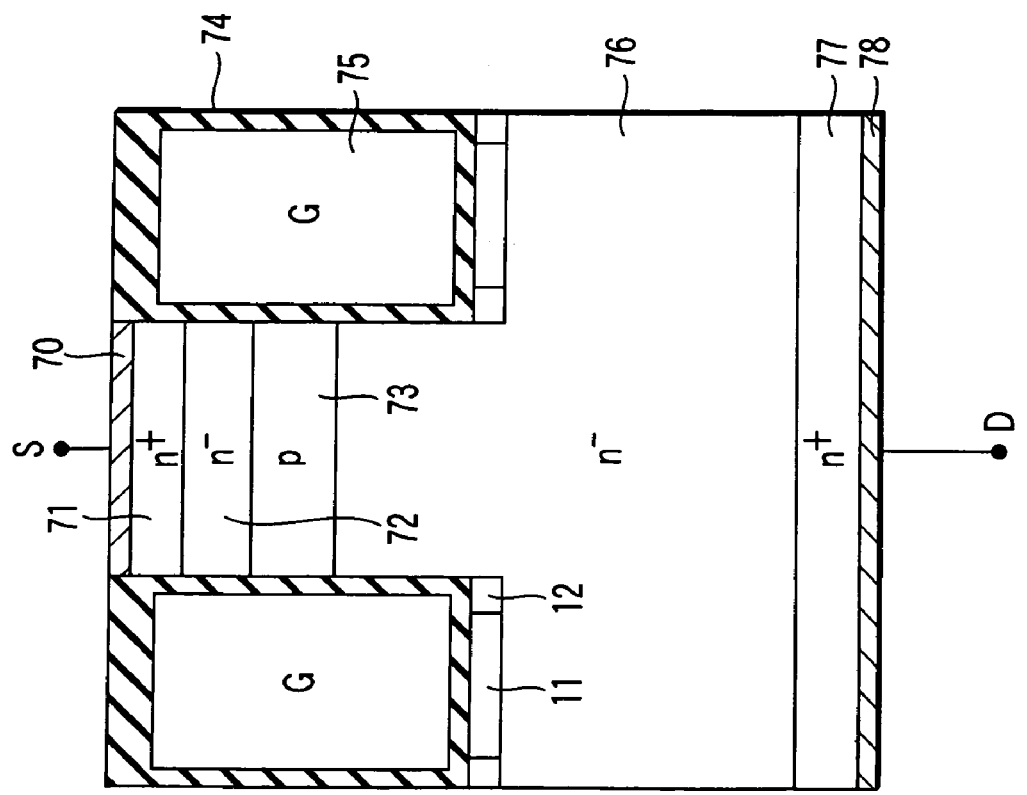

FIG. 68 is a sectional view of a trench IGBT. Reference numeral 80 denotes an emitter electrode; 81, an n-type source contact; 82, an n-type emitter region; 83, a p-type base region; 84, a gate insulating film; 85, a gate region; 86, an n-type drift region; 87, a p-type region; and 88, a collector electrode. The first and second field relaxation layers 11 and 12 are formed in the drift region 86 immediately under the gate region 85.

When a conductive path to connect the first field relaxation layer 11 (p-type region) to the source electrode 70 or emitter electrode 80 is formed, as in the above-described embodiments, holes discharged from the first field relaxation layer can flow to the source electrode 70 or emitter electrode 80.

Figure 70:
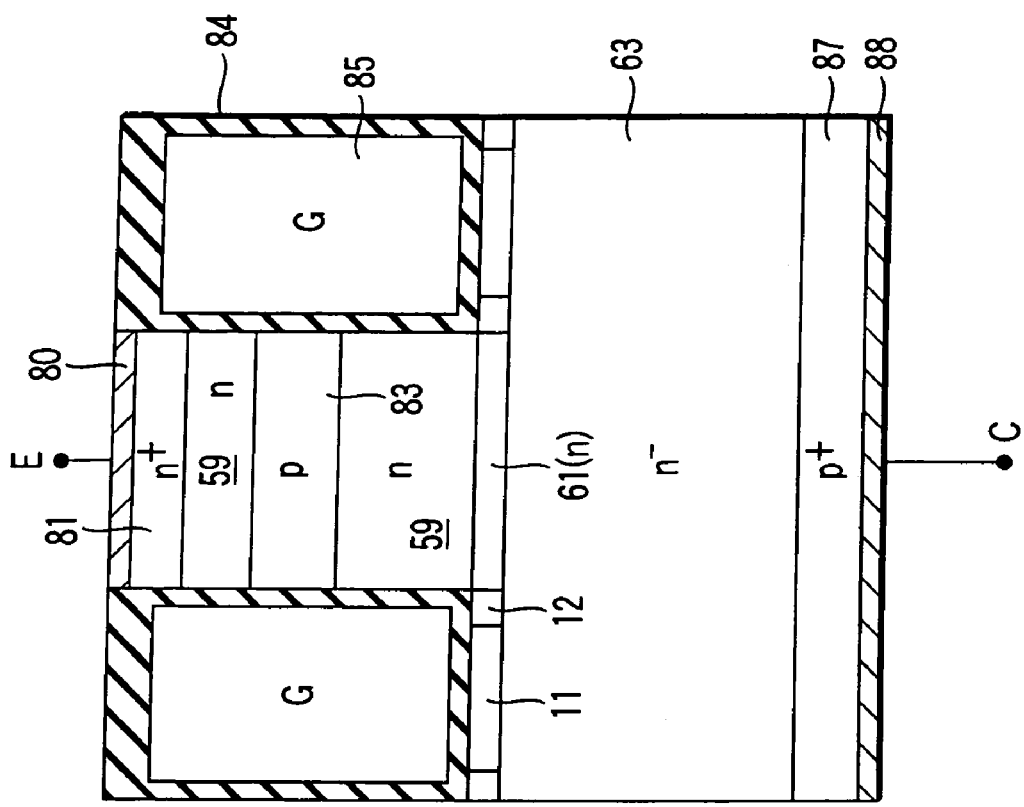
FIGS. 69 and 70 are sectional views of a trench MOSFET and IGBT according to a modification to an eleventh embodiment.
Figure 69:
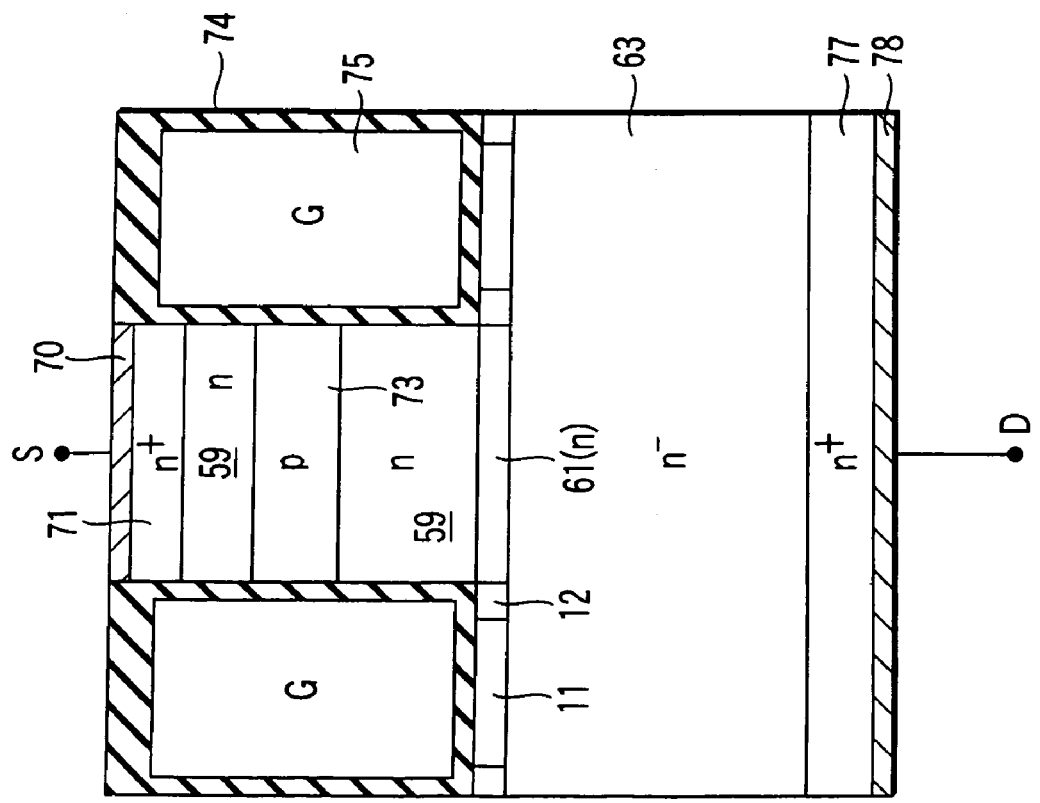

The first to third regions described in the ninth embodiment can also be applied to this embodiment. FIGS. 69 and 70 show the forms. Referring to FIGS. 69 and 70, the n-type portion parallel to the gate region 75 or 85 is formed as a first region 59. The formation layer of the first and second field relaxation layers 11 and 12 is formed as a second region 61. The drain region or drift region is formed as a third region 63.

Twelfth Embodiment

In the above embodiments, vertical elements have been described. However, the present invention is not limited to this and can also be applied to a lateral element.

FIG. 71 is a schematic perspective view showing an example in which the vertical element of the first embodiment is formed as a lateral element. For the descriptive convenience, the same reference numerals as in the first embodiment denote the same parts in FIG. 71. A p-type epitaxial layer 91 is formed on an n$^+$-type SiC substrate 1. An n-type epitaxial layer 10 is formed on the p-type epitaxial layer 91. An n$^+$-type source region 6, n$^+$-type drain region 3, and n-type region 92 serving as the second field relaxation layer 12 later are formed on this substrate.

As shown in FIG. 72, an etching mask 93 is formed and patterned. As shown in FIG. 73, the n-type epitaxial region 10 is etched to form a trench.

Figure 74:
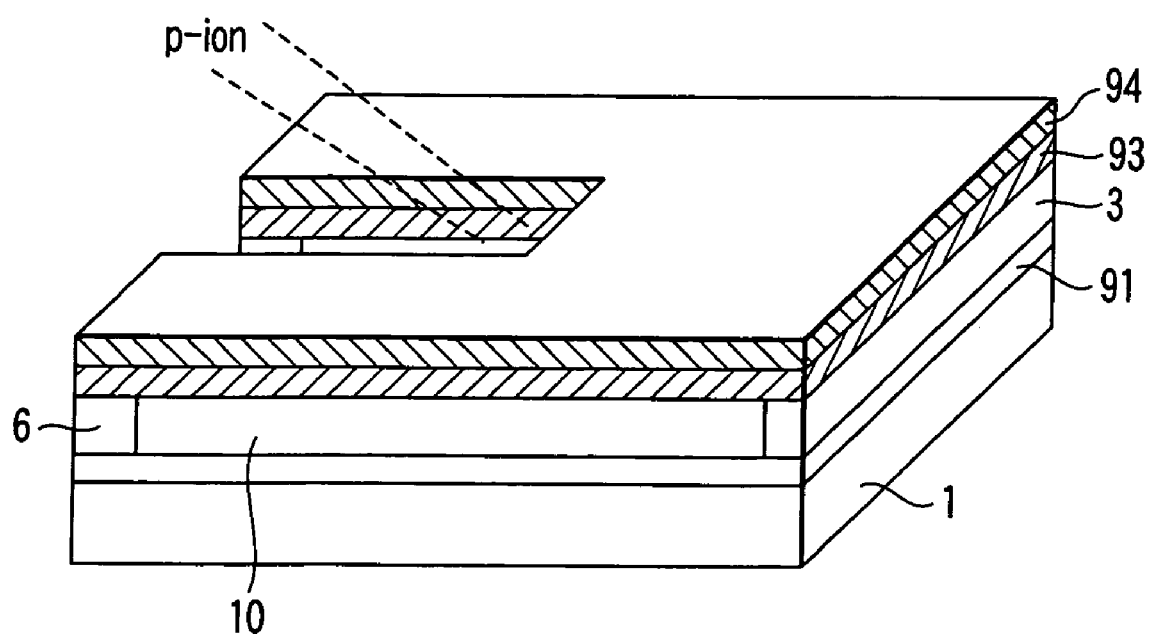
Figure 75:
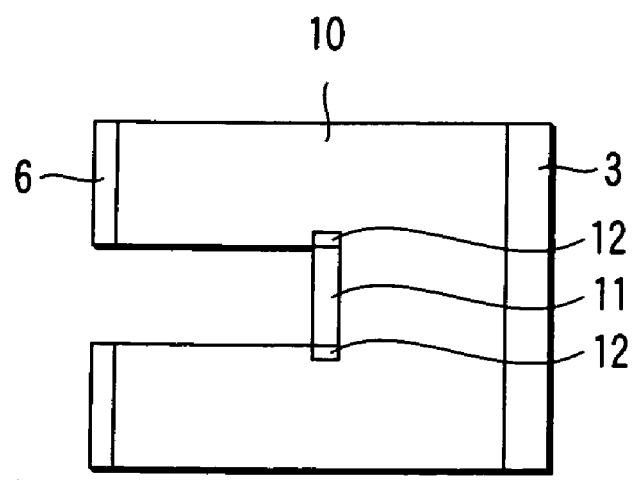
FIG. 75 is a cross-sectional view corresponding to FIG. 74.

A metal mask 94 is formed to mask the bottom portion of the etching region. As shown in FIG. 74, a p-type region is formed by oblique ion implantation. FIG. 75 is a cross-sectional view showing a state in which first and second field relaxation layers 11 and 12 are formed.

After activation annealing is executed, an insulating film is formed in the trench portion, although not illustrated. Polysilicon is buried to form a gate region 5. After that, the entire surface is insulated by an oxide film. Contact holes are formed in the source region 6, gate region 5, and drain region 3. A contact metal is formed and sintered. With this process, a lateral element can be obtained.

Even in the lateral element of this embodiment, first to third regions can be formed by changing the concentrations in the channel region and drift region, as in the ninth embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a semiconductor substrate having a first major surface and a second major surface;
a lightly-doped semiconductor layer of a first conductivity type, formed on the first major surface of the semiconductor substrate;
an active region formed on a top of an island-shaped region on a surface of the lightly-doped semiconductor layer, the active region including a first semiconductor region of a second conductivity type formed on the lightly-doped semiconductor layer, and a second semiconductor region of the first conductivity type formed on the first semiconductor region;
a first electrode surrounding the active region and extending toward the lightly-doped semiconductor layer to a deeper position than the active region;
a first insulating film formed at least between a side surface of the active region and the first electrode;
a buried field relaxation layer formed in the lightly-doped semiconductor layer adjacent to a bottom surface of the first electrode, the buried field relaxation layer including a first field relaxation layer of the second conductivity type and second field relaxation layers of the first conductivity type formed at two ends of the first field relaxation layer;
a second electrode formed on the second semiconductor region on the first major surface; and
a third electrode formed on the second major surface.

2. The device according to claim 1, wherein the first insulating film is further formed on a bottom surface of the first electrode, and is disposed between the first electrode and at least one of the first field relaxation layer and the second field relaxation layers.

3. The device according to claim 1, further comprising a first impurity layer of the second conductivity type formed between a bottom surface of the first electrode and the lightly-doped semiconductor layer.

4. The device according to claim 1, further comprising third semiconductor regions of the second conductivity type at two ends of the second semiconductor region and in contact with the second electrode.

5. The device according to claim 1, further comprising a fourth semiconductor region which connects the first field relaxation layer to the second electrode.

6. The device according to claim 1, wherein an impurity concentration in the second field relaxation layer is higher than an impurity concentration in the lightly-doped semiconductor layer.

7. The device according to claim 1, wherein the semiconductor substrate is formed as a first conductivity type.

8. The device according to claim 1, wherein the semiconductor substrate is formed as a second conductivity type.

9. A semiconductor device comprising:
a semiconductor substrate having a first major surface and a second major surface;
a first lightly-doped semiconductor layer of a first conductivity type formed on the first major surface of the semiconductor substrate;
a second lightly-doped semiconductor layer of the first conductivity type formed on the first lightly-doped semiconductor layer;
a third lightly-doped semiconductor layer of the first conductivity type formed on the second lightly-doped semiconductor layer;
an active region formed on a top of an island-shaped region on a surface of the third lightly-doped semiconductor layer, the active region including a first semiconductor region of a second conductivity type formed on the third lightly-doped semiconductor layer, and a second semiconductor region of the first conductivity type formed on the first semiconductor region;
a first electrode surrounding the active region and buried to a deeper position than the first semiconductor region so as to extend through the third lightly-doped semiconductor layer;
a first insulating film formed at least between a side surface of the active region and the first electrode;
a buried field relaxation layer formed in the second lightly-doped semiconductor layer, the buried field relaxation layer including a first field relaxation layer of the first conductivity type and second field relaxation layers of the second conductivity type formed at two ends of the first field relaxation layer;
a second electrode formed on the second semiconductor region of the active region; and
a third electrode formed on the second major surface.

10. The device according to claim 9, wherein the first insulating film is further formed on a bottom surface of the first electrode, and is disposed between the first electrode and at least one of the first field relaxation layer and the second field relaxation layers.

11. The device according to claim 9, further comprising a first impurity layer of the second conductivity type formed between a bottom surface of the first electrode and the second lightly-doped semiconductor layer.

12. The device according to claim 9, further comprising third semiconductor regions of the second conductivity type at two ends of the second semiconductor region and in contact with the second electrode.

13. The device according to claim 9, further comprising a fourth semiconductor region which connects the first field relaxation layer to the second electrode.

14. The device according to claim 9, wherein an impurity concentration in the second field relaxation layer is higher than an impurity concentration in the second lightly-doped semiconductor layer.

15. The device according to claim 9, wherein the semiconductor substrate is formed as a first conductivity type.

16. The device according to claim 9, wherein the semiconductor substrate is formed as a second conductivity type.

17. A semiconductor device, comprising:
a semiconductor substrate;
a first semiconductor layer of a second conductivity type formed on the semiconductor substrate;
a second semiconductor layer of a first conductivity type formed on the first semiconductor layer;
a plurality of highly-doped first semiconductor regions of the first conductivity type having a stripe shape and buried in the second semiconductor layer in line;
a highly-doped second semiconductor region of the first conductivity type buried in the second semiconductor layer apart from and in parallel with the first semiconductor regions;
a gate electrode of a rectangle shape buried in the second semiconductor layer, a first sidewall and a second sidewall of which are opposed to each other and disposed between adjacent ones of the plurality of first semiconductor regions, and a third sidewall between the first sidewall and the second sidewall of which is between the first semiconductor region and the second semiconductor region;

a third semiconductor region of the second conductivity disposed adjacent to and parallel with the third sidewall between the first sidewall and the second sidewall of the gate electrode and buried in the second semiconductor layer; and fourth semiconductor regions of a first conductivity type disposed at both ends of the third semiconductor region.

18. The device according to claim 17, further comprising a gate insulating film between the first sidewall of the gate electrode and the second semiconductor layer and between the second sidewall of the gate electrode and the second semiconductor layer.

19. The device according to claim 17, further comprising a gate insulating film buried and formed along the third sidewall of the gate electrode, and disposed between the gate electrode and at least one of the third semiconductor region and the fourth semiconductor regions.

20. The device according to claim 17, further comprising a fifth semiconductor region which connects the third semiconductor region with the first semiconductor region.

\* \* \* \* \*